(12) United States Patent
Venkatesan

(10) Patent No.: US 11,670,908 B2
(45) Date of Patent: Jun. 6, 2023

(54) PLANAR LASER STRUCTURE WITH VERTICAL SIGNAL TRANSITION

(71) Applicant: POET Technologies, Inc., Allentown, PA (US)

(72) Inventor: Suresh Venkatesan, Los Gatos, CA (US)

(73) Assignee: POET Technologies, Inc., Allentown, PA (US)

( * ) Notice: Subject to any disclaimer, the term of this patent is extended or adjusted under 35 U.S.C. 154(b) by 262 days.

(21) Appl. No.: 17/081,130

(22) Filed: Oct. 27, 2020

(65) Prior Publication Data

US 2021/0126429 A1    Apr. 29, 2021

Related U.S. Application Data

(60) Provisional application No. 62/926,536, filed on Oct. 27, 2019.

(51) Int. Cl.
| | |
|---|---|
| *H01S 5/10* | (2021.01) |
| *H01S 5/026* | (2006.01) |
| *G02B 6/42* | (2006.01) |
| *H01S 5/22* | (2006.01) |
| *H01S 5/34* | (2006.01) |

(52) U.S. Cl.
CPC .......... *H01S 5/1014* (2013.01); *G02B 6/4201* (2013.01); *H01S 5/026* (2013.01); *H01S 5/22* (2013.01); *H01S 5/34* (2013.01)

(58) Field of Classification Search
CPC .......... H01S 5/1014; H01S 5/026; H01S 5/22; H01S 5/34; H01S 5/1032; H01S 5/4031; H01S 5/0239; H01S 5/04257; H01S 5/02326; G02B 6/4201; G02B 6/12002; G02B 6/12004

See application file for complete search history.

(56) References Cited

U.S. PATENT DOCUMENTS

| | | | | |
|---|---|---|---|---|
| 6,768,855 B1 * | 7/2004 | Bakke | .................. | G02B 6/1228 385/129 |
| 6,795,622 B2 * | 9/2004 | Forrest | .................. | H01S 5/1032 372/6 |
| 7,221,825 B2 * | 5/2007 | Reed | ...................... | G02B 6/125 385/39 |
| 7,532,784 B2 * | 5/2009 | Tolshikhin | ........... | G02B 6/1228 385/24 |
| 7,796,656 B2 * | 9/2010 | Watson | ..................... | H01S 5/12 372/19 |
| 2012/0307857 A1 * | 12/2012 | Oh | ....................... | H01L 33/0045 438/31 |
| 2018/0081118 A1 * | 3/2018 | Klamkin | ................. | H01S 5/187 |

* cited by examiner

*Primary Examiner* — Ellen E Kim
(74) *Attorney, Agent, or Firm* — Tue Nguyen

(57) ABSTRACT

The invention described herein pertains to the structure and formation of an optical device that includes a planar laser and a waveguide. The planar laser has a large lateral QW-containing layer and a tapered section in a transition portion of the device structure that enable low diode leakage currents and facilitate transition of the optical signal from the laser to a transition waveguide, and in some embodiments, to a dilute waveguide.

20 Claims, 23 Drawing Sheets

(i)

(ii)

(iii)

(i) Top View (ii) Section A-A'

(iii) Section B-B'

(i) Top View (ii) Section A-A'

(iii) Section B-B'

(i) Top View (ii) Section A-A'

(iii) Section B-B'

(i) Top View (ii) Section A-A'

(iii) Section B-B'

(i) Top View (ii) Section A-A'

(iii) Section B-B'

(i) Top View (ii) Section A-A'

(iii) Section B-B'

PLANAR LASER STRUCTURE WITH VERTICAL SIGNAL TRANSITION

The present application claims priority from the U.S. Provisional Application 62/926,536 filed on Oct. 27, 2019, entitled, "Dual Core Waveguide."

FIELD OF THE INVENTION

The present invention relates to optoelectronic communication systems, and more particularly to a planar laser structure with integrated spot size converter used in optoelectronic circuits with optical fibers and optical devices.

BACKGROUND

Low power semiconductor lasers are used in modern communications networks to generate the optical signals that are transmitted over the fiber optic cables that are utilized in these networks. For semiconductor-based lasers, the specific ranges of wavelengths that are produced are linked to the specific families of semiconductor materials that are employed. Indium phosphide and gallium arsenide materials, for example, and the various alloys and stoichiometric composites of these materials, have been widely investigated for the formation of each of the layers within laser diodes fabricated from these materials.

The integration of the optoelectrical device into photonic integrated circuits (PICs) often requires precise placement onto the substrate and the subsequent alignment after placement of optical and electrical features on the die with optical and electrical features on the substrate. The optical facet of a laser die, for example, must be aligned with planar optical waveguides or other optical devices on the substrate to enable effective transfer of the optical signal from the laser to the waveguide or other device. Effective integration of the laser with other devices in optoelectrical or optical circuits on the PIC substrate is essential. An alternative to the alignment of discrete devices is the combination of multiple devices such as the laser and a waveguide, for example, to reduce the quantity of devices that require alignment.

The formation of the integrated device packages that include more than one device and that are compatible with PIC fabrication techniques and methods, and suitable for high-volume production would benefit the art of PIC fabrication. Thus, a need in the art exists for device structures that combine two or more devices, with methods for combining these two or more devices that enable integration in PICs.

SUMMARY

Disclosed herein are embodiments of an integrated optical device structure that includes a laser and a waveguide and a method for the formation of this structure. The disclosed structure provides an integrated device that simplifies manufacturing and provides reduced optical signal losses in comparison to discrete laser and waveguide combinations, among other benefits.

The integrated laser and waveguide device, described herein, includes (1) a planar laser portion of the structure, (2) a planar waveguide portion of the structure that includes a transition waveguide and a dilute waveguide, and (3) a transition region that resides substantially between the planar laser portion and the planar waveguide portion of the structure. The planar laser portion of the optical device includes a laser diode that is formed with both an active QW-containing layer and an underlying contact layer that conform to the topography of the underlying waveguide in one or more portions of the underlying waveguide structure.

Embodiments of the planar laser device structure that includes the conformal QW-containing layer and the conformal underlying heavily doped semiconductor contact layer in the planar laser portion of the structure, also includes laterally extended portions of these layers that extend up to three to five microns, or more, from the edge of the patterned ridge waveguide that resides above these layers. The lateral extensions of the conformal QW-containing layer and the underlying heavily doped semiconductor contact layer in the planar laser portion of the structure result in a formation of a laser structure in which the outer edges of these layers are positioned at a distance from the edge of the ridge waveguide at which leakage currents across the active layer are reduced in significance, or eliminated. Additionally, by positioning the patterned edge of the QW-containing layer remotely relative to the light generation volume of the QW-containing layer, the construction and fabrication of the planar laser device is significantly simplified, leading to reduced fabrication costs.

In some embodiments of the planar laser device and waveguide structure, in addition to the planar laser portion that includes the conformal layers described above, a planar waveguide transition portion and a planar waveguide portion are also included. The transition portion of the optical device structure facilitates the transfer of optical signals from the planar laser portion into the transition waveguide. Optical signals from the transition portion of the optical device structure can move from the transition portion into all or a portion of a dilute waveguide, in some embodiments, for further propagation in a PIC. In some embodiments, the transition portion of the optical device structure described herein, has one or more of a horizontal taper and a vertical taper, and the conformal QW-containing layer and the heavily doped contact layer of the planar laser are formed over the underlying tapered transition portion of the optical device structure. The combination of the tapered transition waveguide and the conformal planar laser layers, in addition to other features described herein, result in improved manufacturability and improved reliability in this optical device structure in comparison to planar laser and waveguide devices that are manufactured discretely and combined.

Other objects and advantages of embodiments will become apparent from the detailed description provided herein. It should be understood, however, that the detailed description and specific embodiments are given by way of illustration only. Various modifications within the scope of the invention will become apparent to those skilled in the art from this detailed description.

DESCRIPTION OF THE DRAWINGS

FIG. 12 (continued). Exemplary process flow steps (v)-(vii) for fabrication of embodiments of the optical device structure.

FIG. 12 (continued). Exemplary process flow steps (viii)-(ix) for fabrication of embodiments of the optical device structure.

DETAILED DESCRIPTION

Figure 1:
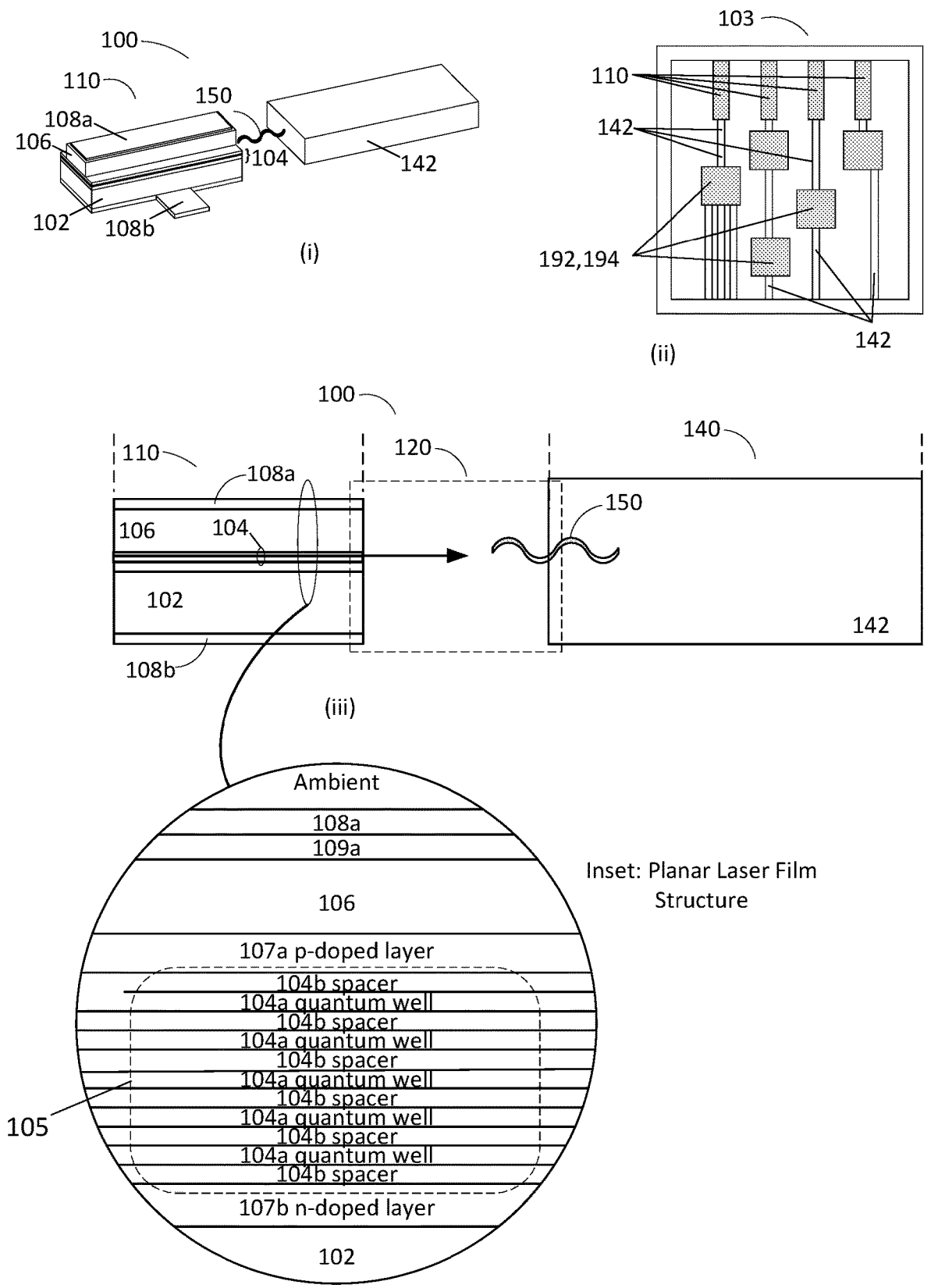
FIG. 1. Schematic drawings of a planar laser with planar waveguide (i) perspective view, (ii) example of a photonic IC, and (iii) cross section with detail drawing of a typical film structure in a planar laser.

Disclosed herein are embodiments of an integrated optical device structure that includes a laser and a waveguide and a method for the formation of this device structure. The combination provides a semiconductor laser with a waveguide in an integrated device structure that can lead to a reduction in the optical signal losses and simplified manufacturing processes in comparison to the fabrication of the individual lasers and waveguides. The resulting integrated device can be packaged as a discrete optical device or the device can be fabricated as all or a portion of an integrated PIC. Simplified manufacturing can provide a reduction in fabrication costs relative to non-integrated solutions. And the reduction in optical signal loss can improve technical performance.

The planar laser device is formed using common semiconductor fabrication techniques, and has a number of features that simplify fabrication and that facilitate integration with the co-fabricated waveguide. This integrated device is formed, in some embodiments, for utilization as a discrete optical circuit component. In other embodiments, the integrated device is formed with other optical components or formed to be utilized with other optical circuit components for use as a component in a PIC. Alternatively, in other embodiments, the optical device is formed on a substrate, interposer, or submount coincidently with one or more other optical circuit components to form all or part of the optical circuit. In either of these cases, the alignment of the combined device structure with other optical and opto-electrical devices in photonic circuit assemblies is simplified in comparison to laser and waveguide components that are manufactured independently. In yet other embodiments, one or more arrays of the optical device structure are formed on a substrate, interposer, or submount to provide an array of devices for applications that require multiple channels or wavelengths. Features in embodiments of the laser structure are particularly suited for concurrently forming arrays that include multiple devices as described herein.

The integrated laser and waveguide device, described herein, includes (1) a ridge waveguide based planar laser portion of the structure, (2) a planar waveguide portion of the structure that includes a transition waveguide and a dilute waveguide, and (3) a transition region that resides substantially between the planar laser portion and the planar waveguide portion of the structure.

The planar laser portion of the optical device includes a ridge waveguide laser diode that is formed with both a QW-containing layer and an underlying contact layer that in embodiments, conforms to the topography of the underlying waveguide structure in combination with a remote lateral extension of these layers some distance from the edge of the overlying ridge waveguide. Light is generated fully or substantially from within an active layer, which in the embodiments described herein is a quantum-well-containing (QW-containing) layer that includes one or more quantum wells (QWs) with spacer layers between the quantum wells. In other embodiments, the active layer may not contain quantum wells in the formation of an optical signal. The light output from the active layer, may be in the infrared portion of the electromagnetic spectrum and in particular, the infrared portions of the electromagnetic spectrum in common use in optical fiber communication networks such as, but not limited to, 850 nm, 1300 nm, and 1550 nm Additionally, the planar laser includes a ridge waveguide formed above the QW-containing layer, cladding layers above and below the QW-containing layer, heavily doped contact layers above and below the cladding layers, and metal electrode layers that contact the heavily doped semiconductor contact layers. In a planar laser, light generated in the QW-containing layer propagates parallel to the surface of the substrate upon which the optical device is formed.

Embodiments of the planar laser device structure that includes the conformal QW-containing layer and the underlying heavily doped semiconductor contact layer in the planar laser portion of the structure, also includes the laterally extended portions of these layers that extend up to three to five microns, or more, from the edge of the patterned ridge waveguide that resides above these layers. Unlike transmission waveguides such as the transition and the dilute waveguides described herein, light does not substantially propagate in the ridge waveguide but rather the ridge waveguide forms a part of the layered diode structure of the planar laser through which current flows. In conventional laser diode structures, one of the two electrical contacts for the two terminal laser diode is formed with the ridge waveguide and a second contact is typically formed with the back surface of the substrate upon which the laser is formed. Current flow between the two contacts, and particularly in the volume of the laser diode that contains the quantum-wells, leads to the generation of the optical signal from the laser device.

A drawback of conventional laser designs that can lead to high leakage currents occurs with disruptions or damaged regions in the crystalline lattice, particularly within or at the boundaries of the light-emitting quantum well layers. In QW-containing layers that are not effectively terminated, for example at the boundaries of these layers, electrical leakage paths and carrier recombination pathways resulting from the exposure to a plasma etch or other patterning method, for example, can lead to a reduction in light output efficiency of the device. The formation of p-n junctions in buried heterostructures, a potential remedy, can be costly, in that many process steps are required to form the various layers required to form the terminating p-n junctions in structures that utilize this approach. Alternatively, in embodiments disclosed herein, a laser structure is described in which the QW-containing layers of the laser diode and the underlying contact layer that forms a bottom contact with the QW-containing layer are extended laterally from the edge of the ridge waveguide to a remote position beyond which the leakage current is reduced in significance, or eliminated.

Remote positioning of the edge of the QW-containing layer can minimizes or eliminate the effects of the potentially damaging etching steps that are commonly utilized to pattern these layers. Damage from the etching steps can take the form of defects in the crystallographic structure, diffusive impurities within the QW-containing layer, and etch residue on the etched surface, among other forms. Remote positioning of the edge of the QW-containing layer, at a distance of greater than 3 microns or greater than 5 microns in embodiments, can minimize or eliminate the deleterious effects of processes used in the patterning of this layer. In some embodiments, the edge of the QW-containing layer is greater than 3 microns from the edge of the ridge waveguide. In other embodiments, the edge of the QW-containing layer is greater than 5 microns from the edge of the ridge waveguide. In preferred embodiments, the edge of the QW-containing layer is in the range of 3-5 microns. In some embodiments, for example, in which a wet etch is used to pattern the active or QW-containing layer, a shorter distance between the edge of the ridge waveguide can be used.

The positioning of the heavily doped contact layer immediately below the QW-containing layer further allows for the relocation of this contact layer from below the substrate as in typical planar laser structures to being in intimate contact with the bottom of the QW-containing layer. The thinness of the QW-containing layer and the underlying contact layer also allows these layers to be conformally deposited over underlying topography, such as one or more underlying waveguides. In embodiments, the relocation of the underlying contact layer from beneath the substrate to just below the QW-containing layer, conformal with the underlying transition or buried waveguide topography, provides a waveguide structure for receiving the optical output signal from the planar laser portion of the device structure, and for transferring of this signal to a waveguide or a waveguide device such as a spot size converter, among others, in direct or indirect communication with other devices in a photonic circuit. In some embodiments, the optical signal from the planar laser portion of the device structure, is transferred through the thin conformal contact layer to the optical transition waveguide.

The formation and use of the conformal bottom contact layer with the underlying integrated waveguide structure simplify the formation of the device and the integration of the laser with an accompanying waveguide. Additionally, the remote positioning of the patterned edge of the QW-containing layer from the light generation volume of the QW-containing layer, also simplifies the construction and fabrication of the planar laser device, leading to reduced fabrication costs. In embodiments, the specific benefits of the remote positioning of the edges of the QW-containing layer in combination with the conformal underlying QW and contact layers are described. The relevance of these benefits for the formation of arrays of devices are also described.

In addition to the planar laser portion of the device structure, embodiments described herein, include a planar waveguide portion of the structure that further includes a transition waveguide and a dilute waveguide, and a transition region that resides substantially between the planar laser portion and the planar waveguide portion of the structure.

In embodiments, the transition region portion of the optical device structure includes a transition region through which optical signals from the laser can move from the laser into a transition waveguide, and ultimately into an underlying dilute waveguide that resides below the transition waveguide in the transition region in some embodiments, and extends beyond the transition region in other embodiments. Optical signals that originate in the planar laser portion of the structure move into the transition region prior to reaching the dilute waveguide. The dilute waveguide, as described herein, is a waveguide or portion of a waveguide through which optical signals propagate once they have passed through the transition region, which is formed, in embodiments, with either an horizontally tapered transition waveguide interface with the planar laser, a vertically tapered transition waveguide interface with the planar laser, or a transition waveguide interface with the planar laser that is both horizontally and vertically tapered. Tapering of the transition waveguide in the transition region between the planar laser and the planar transition waveguide, allows for light from the laser to enter the transition waveguide and to move through this transition waveguide into the underlying dilute waveguide. This light is delivered from the QW-well containing layer, through the bottom contact layer, to the transition waveguide. Methods for fabricating the planar laser portion of the structure, when integrated with the formation of the transition region portion of the device structure, provide device performance benefits and ease of fabrication relative to planar lasers and transition regions that are formed independently.

In embodiments, the QW-containing layer of the planar laser contains a bottom cladding layer, and the widths of the QW-containing layer, the bottom cladding layer, and the underlying contact layer narrow in the transition region of the device structure. Light generated in the QW-containing layer travels through the bottom cladding layer and the bottom contact layer to the underlying transition waveguide in the transition region as the widths of these layers are narrowed.

In other embodiments, the QW-containing layer does not contain a bottom cladding layer. In configurations without a bottom cladding layer, light from the laser diode is anticipated to more easily reach the underlying transition waveguide although the performance of the laser diode may be compromised relative to embodiments with a bottom cladding layer.

In yet other embodiments, the bottom cladding layer may be a partial cladding layer, such that the bottom cladding layer is present in the planar laser section of the optical device but not in the transition region portion. And in yet other embodiments, a portion of a bottom cladding layer may be present in the transition region of the optical device.

Beyond the transition region portion of the optical device structure, is the planar waveguide portion of the structure, that includes all or part of a transition waveguide positioned above a dilute waveguide. The dilute waveguide, as described herein, is typically the primary waveguide through which the optical signal from the laser propagates to another component in the PIC. Between the planar laser and the planar waveguide portions of the structure is the transition region that includes the tapered section of the transition waveguide. The transition waveguide, typically smaller in cross section than the dilute waveguide, receives light from the laser and facilitates the transition of this light from the laser to the dilute waveguide in preferable optical propagation modes. As the light transitions from the laser to the dilute waveguide, the spot size of the optical signal can be increased with the sizing of the physical waveguide, for example, in preferred optical propagation modes to facilitate transmission to one or more devices in the PIC.

In embodiments, the waveguide structure provides at least a transition region to facilitate the movement of the optical signal from the laser to the transition waveguide, and in some embodiments to convert the size or mode of the optical output signal from the laser to a preferred size or form as required by the application. Additionally, the transition region of the waveguide structure provides an interface between the laser and the tapered portion of the transition waveguide.

The transition region between the laser structure and the dilute waveguide provides improved coupling of optical signals between these two portions of the device structure. This transition layer utilizes fabrication methods that provide dimensionally controlled processes to form low loss interfaces between the laser, the transition region, and the planar optical waveguides (transition waveguide and dilute waveguide.)

In embodiments, the QW-containing layer of the planar laser portion of the device structure extends laterally up to three to five microns or more from the long axis of the ridge waveguide in the planar laser section of the combined device structure, tapers inward into the transition region, and is terminated in a narrowed portion within the width of the top surface of the transition waveguide, coincident in some embodiments in this transition region with the ridge waveguide that resides above the QW-containing layer. Narrowing of the width of the QW-containing layer in the transition region, promotes movement of the optical signal from this QW-containing layer into the larger less restricted volume of increased refractive index in the transition waveguide below. The use of a transition waveguide that is wider than the narrowest portion of the QW-containing layer above, in embodiments, facilitates the transition of the laser light from the narrowed QW-containing layer through the conformal bottom contact layer, to the transition waveguide below, as does the use of material with a higher index of refraction in the transition waveguide.

The tapering of the QW-containing layer and the transition waveguide in the transition region along the propagation path, in some embodiments, is horizontal tapering. Horizontal tapering is defined as narrowing of a feature as viewed from a top-down or bottom up perspective as described herein. In other embodiments, the tapering of the transition waveguide in the transition region portion of the optical device structure is vertical tapering. Vertical tapering is defined as narrowing of a feature as viewed from a side or end view perspective, as described herein. In yet other embodiments, the transition waveguide in the transition region tapers both horizontally and vertically.

In the transition region of embodiments of the disclosed device structure, as the QW-containing layer narrows from the extended lateral edge of the planar laser portion of the structure to dimensions within the width of the planar transition waveguide, the patterned edge of this QW-containing layer, too, is narrowed. Electrical current is not drawn substantially through the diode in this transition region, however, and the potentially deleterious effects of the patterned edge are not anticipated to contribute significantly to losses in the light generation efficiency of the diode. In the transition region, the elimination of the deleterious effects of the patterning of the QW-containing layer are further eliminated or minimized, in some embodiments, with the use of a wet etch process to pattern the QW-containing layer.

Within the transition region between the planar laser and the portion of the transition waveguide that extends beyond this transition region, in some embodiments, both the ridge waveguide layer and the QW-containing layer of the planar laser are terminated.

The length of the light-generating volume of the laser diode is typically defined to some extent by the lengths of the bottom contact layer of the two terminal laser diode and the upper electrical contact that is formed above the ridge waveguide in the planar laser portion of the device structure. That is, the emissive portion of the QW-containing layer of the planar laser is substantially coincident with the portion of the laser that is aligned with the upper and lower metal electrode contacts that are typically configured, in embodiments, above and alongside the ridge waveguide. The metal electrodes substantially define the emissive portion of the planar laser, in that it is the conduction between the two metal electrical contacts that initiates emission from the QW-containing layer of the laser diode. Emission from the QW-containing layer is expected to decrease significantly beyond the portion of the laser that is aligned with one or more of the metal electrical contacts. The QW-containing layer, however, in embodiments, can extend substantially into the transition region beyond the edges of the contact layers before being terminated. In embodiments, the extension of the QW-containing layers beyond the light generating portion of the laser diode, however, facilitates the movement and transitioning of the optical signal into the underlying transition waveguide. This portion of the QW-containing layer that extends beyond the length of the metal electrode layers is not anticipated to contribute significantly to light generation. Extension of the QW-containing layer into the transition region and subsequent narrowing and termination of the QW-containing layer within the transition region allows for the transfer of the optical signals from the laser, through the conformal bottom contact layer, to the underlying portion of the transition waveguide that resides below the QW-containing layer. The portion of the transition waveguide that resides within the transition region, is either horizontally tapered, vertically tapered, or both, to facilitate the transfer of the optical signals from the planar laser to the transition waveguide. Various embodiments of this transition region, along with detailed structures for terminating the ridge waveguide and the QW-containing layers, and for optically transitioning the light from the laser into the transition waveguide, are described herein.

The portion of the QW-containing layer that interfaces with the transition waveguide in the transition region typically extends to a distance of a few microns to tens of microns from the edge of the emissive portion of the QW-containing layer of the planar laser. The overall length of the transition waveguide, however, can extend hundreds of microns, or more, beyond this transition region. The contact layer, in embodiments, is a conformal epitaxial layer that is formed over the planar laser structure that can include one or more of the transition waveguide and the dilute waveguide.

Embodiments described herein of the optical device structure that includes a planar laser structure with a waveguide, is formed on a substrate, in embodiments, from a stack of semiconductor layers typically using epitaxial growth techniques. Improvements in manufacturability are achieved, in some embodiments, with a reduction in the number of steps required to fabricate the laser and the waveguide devices separately, in comparison to the number of steps required to produce the combined laser and waveguide. The combined device structure that includes those of the planar laser structure, the planar waveguide, and the transition region between the planar laser and the planar waveguide result in a simplification of the overall fabrication process relative to the formation of discrete planar lasers and planar waveguides. Additionally, implementation and integration of the completed device structure that includes both the laser and at least a portion of a waveguide, further benefits from the elimination of the critical optical alignment steps that are required for the alignment of a laser to the waveguides that receive the optical output from the lasers, for alignment to other optical and optoelectronic devices, and for alignment with other elements or components in photonic integrated circuits.

The use of a quantum well layer in combination with a thin underlying semiconductor contact layer, provides a means for independent patterning and optimization of the areal locations for these layers. In embodiments, a heavily doped contact layer is formed on the mesa structure that results from the combination of the transition and dilute waveguides in the transition region. Above this contact layer, in some embodiments, the QW-containing layer conformally covers a portion of the tapered section of the transition waveguide. An emissive QW layer that contains InGaAsP quantum well layers and spacer layers is formed above an $n^+$-InP contact layer, for example, in embodiments using InP substrates and epitaxial structures.

In the transition region between the planar laser structure and the planar waveguides, a buried tapered portion of the transition waveguide is provided to facilitate the transition of the optical signal between the planar laser and the planar waveguides. In embodiments, a portion of the transition waveguide resides below the QW-containing layer and the heavily doped semiconductor contact layer. This structure eliminates the requirement for placement and alignment of conventional, planar waveguides that are fabricated as discrete devices and that are then mounted to a substrate with optical and optoelectrical devices, including waveguides, to form a photonic circuit.

In an embodiment, the planar laser portion of the device structure is formed over a wide underlying portion of a transition waveguide. This embodiment has significant advantages in that the horizontal planarity of the layers is maintained in the planar laser, in the planar waveguides, and particularly in the transition region between the laser and the waveguides. Horizontal tapering of the transition waveguide in the transition region in this embodiment simplifies the fabrication of the overall structure.

In another embodiment, an optically blocking fill layer is provided in place of all or part of the transition waveguide that resides below the planar laser. This blocking fill layer reduces or eliminates the likelihood that light from the laser will be deflected in the optical cavity below the planar laser. In this embodiment, planarity is also maintained throughout the structure and particularly in the transition region with the use of horizontal tapering.

In yet another embodiment, the planar laser portion of the device structure is formed directly on the substrate or on a portion of the dilute waveguide, and the tapered portion of the transition waveguide begins in the tapered region of the structure. That is, the transition waveguide is not present between the planar laser and the underlying dilute waveguide or substrate. In this embodiment, vertical tapering of the transition waveguide is used in the transition region to provide the low optical loss interface between the planar laser and the transition waveguide. This low loss interface allows light from the laser to move through the bottom contact layer and into the transition waveguide below. Unlike in the embodiments with only horizontal tapering of the transition waveguide in the transition region, embodiments with vertical tapering can include conformal layering of the QW-containing layer and the underlying contact layer over the vertically tapered transition waveguide. An added benefit of the embodiments with vertical tapering, is the capability to eliminate the optical cavity that is formed with the part of the transition waveguide that resides below the planar laser as in some embodiments with a horizontally tapered transition waveguide.

In some embodiments with vertical tapering, the QW-containing layer in the planar laser portion of the structure is formed directly on the heavily doped contact layer that is formed on the transition and dilute waveguides. In these embodiments, the transition waveguide in the transition region portion of the device structure is vertically tapered to facilitate the transition of the optical signal from the QW-containing layer, through the bottom contact layer, to the transition waveguide. In an embodiment in which vertical tapering is implemented, the width of the transition waveguide is maintained in some embodiments through the transition region between the planer laser structure and the extended portion of the transition waveguide, and the thickness of the transition waveguide increases with increasing distance from the planar laser structure. In these embodiments, light from the planer structure moves from the region of effective lower refractive index in the QW-containing layer, through the bottom contact layer, to the region of higher effective refractive index in the underlying vertically tapered transition waveguide.

In yet other embodiments, the QW-containing layer in the planar laser portion of the structure is formed directly on the heavily doped contact layer on the transition and dilute waveguides, and the transition waveguide in the transition region is both vertically tapered and horizontally tapered to facilitate the transition of the optical signal from the QW-containing layer, through the bottom contact layer, to the transition waveguide. In these embodiments, the width of the transition waveguide either increases or decreases relative to the width of the transition waveguide in the transition waveguide portion of the device structure, and the thickness of the transition waveguide increases with distance from the interface between the planer laser portion of the device structure in the direction of signal propagation into the transition region portion of the device structure. In these embodiments, light from the planar laser structure moves from the region of effective lower refractive index in the QW-containing layer, through the bottom contact layer, to the region of higher effective refractive index in the underlying vertically tapered transition waveguide.

In yet other embodiments, as described herein, one or more of the ridge waveguide, the underlying QW-containing layer, and the portion of the transition waveguide below the QW-containing layer are horizontally tapered, vertically tapered, or both. Detailed descriptions of examples of embodiments are described that illustrate various tapering configurations, and the benefits of these variations in the tapering of these layers in the transition region in these configurations, coupled with the conformality of the QW-containing layer and the bottom contact layer in this transition region, and the remote positioning of the patterned edge portion of the QW-containing layer of the bulk planar laser structure will be made increasingly evident.

In some embodiments, a conformal QW-containing layer and an underlying heavily doped semiconductor contact layer below this QW-containing layer, particularly in structures with a vertically tapered transition waveguide, benefit from having the bottom contact layer in contact with, or in close proximity to, the QW-containing layer. In some embodiments, the conformal, heavily doped, bottom contact layer, for example, is in direct contact with the conformal QW-containing layer. By contrast, in conventional buried heterostructure planar lasers, the bottom or back contact is positioned below the planar laser substrate and electrical current must flow from the top contact above the ridge waveguide, through the diode and the substrate to reach the bottom contact below the substrate. The combination of the conformal QW-containing layer and conformal contact layer over the transition waveguide in embodiments, however, eliminates the electrical resistance associated with the transition waveguide, the dilute waveguide, and the underlying substrate. That is, an improvement in efficiency in embodiments occurs as a result of the reduction in the resistive and parasitic losses associated with the substrate resistance in comparison to diodes with a back contact that is formed on the back surface of a laser substrate through which the current must travel to reach the back contact.

The emissive portion of the QW-containing layer is influenced, wholly or in part, in some embodiments, by the widths of the ridge waveguide above and the transition waveguide below this layer. The conformal layering over the transition waveguide in the transition region, and particularly over the tapered portion of the transition region, further facilitates the containment and movement of light from the laser, into the favorably patterned transition waveguide.

A conformal QW-containing layer is provided, in some embodiments, in the transition region portion of the device structure between the planar laser device and the transition waveguide. The inclusion of the conformal QW-containing layer in this transition region of the transition waveguide facilitates the transfer of the optical signal from the laser into a portion of the transition waveguide while minimizing signal loss and while maintaining the spot size of the optical signal from the laser. Subsequently, the optical signal in some embodiments, propagates from the transition waveguide to the dilute waveguide. The dilute waveguide, in embodiments typically, but not necessarily, has a larger cross-sectional area than the transition waveguide to facilitate an expansion of the spot size. An increase in the spot size is beneficial in some embodiments, and may be required to facilitate propagation or interactivity with other devices in the photonic circuit or network. The combination of the conformal QW-containing layer and the underlying contact layer, with the integrated section of the transition waveguide, provides a low optical loss transition in comparison to configurations in which a planar laser is independently coupled to a planar waveguide in the form of a discrete circuit component. Ultimately, as the optical signal propagates from the laser, through the transition region and extended portions of the transition waveguide, and into the dilute waveguide, the optical signal undergoes an expansion of the optical spot size from that of the original laser spot size.

In some embodiments, the transition waveguide layer is an undoped, epitaxially grown semiconductor layer. The use of an undoped layer is beneficial for minimizing doping-related optical signal loss in both the transition region portion in embodiments of the disclosed device structures and in portions of the transition waveguide that reside beyond the transition region portion of the structure. The capability for using an undoped waveguide is achieved in embodiments as a result of the formation and use of the conformal contact layer beneath the emissive QW-containing layer. With the introduction of the conformal contact layer over the mesa structure formed by the combination of the transition waveguide and the dilute waveguide, the electrically insulating transition waveguide itself is no longer a required electrically conductive element of the laser diode device structure. In embodiments, the conformal contact layer below the QW-containing layer provides the required electrical contact to the bottom electrode of the two terminal diode structure thereby eliminating the requirement for the diode current to be carried through the transition waveguide layer.

The current carrying feature of the conformal contact layer below the QW-containing layer allows for increased flexibility in tailoring the compositional properties and geometrical shape of the transition waveguide for such properties as the index of refraction, for example, that are required to better facilitate the transition of the optical signal from the emissive QW-containing layer above, to the dilute waveguide below. Mechanical design flexibility is also improved.

Features of the planar laser device structure simplify fabrication steps that can result in cost savings over conventional designs, and that result in improved laser output efficiency and a reduction in optical signal loss relative to conventional discrete semiconductor lasers and the waveguides that are used in conjunction with these lasers. Regarding the manufacturability of embodiments of the device structure described herein, a number of modifications over the current art can lead to significant reductions in fabrication costs. The semiconductor layers in the planar laser structures, for example, can be fabricated with a single monolithic regrowth step after deposition and formation of the transition waveguide. In semiconductor fabrication processing, substrates must be removed from vacuum with each patterning step, thereby exposing the surfaces to ambient conditions that can lead to undesirable surface oxidation and to airborne contamination that must be considered upon resumption of the epitaxial regrowth. Further, each patterning step can significantly increase the fabrication costs for the device structure. Conversely, a reduction in the number of patterning steps in embodiments, can lead to significant cost savings.

In some embodiments, the structure is substantially formed from a stack of epitaxially grown semiconductor layers using one or more of InP, GaAs, combinations of GaAs and InP, alloys of GaAs and InP, doped layers of InP and GaAs, among others. In some embodiments, all or part of the optical device structure is formed monolithically. In embodiments, the transition waveguide layer is patterned using a wet etch process to minimize damage to the crystalline structure and an epitaxial deposition process is then used to grow the conformal contact and QW-containing layers over the wet etched surfaces of the transition waveguide. Additional patterning steps are used to define the openings through the QW-containing layer to the underlying semiconductor contact layer. Although dry etching processes can be used in the formation of the waveguide device structure, it is not required for the patterning of the active layers, that include the QW-containing layers. Dry etching is known to potentially lead to a reduction in the performance of devices that utilize plasma-based etch processes as a result of the potential for ion induced damage to plasma exposed features. Plasma exposure can lead to a disruption in the crystallographic structure that can affect re-growth in subsequent epitaxial deposition processes.

It is advantageous in many applications for both electrical contacts of two-terminal laser diodes to be accessible from the same side of the completed device, either top or bottom to allow for, for example, top-down wire bonding for configurations in which electrical contacts between the lasers and the photonic circuit are formed after mounting, or alternatively bottom contact configurations in which the electrode terminals of the laser device are made in a "flip chip" arrangement. The accessibility of the first contact layer that resides below the QW-containing layer in the film structure, in some embodiments, in combination with the second contact of the two-terminal laser diode that resides above the ridge waveguide layer provides such a benefit, resulting in increased flexibility and reduced manufacturing costs in comparison to device structures that have one electrical contact formed at the top of the laser and a second electrical contact that is formed on the bottom side of the substrate of the finished devices. Having the two terminals of the two-terminal diode on the same side can simplify connectivity to photonic circuits in some applications and can allow for the laser device or device structure to be directly connected to contact pads formed on the substrate, interposer, or submount. It should be noted that embodiments described herein are not precluded from having a contact formed on the backside of the substrate using applicable methods.

Embodiments of the integrated device structure are not limited to the formation of a single device but rather the embodiments described herein are suitable for the formation of arrays of devices that can be manufactured simultaneously using common semiconductor fabrication techniques as described herein.

In the embodiments described herein in the following figures, the benefits of the structure and method of formation of laser diodes with conformal layers over the underlying waveguide topography are further described, as are the benefits of the structure that allow for low optical signal transmission losses as a consequence of the integrated device structures in which all or a portion of the laser and the waveguide are in intimate contact. Other objects and advantages of the embodiments will become apparent from the following detailed description of the figures.

In FIG. 1(i), an isometric drawing of an assembly 100 is shown that includes a planar laser 110 and a waveguide 142. The planar laser 110 is shown positioned relative to a planar waveguide 142 such that an optical signal 150 can be transferred from the planar laser 110 to the waveguide 142. FIG. 1 provides some background context for discussion of embodiments to follow. A generic planar laser 110 is shown in FIG. 1(i) with some key features of this device. Solid state planar lasers, such as the planar laser 110, are typically two terminal diode devices through which electrical current is drawn through an active layer to generate light. Efficiencies in the structure have been realized since the discovery of the laser diode that include the use of semiconductors such as InP and GaAs, and the incorporation of quantum well layers in the light-generating portion of the active layer of the structure. FIG. 1(i), FIG. 1(iii), and the inset of FIG. 1(iii) show a diode laser structure fabricated with substrate 102 and with quantum well containing (QW-containing) layer 104. The QW-containing layer 104 can have one or more quantum well layers 104a, and one or more spacer layers 104b in the QW-containing layer 104. Additionally, the QW-containing layer 104 can have layers 107a, 107b above and below the quantum wells 104 and can include spacer layers, cladding layers, and other layers above and below the QW's. Above the QW-containing layer 104 is also a ridge waveguide 106. Unlike the planar waveguide 142, light does not travel substantially, if at all, within the ridge waveguide but rather generally affects the impedance of the optical cavity in the QW-containing layer 104 below the ridge waveguide 106. An upper electrical contact 108a is typically formed on the ridge waveguide 106 and a bottom electrical contact 108b is typically formed below the substrate 102. In typical operation, with electrical current flowing between the electrical contacts 108a, 108b of the planar laser device 110, an optical signal 150 is generated. The planar laser structure 110 shown is an edge emitting laser with the edge facet of the laser 110 aligned with the edge facet of an adjacent planar waveguide 142 such that the optical signal output 150 is substantially and effectively transferred from the laser 110 to the waveguide 142.

Referring to FIG. 1(ii), a drawing of all or a portion of a PIC 103 illustrates an example of a configuration in which planar lasers are positioned with other components of an integrated photonic circuit. Planar lasers 110 are positioned to allow for transfer of the laser-generated optical signals 150 to adjacent planar waveguides 142. Each planar laser 110 provides an optical signal to the waveguide to which its optical output is aligned.

Optical signals 150 propagate from the lasers 110 to planar waveguides 142 and subsequently to optical and optoelectrical devices 192, 194, for example. A wide array of options and configurations are available for light generating lasers 110, planar waveguides 142, and optical and optoelectrical devices 192, 194 to those skilled in the art of photonic circuit design and fabrication. Optical and optoelectrical devices 192, 194 include waveguides, arrayed waveguides, splitters, multiplexers, demultiplexers, detectors, emitters, lasers, diodes, photodetectors, lenses, modulators, among many others.

A cross-section of the assembly 100 is shown in FIG. 1(iii) that includes a planar laser 110 and a waveguide 142. The structure shown in FIG. 1(iii) includes the planar laser portion 110, a transition portion 120, and planar waveguide portion 140. Elements of a typical simplified planar laser structure 110 are shown that include the substrate 102, the QW-containing layer 104, the ridge waveguide 106, and the upper and lower electrical contacts 108a,108b. An example of a typical layered structure of a planar laser are provided in the inset of FIG. 1(iii). Detail 105 within the inset of FIG. 1(iii) shows a typical active or light emitting portion 105 that includes a QW-containing layer of a planar laser. The QW-containing layer shows multiple quantum wells consisting of the quantum well layers 104a and the intermediate spacer layers 104b. Doped layers 107a, 107b above and below the QW-containing layer within the diode structure are also shown. Doped layers 107a,107b can be one or more of a cladding layer, a spacer layer, or other functional element of the diode structure known and practiced in the art.

Optical signal 150 is emitted from the edge facet of the QW-containing layer 104 through a transition region portion 120, to an adjacently positioned planar waveguide structure portion 140. Planar waveguide 142 is formed on a common substrate with the planar laser in some applications and combined with a discrete laser on a substrate, interposer, or submount in other applications, for example. Waveguide 142 receives the optical signal 150 from the planar laser section 110. Waveguide 142 is a planar waveguide through which signals typically propagate throughout all or part of the photonic circuit.

Figure 2:
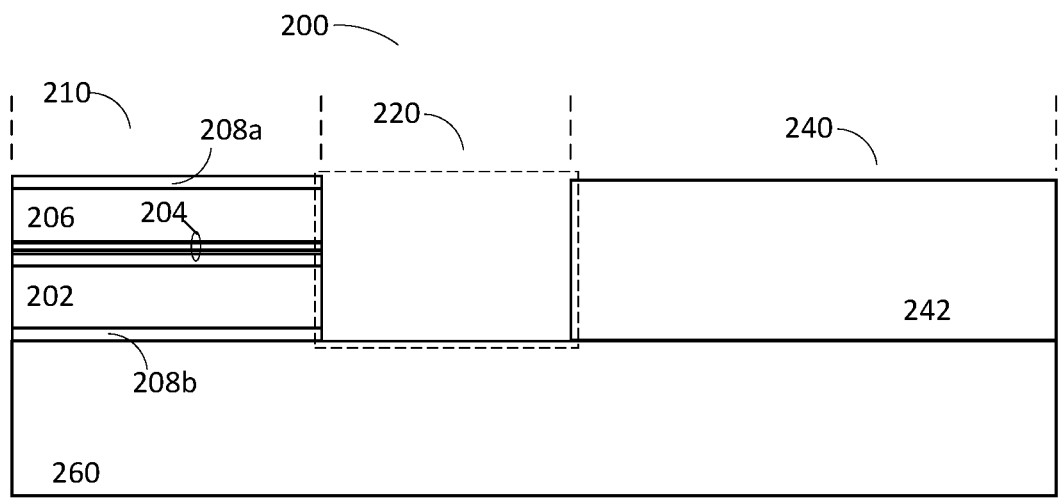
FIG. 2. Conceptual illustration of the elements of a planar laser and waveguide with transition region (i) cross section, (ii) cross section with optical signal, and (iii) perspective view.
Figure 2:
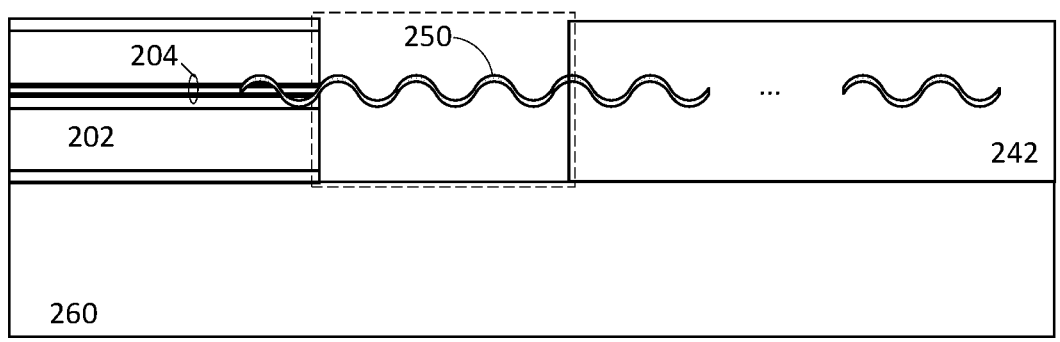
Figure 2:
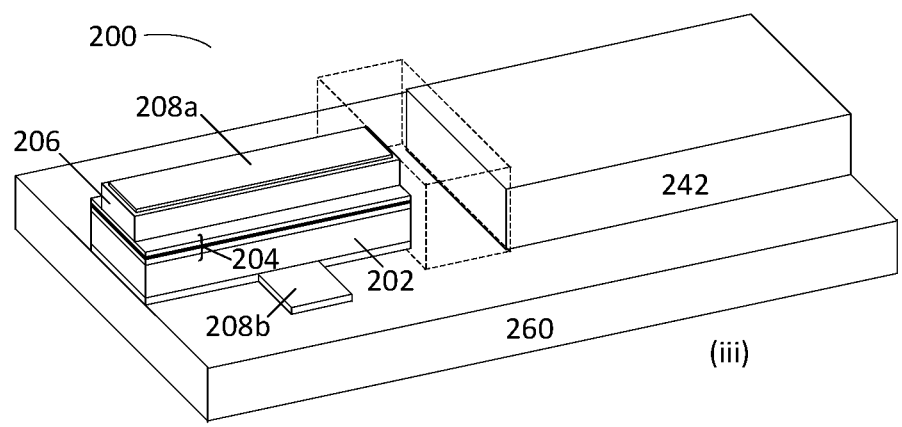

The conceptual elements of the assembly 100 that includes a planar laser portion 110 and a planar waveguide portion 142 are further illustrated in the assembly 200 that includes a planar laser portion 210 and a planar waveguide portion 242 as shown in FIGS. 2(i)-2(iii). In FIG. 2(i), a planar laser portion 210 is formed on a substrate 260. Substrate 260 in FIG. 2(i) can be a substrate, interposer, or submount or other form of mechanical support for forming or combining elements of a photonic circuit. Note that substrate 260 can differ from the substrate 202 of planar laser 210 upon which the planar laser diode itself is formed. Planar laser 210 can be formed on the substrate 260 using a sequence of fabrication steps or fabricated wholly or in part and combined with the substrate 260. Elements of the planar laser 210 include the substrate 202, the QW-containing layer 204, the ridge waveguide 206, and the upper and lower electrodes 208a and 208b, respectively. Transition region 220 is also shown in FIG. 2(i)-2(iii). Ideally, the beneficial characteristics of a transition region 220 include the means for guiding or transitioning the signal from the QW-containing layer 204 to the planar waveguide structure 242. Other beneficial characteristics of the transition region include an alignment feature to align the edge facet of the planar laser 210 to the planar waveguide 242. Additionally, the transition region 210 should include the means for minimizing loss of the optical signal 250 as the signal propagates through the transition region 210. In addition to losses from misalignment, losses can also occur, for example, from propagation across interfaces, absorption in the materials in the transition region, defects in the materials in the transition region, effects of the geometrical shape of the materials and layers in the transition region on reflection and propagation, and the effects of geometry on the formation of efficient optical signal modes, among other possibilities.

Referring to FIG. 2(ii), the path of an optical signal is shown as it traverses the transition region 220 from the QW-containing layer 204 in the planar laser section 210 to the planar transition waveguide 242. In FIG. 2(iii), a perspective illustration is shown of the conceptual elements of the planar laser 210 with the transition region 220 and a planar waveguide 242.

Figure 3A:
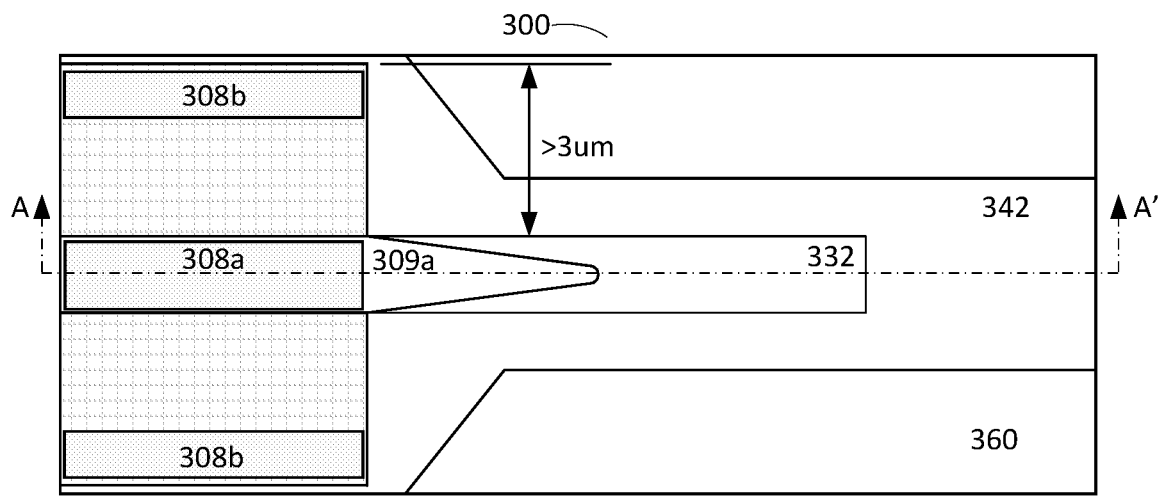
FIG. 3A. Embodiment of a planar laser with combined planar laser and waveguide that includes the modified QW-containing layer and the transition region: (i) Top View, (ii) Section A-A', and (iii) Section B-B'.
Figure 3A:
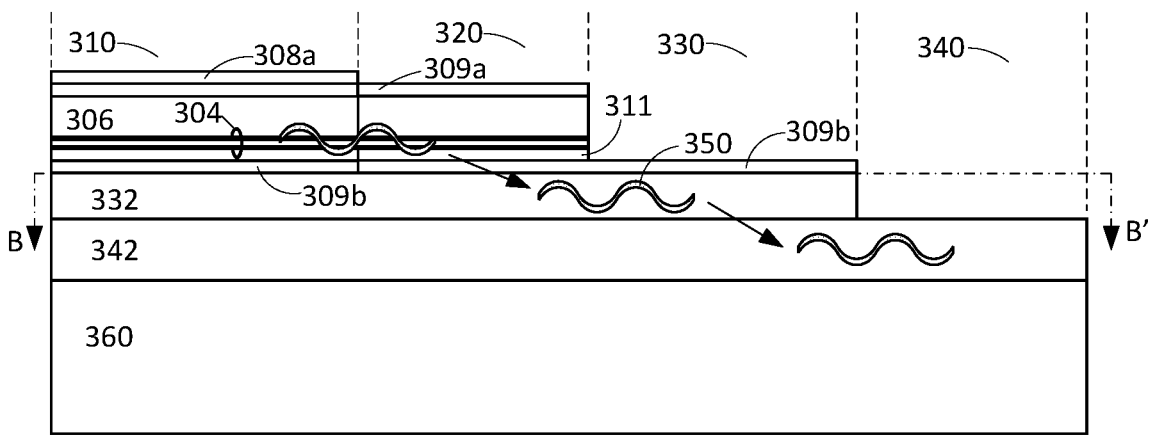
Figure 3A:
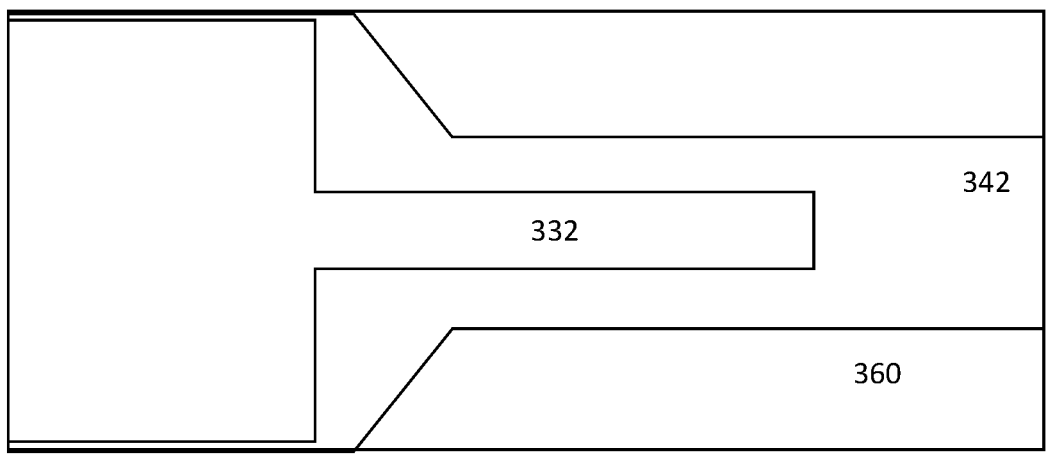

Referring to FIG. 3A, an embodiment of a planar laser and waveguide structure 300 with horizontal tapering of the planar laser layers is shown. In FIG. 3A(i), a top view schematic drawing is shown that includes the substrate 360 and planar waveguides 332, 342. These features and others of the device structure 300 are further shown in FIG. 3A(ii) and FIG. 3A(iii). FIG. 3A(ii) shows planar laser portion 310, transition region portion 320, transition waveguide portion 330, and dilute waveguide portion 340.

The embodiment of device 300 shown in FIG. 3A includes substrate 360, dilute waveguide 342 on substrate 360, and patterned transition waveguide 332 on the dilute waveguide 342. The patterned dilute waveguide layer 342 and transition waveguide layer 332 are shown in top down Section B-B' of FIG. 3A(iii). (The layers above the waveguides 332, 342 are not shown in this drawing.) In an embodiment, transition waveguide layer 332 is an InP layer or a compositional alloy of InP. Contact layer 309b shown in FIG. 3A(ii) is a thin doped InP layer formed on the transition waveguide 332. Planar laser portion 310 and transition region portion 320 further include spacer or cladding layer 311, QW-containing layer 304, ridge waveguide 306, upper semiconductor contact layer 309a, and electrode contact layer 308a. Optical signal 350 shown in FIG. 3A(ii) illustrates how an optical signal 350 might traverse the structure from the signal generation region in the QW-containing layer 304 in planar laser portion 310 through the transition region portion 320 to the transition waveguide portion 330, and ultimately to the dilute waveguide portion 340.

The optical signal 350, originating in the laser portion 310, propagates into the transition region portion 320 of the QW-containing layer 304. The narrowing of the QW-containing layer 304 combined with an increase in the effective index of refraction in the transition waveguide 332 below the QW-containing layer 304, promotes movement of the optical signal 350 to the transition waveguide 332. The increase in the effective index of refraction in the transition waveguide 332 results, in embodiments, from one or more of an increased value of the index of refraction of the material in the transition waveguide 332 relative to the QW-containing layer above, and an increase in the volume of the transition waveguide 332 relative to the narrowing portion of the QW-containing layer 304. The intentional narrowing of the QW-containing layer 304 and in some embodiments, the underlying contact layer 309b, in the transition region 320, provides an example of horizontal tapering of the QW-containing layer 304.

Figure 3B:
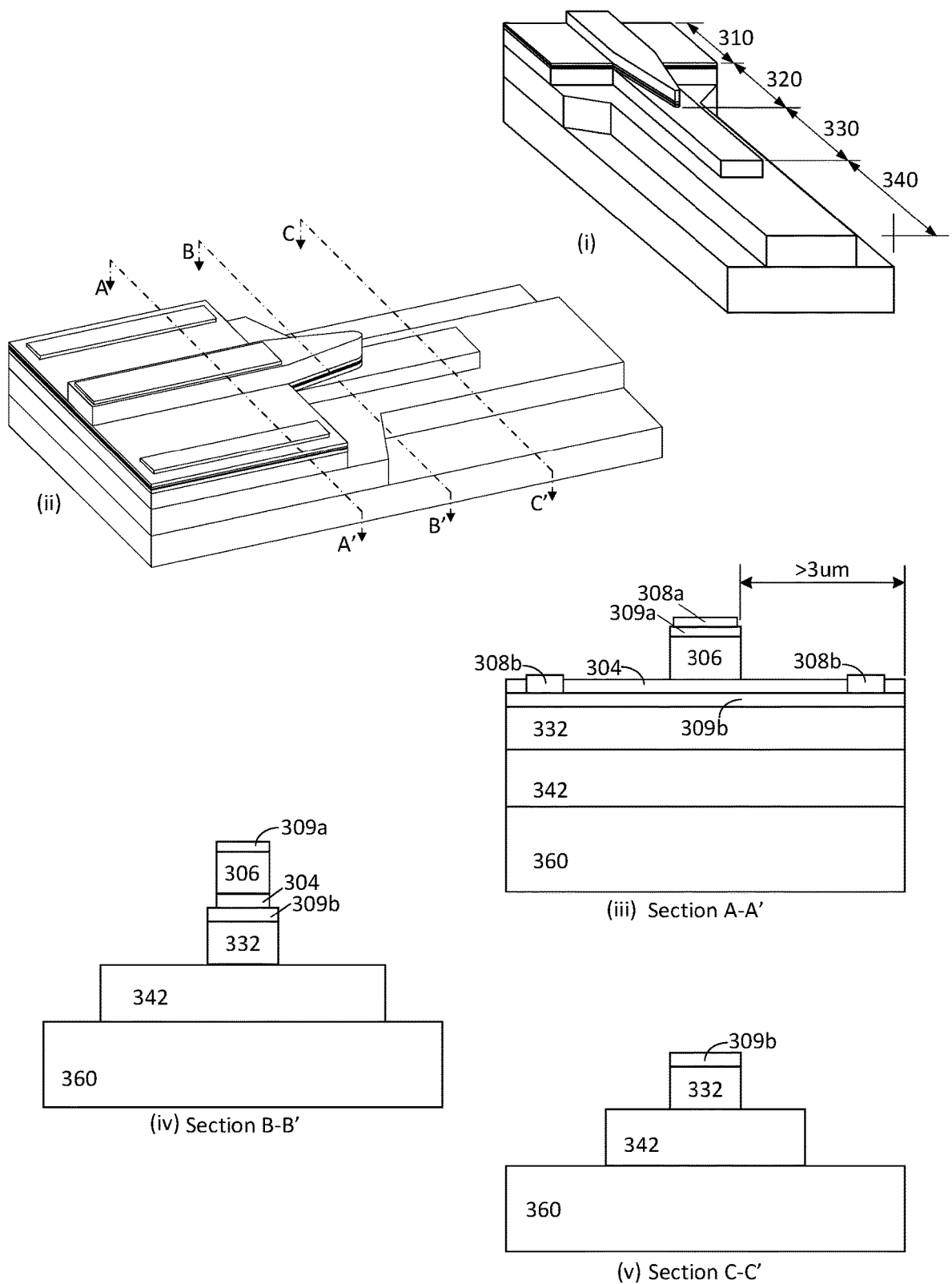
FIG. 3B. Embodiment of a planar laser with combined planar laser and waveguide that include the modified QW-containing layer and the transition region: (i) Isometric view with labels for bulk planar laser portion 310, transition portion 320, transition waveguide portion 330, and dilute planar waveguide 340, (ii) Isometric view, (iii) Section A-A', (iv) Section B-B', and (v) Section C-C'.

The QW-containing layer 304 in the planar laser portion 310 extends laterally 3 microns or more from the vertical edge of the ridge waveguide 306 as shown in FIG. 3A(i) and in FIG. 3B(ii). This lateral extension of the QW-containing layer ensures that the etched or otherwise patterned edge of the thin QW-containing layer 304 is sufficiently remote from the generation region of the planar laser 310 (see light generation region 105 for example) to minimize, reduce, or eliminate the deleterious effects that might be present as a result of the patterning process, for example, on signal generation. In the embodiment shown in FIG. 3, the horizontal tapering of the QW-containing layer 304 and the contact layer 309b is shown to extend only to the width of the transition waveguide 332. In other embodiments, examples of which are shown herein, the horizontal tapering of these layers extends beyond the edges of the transition waveguide 332. In some embodiments, the shape of the contact layer 309b closely follows that of the QW-containing layer 304. In other embodiments, the shape of the contact layer 309b does not closely follow that of the QW-containing layer 304 but rather remains on all or a portion of the transition waveguide 332. The contact layer 309b is a thin layer relative to the transition waveguide layer 332, and its impact on the optical properties of the transition waveguide 332 outside of the transition region 320 is not anticipated to be significant. In some embodiments, the contact layer 309b is patterned with the QW-containing layer 304, in other embodiments, layer 309b will be patterned independently of the QW-containing layer, and in yet other embodiments, the contact layer 309b will be patterned independently of the QW-containing layer 304 and the transition waveguide layer 332. And in yet other embodiments, the contact layer 309b is partially etched or patterned at multiple locations. And in some embodiments, the contact layer 309b is used as an etch stop layer or to trigger the optical endpoint during, for example, a plasma etch process or other patterning process.

In yet other embodiments, both horizontal and vertical tapering of the transition waveguide 332 is included to further reduce the potentially deleterious effects of the patterning of the QW-containing layer 304 and to facilitate transitioning of the optical signal 350 from the planar laser portion 310 through the transition region 320 to the transition waveguide portion 330 and the dilute waveguide portion 340 as described herein.

Referring to FIG. 3B, isometric views of an embodiment of the optical structure 300 are provided with section drawings to further illustrate key features. FIGS. 3B(i) and 3B(ii) show isometric views of the optical structure 300 from two different angles. (Note: Electrode layers 308a,308b are not shown in FIG. 3B(i).) The horizontal tapering of the ridge waveguide 306 and QW-containing layer 304 are clearly shown as are the approximate ranges of the various portions 310, 320, 330, 340 of the optical device structure 300.

In FIG. 3B(iii), FIG. 3B(iv), and FIG. 3B(v), section drawings are provided that illustrate embodiments of the relative positions of the various layers in the structure. In FIG. 3B(iii), the Section A-A' slice from FIG. 3B(ii) shows a section through the planar laser portion of the device structure. Dilute waveguide layer 342 is formed on substrate 360. Transition waveguide layer 332 is formed on dilute waveguide layer 342. In some embodiments, the substrate 360 is InP. In other embodiments, the substrate is GaAs. Heavily doped semiconductor contact layer 309b is formed on the transition waveguide layer 332. QW-containing layer 304 is formed on layer 309b. For the purposes of discussion herein, optional spacer layer 311 is not shown in the cross sections in FIG. 3B but rather is incorporated into the multilayered QW-containing layer 304. The ridge waveguide layer 306 and top contact layer 309a are formed on the QW-containing layer 304. The structure shown in FIG. 3B(iii) is shown after patterning of the ridge waveguide 306 and the top contact layer 309a. Electrode contact layers 308a and 308b are also shown.

Referring to FIGS. 3B(iv) and 3B(v), additional section drawings B-B' and C-C' from FIG. 3B(ii) are shown. FIG. 3B(iv) shows Section B-B' taken through the transition region 320, and illustrates the reduction in width of the dilute waveguide 342, the transition waveguide 332, and the contact layer 309b in the transition region relative to the widths of these layers in the planar laser portion 310 of the device structure 300. Additionally, in the embodiment shown, the layers above the contact layer 309b and the transition waveguide 332, namely, the QW-containing layer 304, the ridge waveguide 306, and the top contact layer 309a, are shown in the tapered portion 320 and the narrowing of these layers relative to the transition waveguide 332 is further illustrated. In other embodiments, the contact layer 309b is narrowed with the narrowing of the QW-containing layer 304, the ridge waveguide 306, and top contact layer 309a. And in yet other embodiments, the contact layer 309b is partially removed such that a portion of the layer 309b is patterned with the layers above and a portion of the layer 309b remains unpatterned. Layer 309b, in embodiments, is a thin, doped, epitaxial, alloy of the semiconductor layer of the transition waveguide 332, and as such, could remain after patterning in some embodiments. The thin contact layer 309b relative to the thicker transition waveguide 332 will generally not have a substantial impact on the optical properties of the transition waveguide 332 for optical signals that have reached the transition waveguide portion 330 of the device structure 300. The presence of dopants in contact layer 309b could affect the relative etch rates in comparison to other layers in the structure, a feature that can be exploited as an etch stop layer or to trigger optical endpoint during an etch process, among others. In FIG. 3B(v), the relative widths of the transition waveguide 332 with contact layer 309b, and the dilute waveguide are show for Section C-C' of FIG. 3B(ii).

Figure 4A:
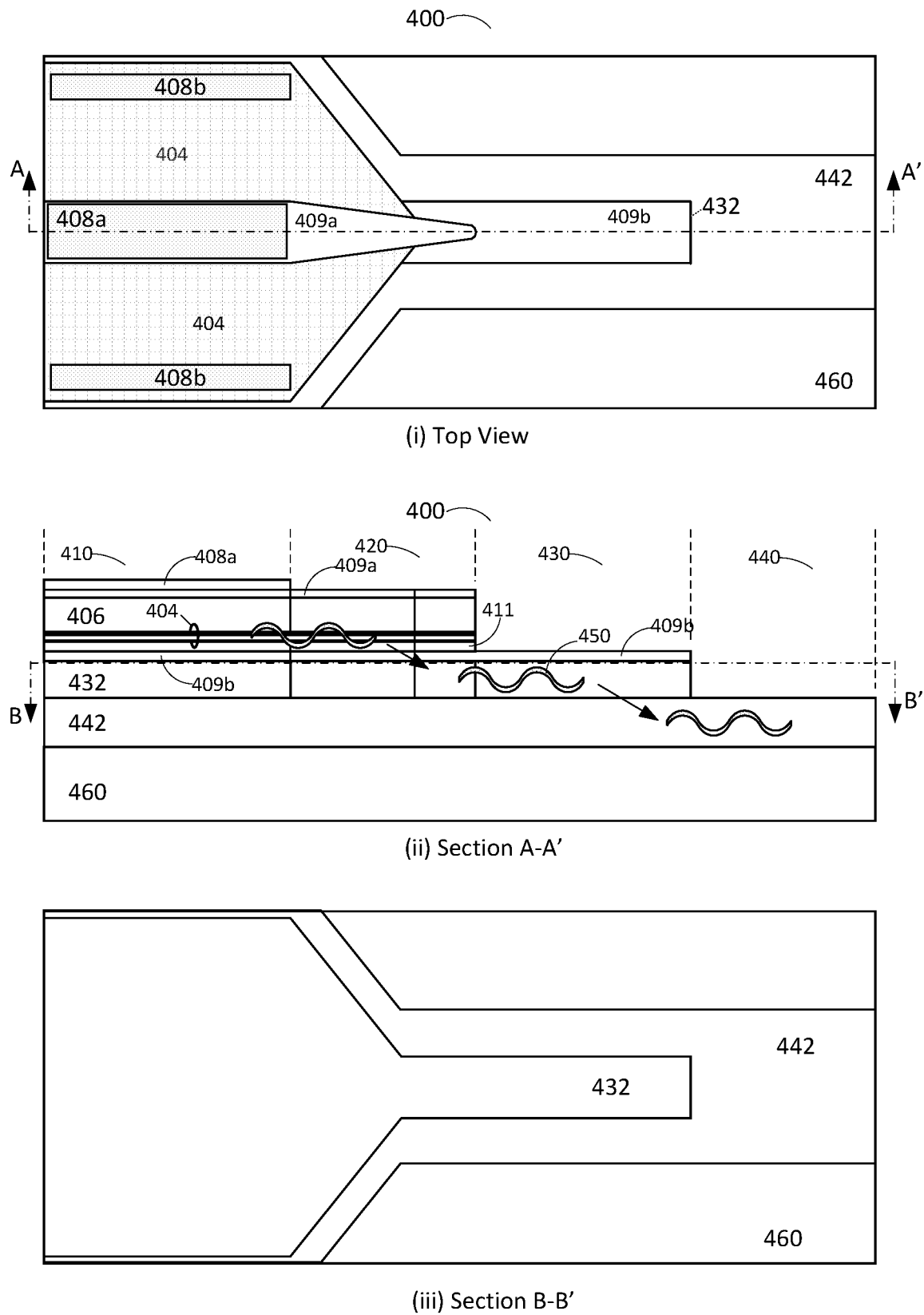
FIG. 4A. Embodiment of a planar laser with combined planar laser and waveguide that includes the modified QW-containing layer and the transition region: (i) Top view, (ii) Section A-A', and (iii) Section B-B'.

Referring to FIG. 4A, a drawing of an embodiment of the planar laser and waveguide structure 400 with additional horizontal tapering of the planar laser layers, relative to the tapering of these layers in FIGS. 3A and 3B, is shown. In the top view in FIG. 4A(i) and the Section A-A' view in FIG. 4A(ii), elements of the planar laser and waveguide structure 400 are shown that include the substrate 460, the dilute waveguide 442, and the transition waveguide 432. The planar laser portion 410 is formed substantially on portions of the transition waveguide 432 as illustrated in FIG. 4A and described herein. Planar laser portion 410 and transition region portion 420, in the embodiment 400, are formed on patterned transition layer 432. Patterned transition waveguide layer 432 is formed on patterned dilute waveguide layer 442. Also shown in FIG. 4A(i) and FIG. 4A(ii) are the top electrode layer 408a, the doped semiconductor contact layer 409, the ridge waveguide 406, the QW-containing layer 404, optional layer 411, and bottom heavily doped semiconductor contact layer 409b. Optical signal 450, depicted in FIG. 4A(ii), is provided in the figure to illustrate how an optical signal might traverse the device structure from left to right (as shown) during operation of the laser diode in the planar laser portion 410 of the device 400. Optical signal 450 is generated in the active layer of the laser diode as current is drawn through the device 410. Optical signal 450 originates substantially in the planar laser portion 410 with some protrusion of the optical signal generation into the transition region 420. Horizontal tapering of the QW-containing layer 404 in the transition region portion 420 promotes movement of the optical signal 450 from the QW-containing layer 404 to the underlying transition waveguide 432, and subsequently to the underlying dilute waveguide 442 as indicated as the signal moves through the device structure 400.

Section view B-B' of FIG. 4A(ii), shown in FIG. 4A(iii), shows a top down layout of the transition waveguide 432 on dilute waveguide 442 and a comparison with FIG. 4A(i) illustrates how the QW-containing layer 404 and the underlying contact layer 409b in the planar laser portion 410 is substantially coincident with the width of the transition waveguide 432 in the planar laser portion 410 and in the transition region portion 420. In the transition region portion 420, the horizontal tapering of both the transition waveguide 432 and the dilute waveguide 442 is shown.

Typical widths of the planar waveguides 432, 442 are in the range of 1-20 microns, and typically about 2-3 microns for the transition waveguide 432 and typically about 7-12 microns for the dilute waveguide 442, for commonly used wavelengths in the range of 800 nm to 2 microns. The transition waveguide 432 can extend tens to hundreds of microns beyond the transition region portion 420 in the direction of the optical signal propagation (to the right in the FIG. 4A) and the dilute waveguide 442 can extend tens to thousands of microns, or more, as in embodiments in which the structure 400 is used to form a discrete device, or in embodiments in which the dilute waveguide 442 is extended such that this waveguide 442 connects device 400 to one or more other devices in a photonic circuit.

Figure 4B:
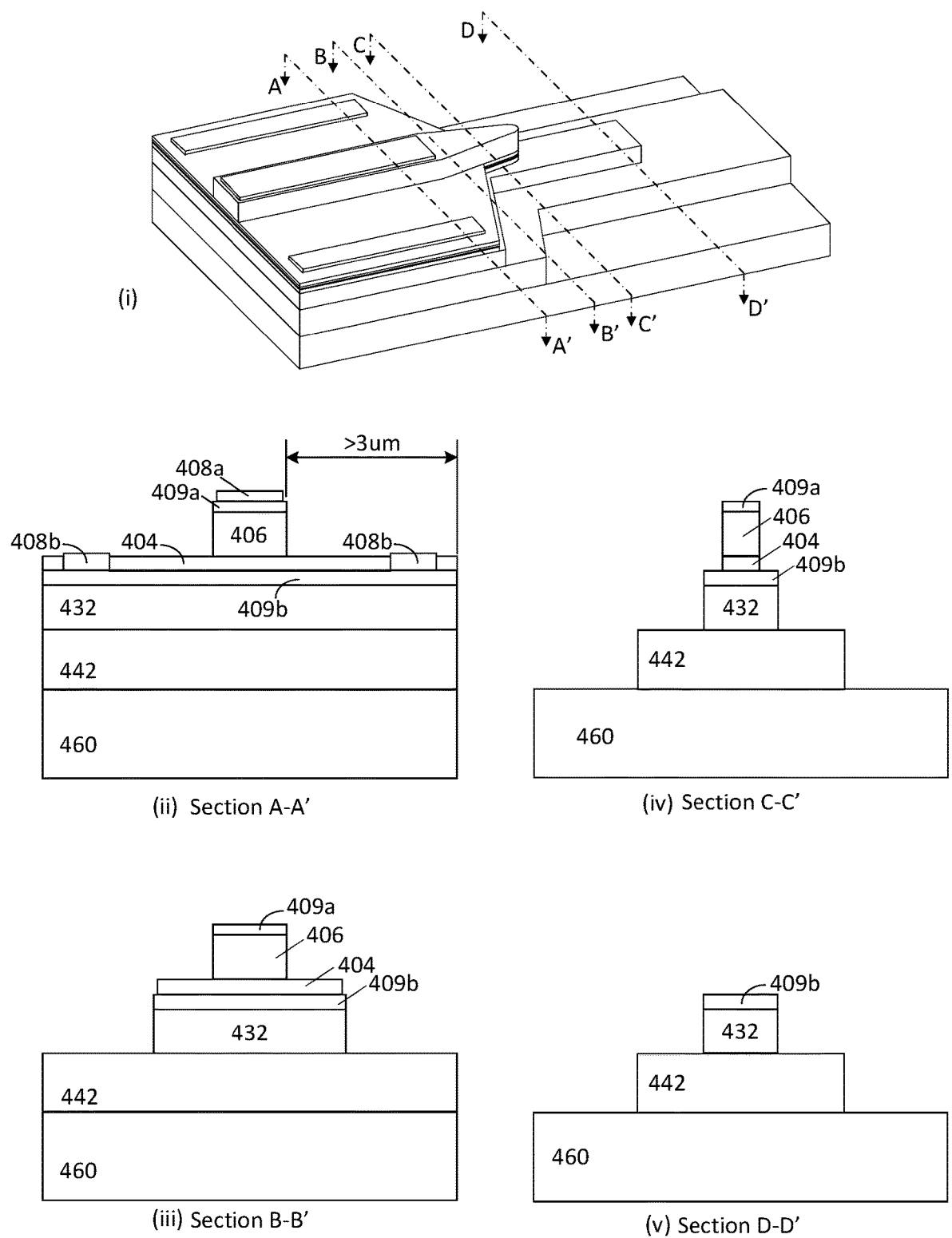
FIG. 4B. Embodiment of a planar laser combined planar laser and waveguide that include the modified QW-containing layer and the transition region: (i) Isometric view, (ii) Section A-A', (iii) Section B-B', (iv) Section C-C', and (v) Section D-D'.

Referring to FIG. 4B(i), the features of the device structure 400 are further illustrated in the isometric perspective drawing shown. Section drawings from this isometric illustration are provided in FIGS. 4B(ii) to 4B(v). Section A-A', taken through the planar laser portion 410 of device structure 400 is provided in FIG. 4B(ii) and shows planar waveguide structure that includes the transition waveguide layer 432 and dilute waveguide layer 442 on substrate 460. In the embodiment illustrated in FIG. 4, the planar waveguides 432, 442 are present below the planar laser layers in the planar laser portion 410 and the transition region 420 as shown. These planar laser layers include the bottom contact layer 409b and QW-containing layer 404, which are shown in the embodiment to extend the full lateral width of the transition waveguide 432 below. In other embodiments, the width of the layer 409b and 404 are not aligned with the transition waveguide layer 432. A key feature of these layers, however, is the lateral extension of the QW-containing layer 404, to a distance of 3 microns or more, such that potentially deleterious effects from the patterning of the QW-containing layer 404 on device performance are reduced, minimized, or eliminated, relative to devices without the lateral extension. The ridge waveguide 406 is shown above the QW-containing layer 404 with top contact layer 409a. Optional layer 411 is not shown in FIG. 4B but may be included in QW-containing layer 404. Electrode contact layers 408a and 408b, typically metal layers or metal alloys, are also shown in FIG. 4B(ii).

Section B-B' and Section C-C' are taken through the transition region portion 420 of the device structure 400. In FIG. 4B(iii), Section B-B' shows a narrowing of the transition waveguide layer 432 and the contact layer 409b, as well as a narrowing of the semiconductor layers above that include the QW-containing layer 404, the ridge waveguide layer 406, and the contact layers 409a. In the embodiment shown in FIGS. 4A and 4B, electrode layer 408a is not shown to extend into the transition region 420. In other embodiments, the electrode layer 408a may extend into the transition region 420. In the embodiment in FIGS. 4A and 4B, the transition waveguide 432 is also substantially narrower than the width of the portion of the transition waveguide 432 that resides below the planar laser portion 410. Section C-C' shown in FIG. 4B(iv) illustrates the further narrowing in width of the various layers in the device structure 400 relative to the widths of these layers in Section B-B'. It is important to note that in some embodiments, the narrowing can be gradual, and can extend over tens to hundreds of microns or more. The underlying dilute waveguide 442 and the transition waveguide 432 are shown in the embodiment in Section C-C' of FIG. 4B(i) to have reached a constant thickness for the purpose of illustrating the key elements of this and similar embodiments. The QW-containing layer 404, the ridge waveguide 406, and the semiconductor contact layer 409a are further narrowed in Section C-C', relative to the widths of these layers in Section B-B' to further illustrate how the horizontal tapering of these layers affects the individual relative widths of these layers.

In FIG. 4B(v), Section D-D' of FIG. 4B(i) is shows a cross section from the transition waveguide portion 430 and illustrates the planar waveguide layers 432,442 on substrate 460 of device structure 400. At the interface between the transition waveguide portion 430 and the dilute waveguide portion 440 of the embodiment shown in FIGS. 4A and 4B, the transition waveguide 432 is terminated. It is important to note that the elements shown in FIGS. 4A and 4B are those that demonstrate the structure and functionality of the device structure for the embodiment shown. Other layers, such as encapsulation layers and composite layers for one or more of the layers described herein may be included in other embodiments.

Figure 5A:
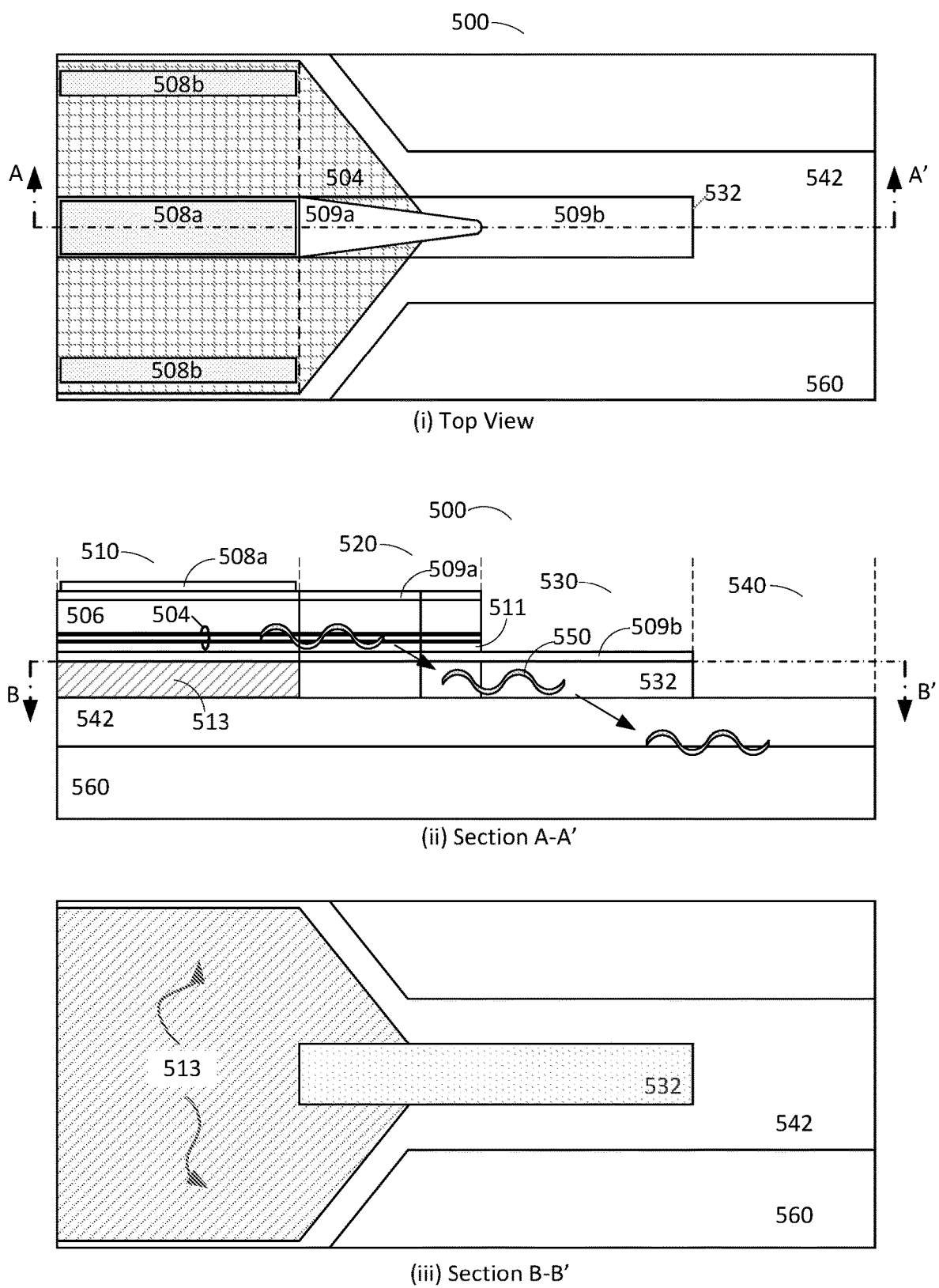
FIG. 5A. Embodiment of a planar laser with combined planar laser and waveguide that includes the modified QW-containing layer and the transition region: (i) Top view, (ii) Section A-A', and (iii) Section B-B'.

Referring to FIG. 5A, a drawing of an embodiment of the planar laser and waveguide structure 500 with horizontal tapering of the planar laser layers is shown. In this and some other embodiments, a fill layer is used in place of the transition waveguide in some portions of the device structure 500. In the top view in FIG. 5A(i) and the Section A-A' view in FIG. 5A(ii), elements of an embodiment of the planar laser and waveguide structure 500 are shown that include the substrate 560, the dilute waveguide 542, the transition waveguide 532, and fill layer 513. In this embodiment, the planar laser portion 510 is formed substantially on fill layer 513. In comparison to the embodiment shown in FIGS. 4A and 4B, a fill layer 513 occupies a portion of the transition waveguide 432 that resides below the planar laser of the planar laser portion 410 of the device structure 400. In the embodiment shown in FIG. 5A(iii), the volume that had been occupied by the transition waveguide in the planar laser portion 410, is occupied with fill layer 513 in planar laser portion 510 of device structure 500. Replacement of the material of the transition waveguide 432 of the embodiment shown in FIGS. 4A and 4B, with a material with a lower index of refraction, for example, allows for a reduction in the tendency for light to be reflected into the optical cavity formed with the transition waveguide 432. The embodiment of the device structure 500 with fill layer 513 shows a rectangularly shaped transition waveguide 532 terminating at the interface between the planar laser portion 510 and the transition region portion 520 as shown in the top down view of Section B-B' in FIG. 5A(iii). Alternatively, in other embodiments, other shapes and variations in the shapes of the transition waveguide 532 can be used and remain within the scope of embodiments of the device structure 500. Additionally, in some embodiments, some encroachment of the transition waveguide into the planar laser portion 510 remains within the scope of the invention.

As shown in FIG. 5A(ii), the planar laser layers of the device structure 500, are formed on the patterned fill layer 513 in planar laser portion 510 and both the planar laser layers and the fill layer further extend into the transition region portion 530. The fill layer 513 and transition waveguide 532 are formed on dilute waveguide layer 542. Also shown in FIG. 5A(i) and FIG. 5A(ii) are the top electrode layer 508a, the contact layer 509a, the ridge waveguide 506, the QW-containing layer 504, optional layer 511, and bottom contact layer 509b. Optical signal 550, depicted in FIG. 5A(ii), is provided in the figure to illustrate how an optical signal might traverse the device structure from left to right (as shown) during operation of the laser diode of the planar laser portion 510 of the device 500. Optical signal 550 is present during operation of the device and originates substantially in the planar laser portion 510 with some protrusion of the optical signal generation anticipated in the transition region 520. Horizontal tapering of the QW-containing layer 504 in the transition region portion 520 promotes movement of the optical signal 550 from the QW-containing layer 504 to the underlying transition waveguide 532, and subsequently to the underlying dilute waveguide 542 as indicated as the signal moves through the device structure 500. Fill layer 513 is formed from a material with a lower index of refraction than that of the transition waveguide 532.

Figure 5B:
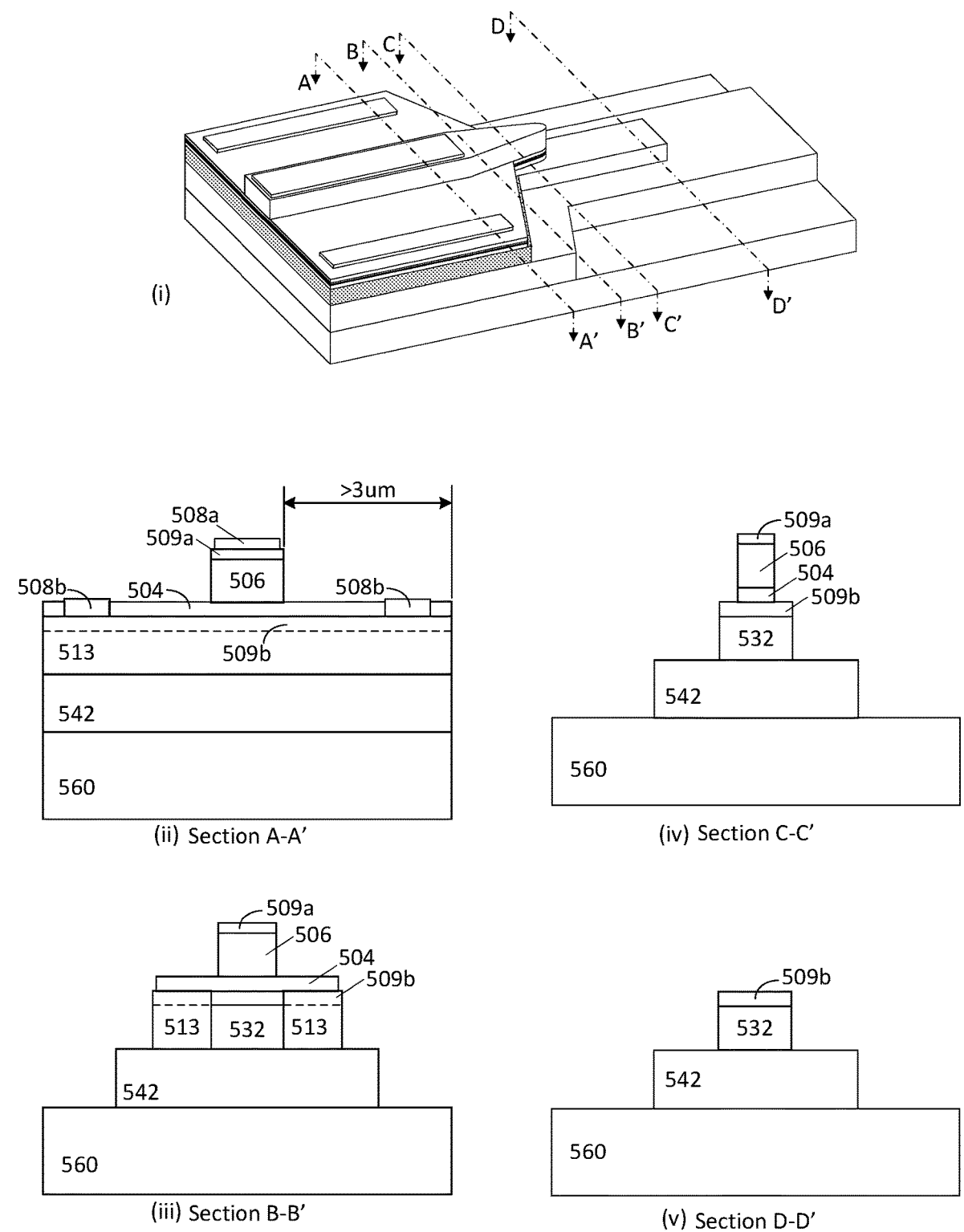
FIG. 5B. Embodiment of a planar laser with combined planar laser and waveguide that includes the modified QW-containing layer and the transition region: (i) Isometric view, (ii) Section A-A', (iii) Section B-B', (iv) Section C-C', and (v) Section D-D'.

Referring to FIG. 5A(iii) that shows Section view B-B' of FIG. 5B(ii), a top-down layout of the fill layer 513 and the transition waveguide 532 on the dilute waveguide 542 illustrates how the QW-containing layer 504 and the underlying contact layer 509b are substantially coincident with the width of the fill layer 513 in the planar laser portion 510 and with the fill layer 513 and a portion of the transition waveguide layer 532 in transition region portion 520 when compared to FIG. 5A(i). In the transition region portion 520, both the fill layer 513 and the dilute waveguide layer 542 are shown with horizontal tapering. The width of these layers 513, 542 are reduced to facilitate the formation of preferred optical propagation modes for optical signals 550 emitted from the planar laser in planar laser portion 510. Typical widths of the planar waveguides 532, 542 are in the range of 1-20 microns, and typically about 2-3 microns for the transition waveguide 532 and typically about 7-12 microns for the dilute waveguide 542, for commonly used wavelengths in the range of 800 nm to 2 microns. The transition waveguide 532 can extend tens to hundreds of microns beyond the transition region portion 520 in the direction of the optical signal propagation (to the right in the FIGS. 5A and 5B) and the dilute waveguide 542 can extend tens to thousands of microns, in embodiments, for example, in which the structure 500 is used to form a discrete device, or for which the dilute waveguide 542 is further extended such that waveguide 542 is used to connect device 500 to one or more other devices in a photonic circuit. Although vertical tapering of the transition waveguide is included in some embodiments, the fill layer 513 in the embodiment shown in FIGS. 5A and 5B provides lateral continuity to the transition waveguide layer 532 without the requirement for vertical tapering of this layer.

Referring to FIG. 5B(i), the features of the device structure 500 are further illustrated in the isometric perspective drawing shown. Section drawings from this isometric illustration are provided in FIGS. 5B(ii) to 5B(v). Section A-A', taken through the planar laser portion 510 of device structure 500 is provided in FIG. 5B(ii) and shows the planar laser film structure and the underlying fill and waveguide structure that includes the fill layer 513 and dilute waveguide layer 542 on substrate 560. In the embodiment illustrated in FIGS. 5A and 5B, the fill layer 513 and the dilute waveguide layer 542 are present below the planar laser films 504,509b in the planar laser portion 510 of device structure 500 as shown. Bottom contact layer 509b and QW-containing layer 504 are shown in the embodiment to extend the full lateral width of the fill layer 513. In other embodiments, the width of the layers 504,509b are not aligned with the lateral edges of the fill layer 513. The lateral extension of these layers 504,509b to a distance of 3 microns or more, is shown in FIG. 5B(ii). Deleterious effects from the patterning of the QW-containing layer 504 on device performance are reduced, minimized, or eliminated with this lateral extension of the QW-containing layer 504. Contact layer 509b, in some embodiments, is epitaxially grown on fill layer 513. The ridge waveguide 506 is shown above the QW-containing layer 504 with top contact layer 509a. Electrode contact layers 508a and 508b, typically metal layers or metal alloys, are also shown in FIG. 5B(ii).

Section B-B' and Section C-C', shown in FIGS. 5B(iii) and 5B(iv), respectively, are taken through the transition region portion 520 of the device structure 500. A comparison of Section B-B' of FIG. 5B(iii) with Section A-A' of FIG. 5B(ii) shows the narrowing in width of the layer with fill layer portions 513 and transition waveguide layer portion 532. Further comparison of these two figures with Section C-C' of FIG. 5B(iv) shows only the transition waveguide layer 532 in this layer. The dilute waveguide layer 542 is also narrower in Section B-B' of FIG. 5B(iii) relative to the width of the dilute waveguide layer 542 shown in Section A-A' of FIG. 5B(ii).

In the transition region portion 520 of the structure 500, the layer above the dilute waveguide 542 is occupied by both the fill layer 513 and the transition waveguide 532. The contact layer 509b, in some embodiments, is an epitaxially grown layer that is formed on the transition waveguide layer 532 and the fill layer 513, and in some embodiments, the width of the contact layer 509b is maintained with the combined width of the fill layer 513 and the transition waveguide 532. The contact layer 509b is preferably formed epitaxially over transition waveguide 532 and a suitable fill layer 513. The semiconductor layers above the bottom contact layer 509b that include the QW-containing layer 504, the ridge waveguide layer 506, and the top contact layer 509a narrow in width as a result of the horizontal tapering of these layers in the transition region portion 520 as shown in Section B-B' in FIG. 5B(iii) and further illustrated in Section C-C' of FIG. 5B(iv). In the embodiment shown in FIGS. 5A and 5B, electrode layer 508a is not shown to extend into the transition region 520. In other embodiments, the electrode layer 508a extends into the transition region 520. In the embodiment in FIGS. 5A and 5B, the transition waveguide 532 is also substantially narrower than the width of the portion of the fill layer 513 that resides below the planar laser portion 510 as shown in FIG. 5B(iii). Section C-C' shown in FIG. 5B(iv) illustrates the further narrowing in width of the various layers in the device structure 500 relative to the widths of these layers in Section B-B' shown in FIG. 5B(iii). It is important to note that in some embodiments, the narrowing can be gradual, and can extend over tens to hundreds of microns or more. The underlying dilute waveguide 542 and the transition waveguide 532 are shown in the embodiment in Section C-C' to have reached a constant thickness for the purpose of illustrating the key elements of this and similar embodiments. The QW-containing layer 504, the ridge waveguide 506, and the semiconductor contact layer 509a are further narrowed in Section C-C', as shown in FIG. 5B(iv), relative to the widths of these layers in Section B-B', as shown in FIG. 5B(iii), to further illustrate how the horizontal tapering of these layers effects the individual relative widths of these layers.

In FIG. 5B(v), Section D-D' of FIG. 5B(i) shows the transition waveguide layer 532 and the dilute waveguide layer 542 in the transition waveguide portion 530 of structure 500. At, or near the interface between device portion 530 and device portion 540, the transition waveguide 532 is terminated. It is important to note that the elements shown in FIGS. 5A and 5B are provided to illustrate features and functionality of the device structure 500 for the embodiment shown. Other layers, such as encapsulation layers and composite layers for one or more of the layers described may be included in other embodiments.

Figure 6A:
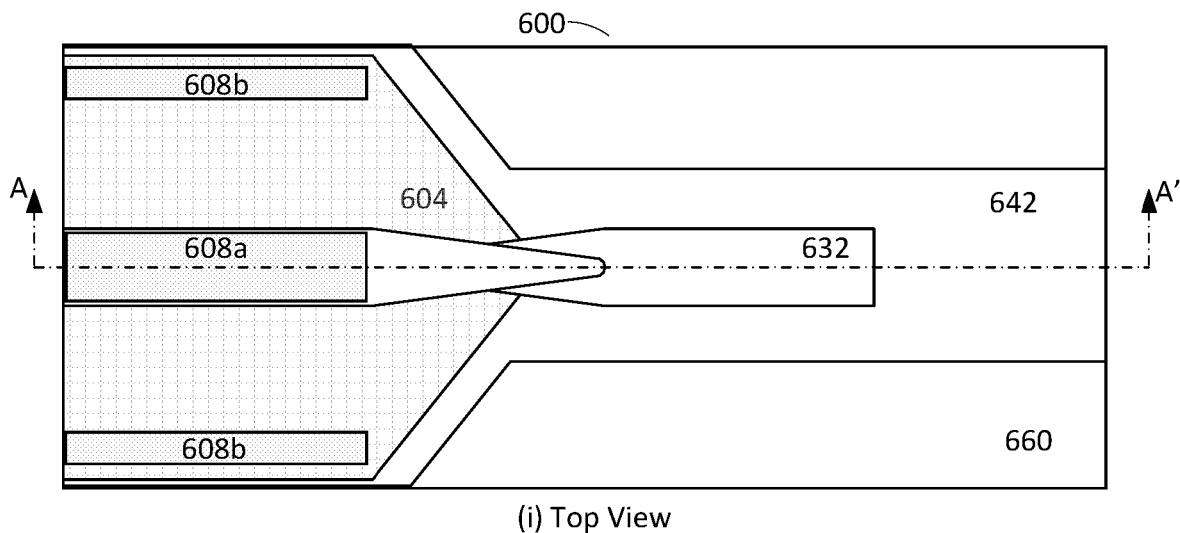
FIG. 6A. Embodiment of a planar laser with combined planar laser and waveguide that includes the modified QW-containing layer and the transition region: (i) Top view, (ii) Section A-A', and (iii) Section B-B'.
Figure 6A:
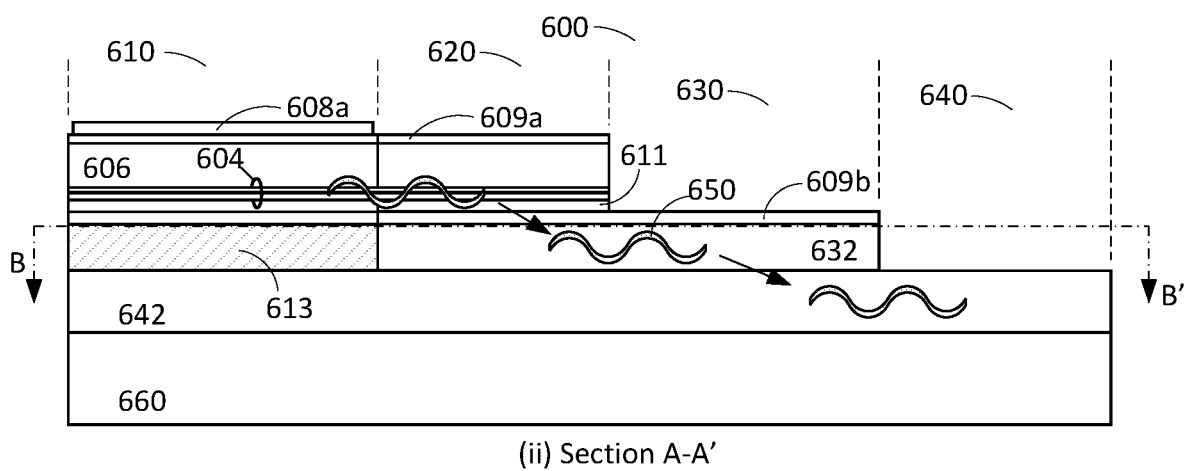
Figure 6A:
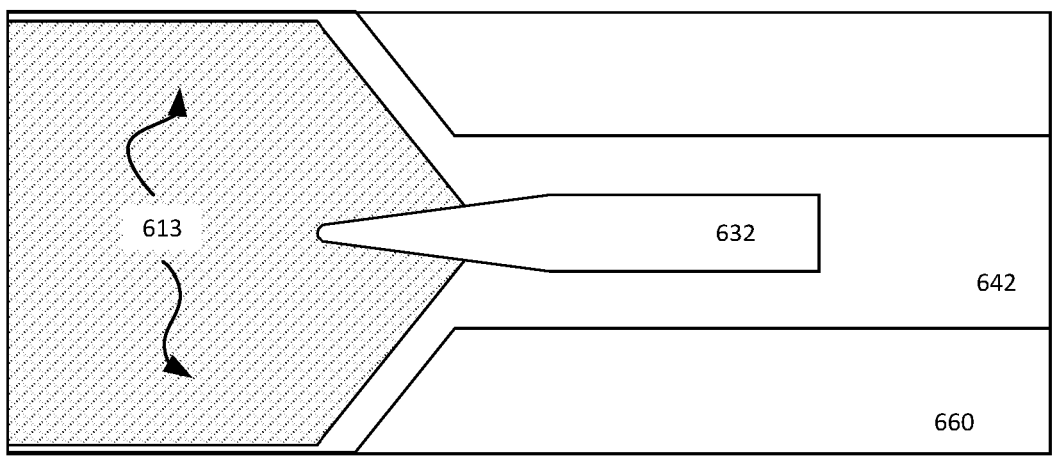

Referring to FIG. 6A, a drawing of an embodiment of the planar laser and waveguide structure 600 with horizontal tapering of the planar laser layers and the transition waveguide layer 632 is shown. In this and some other embodiments, a fill layer is used in place of the transition waveguide in some portions of the device structure 600. In the top view in FIG. 6A(i) and the Section A-A' view in FIG. 6A(ii), elements of an embodiment of the planar laser and waveguide structure 600 are shown that include the substrate 660, the dilute waveguide 642, the transition waveguide 632, and fill layer 613. In this embodiment, the planar laser portion 610 is formed substantially on fill layer 613. A portion of the fill layer 613 extends from the planar laser portion 610 into the transition region portion 620 to accommodate the shape of the transition waveguide 632. In the transition region portion 620, the semiconductor contact layer 609b, and the layers above the layer 609a that include the QW-containing layer 604, optional layer 611, ridge waveguide layer 604, and upper contact layer 609a, are formed both on a portion of the fill layer 613 and a portion of the transition waveguide layer 632 in this embodiment as illustrated in FIG. 6A and described herein.

As shown in FIGS. 5A and 5B, fill layer 513 occupies the portion of the transition waveguide layer volume that resides below the planar laser of the planar laser portion 510 of the device structure 500. Similarly, fill layer 613 of device structure 600 shown in FIG. 6A occupies the portion of the transition waveguide layer volume that resides below the planar laser portion 610 and extends into the transition region portion 620 of device 600. Unlike the transition waveguide in the embodiment shown in FIGS. 5A and 5B, however, the transition waveguide is horizontally tapered for the device structure 600 shown in the embodiment in FIG. 6A. In Section B-B' in FIG. 6A(iii), the transition waveguide 632 is shown to narrow in width closest to the planar laser portion 610 and to widen with increasing distance from the planar laser portion 610, further increasing through the transition region portion 620 until reaching the width of the transition waveguide 632 in the transition waveguide portion 630. Replacement of the material of the transition waveguide 432 of the embodiment shown in FIGS. 4A and 4B, with a material with a lower index of refraction, for example, in the fill layer 613 shown in FIG. 6A, further allows for a reduction in the tendency for light to be reflected into the optical cavity formed with the transition waveguide 432. Horizontal tapering of the transition waveguide layer 632 in the direction of the optical signal propagation, in combination with the replacement of the high index of refraction material with a fill layer material of lower index of refraction, promotes movement of the optical signal from the laser generation portion of the planar laser portion 610, through the transition region portion 620, and into the transition waveguide portion 630. An embodiment of the transition region portion 630 is shown in FIG. 6A that is narrower in shape in closest proximity to the planar laser portion 610 of the device structure 600 and widens in the direction of propagation of the optical signal 650. In other embodiments, other shapes and variations in the shape of the transition waveguide can be used and remain within the scope of embodiments of the device structure 600. Additionally, in some embodiments, encroachment of the transition waveguide into the planar laser portion 610 to facilitate formation of the device structure, or to facilitate optical signal transfer remains within the scope of the invention. Examples of other transition waveguide shapes and configurations are described herein.

As shown in FIG. 6A(ii), the planar laser layers of the device structure 600, are formed on the patterned fill layer 613 in planar laser portion 610 and both the planar laser layers and the fill layer 613 further extend into the transition region portion 630. The fill layer 613 and the transition waveguide layer 632 are formed on patterned dilute waveguide layer 642. Also shown in FIG. 6A(i) and FIG. 6A(ii) are the top electrode layer 608a, the contact layer 609a, the ridge waveguide 606, the QW-containing layer 604, optional layer 611, and bottom contact layer 609b. Optical signal 650, depicted in FIG. 6A(ii), is provided in the figure to illustrate how an optical signal might traverse the device structure from left to right (as shown) during operation of the laser diode of the planar laser portion 610 of the device 600. Optical signal 650 is present during operation of the device and originates substantially in the planar laser portion 610 with some protrusion of the optical signal generation anticipated into the transition region 620. Horizontal tapering of the QW-containing layer 604 in the transition region portion 620 promotes movement of the optical signal 650 from the horizontally tapered QW-containing layer 604 to the underlying transition waveguide 632, also horizontally tapered, as shown as the signal moves through the device structure 600. Although both tapered, it is important to note that in the embodiment shown in FIG. 6A, the horizontal tapering of the QW-containing layer 604 is such that the width of this layer 604 narrows along the path of the optical signal 650, and conversely, the horizontal tapering of the transition waveguide 632 is such that the width of this layer 632 widens along the path of the optical signal. Fill layer 613, in some embodiments, is formed from a material with a lower index of refraction than that of the transition waveguide 632 to promote movement of the optical signal 650 into the transition waveguide 632 having a higher index of refraction. Furthermore, horizontal tapering of the transition waveguide 632 further facilitates propagation of the optical signal 650 into the transition waveguide 632 and reduces the likelihood for reflection of the optical signal 650 into the volume occupied by the fill layer 613.

Referring to FIG. 6A(iii) that shows Section view B-B' of FIG. 6A(ii), a top-down layout of the fill layer 613 and the transition waveguide 632 on the dilute waveguide 642 illustrates how the QW-containing layer 604 and the underlying contact layer 609b are substantially coincident with the width of the fill layer 613 in the planar laser portion 610 and with the fill layer 613 and a portion of the transition waveguide layer 632 in transition region portion 620 when compared to FIG. 6A(i). In the transition region portion 620, both the fill layer 613 and the dilute waveguide 642 are shown with horizontal tapering in which the width of these layers is significantly reduced to facilitate the formation of preferred optical propagation modes for optical signals 650 emitted from the planar laser in planar laser portion 610. Typical widths of the planar waveguides 632, 642 are in the range of 1-20 microns, and typically about 2-3 microns for the transition waveguide 632 and typically about 7-12 microns for the dilute waveguide 642, for commonly used wavelengths in the range of 800 nm to 2 microns. The transition waveguide 632 can extend tens to hundreds of microns beyond the transition region portion 620 in the direction of the optical signal propagation (to the right in the FIGS. 4-6) and the dilute waveguide 642 can extend tens to thousands of microns, in embodiments, for example, in applications for which the structure 600 is used to form a discrete device. In embodiments for which the dilute waveguide 642 is used to connect device 600 to one or more additional devices in a photonic circuit, the dilute waveguide 642 can extend many millimeters or more. The fill layer 613 in the embodiment shown in FIG. 6 provides lateral continuity to the transition waveguide layer 632 and provides the substrate upon which the layers 609b, 611, 604, 606, 609a, 608a above are formed.

Figure 6B:
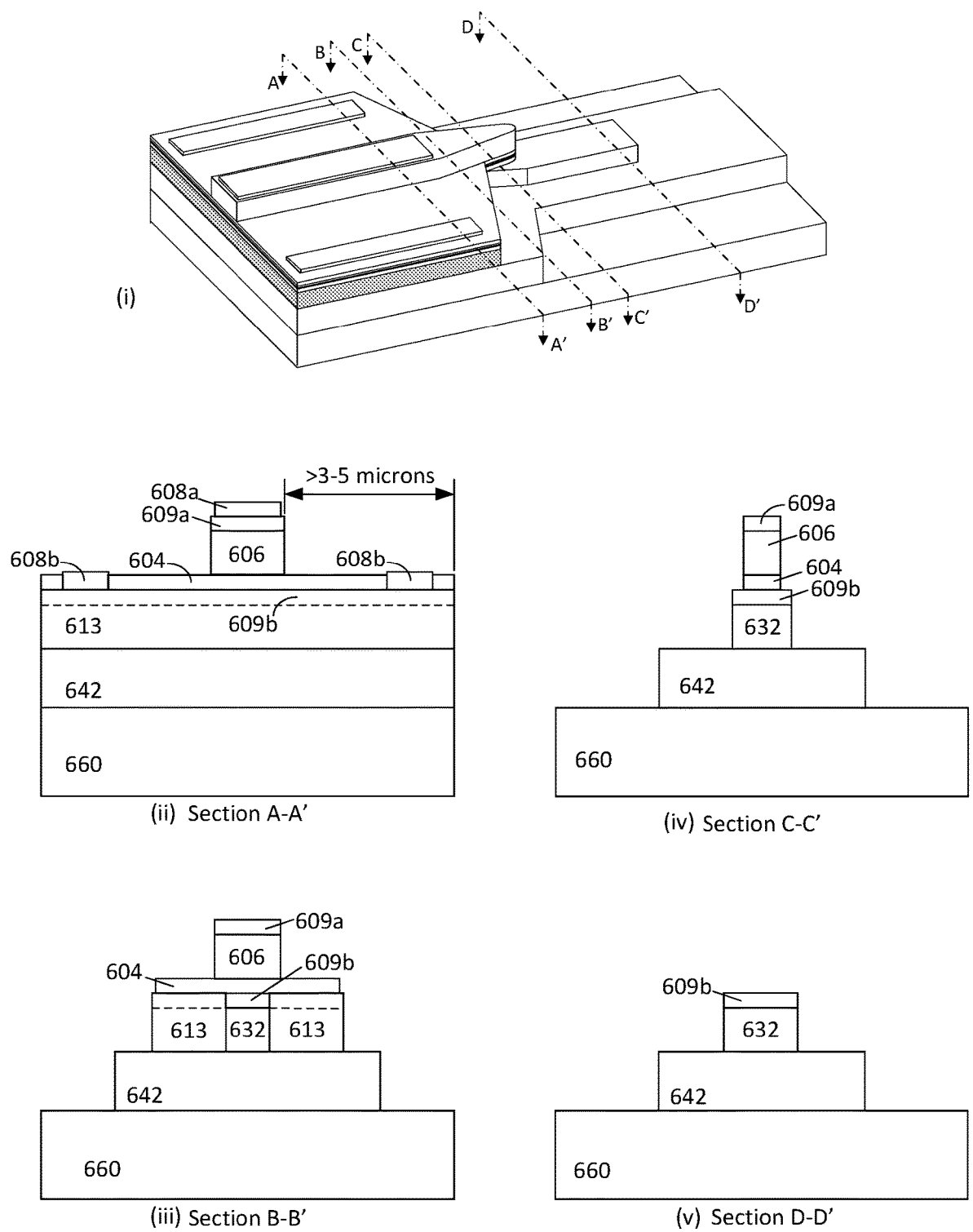
FIG. 6B. Embodiment of a planar laser with combined planar laser and waveguide that includes the modified QW-containing layer and the transition region: (i) Isometric view, (ii) Section A-A', (iii) Section B-B', (iv) Section C-C', and (v) Section D-D'.

Referring to FIG. 6B(i), the features of the device structure 600 are further illustrated in the isometric perspective drawing shown. Section drawings from this isometric illustration are provided in FIGS. 6B(ii) to 6B(v). Section A-A', taken through the planar laser portion 610 of device structure 600 is provided in FIG. 6B(ii) and shows the planar waveguide structure that includes the fill layer 613 and dilute waveguide layer 642 on substrate 660. In the embodiment illustrated in FIGS. 6A and 6B, the fill layer 613 and the planar dilute waveguide 642 are present below the planar laser films 604,609b in the planar laser portion 610 of the device structure 600 as shown. Bottom contact layer 609b and QW-containing layer 604 are shown in the embodiment to extend the full lateral width of the fill layer 613 below. In other embodiments, the width of layer 609b and layer 604 are not aligned with the lateral edges of the fill layer 613. The lateral extension of the QW-containing layer 604, to a distance of 3 microns or more from the edge of the ridge waveguide 606, is shown in FIG. 6B(ii). Deleterious effects from the patterning of the QW-containing layer 604 on device performance are reduced, minimized, or eliminated with the lateral extension of the QW-containing layer 604. Contact layer 609b, in some embodiments, is epitaxially grown on fill layer 613. The ridge waveguide 606 is shown above the QW-containing layer 604 with top contact layer 609a. Electrode contact layers 608a and 608b, typically metal layers or metal alloys, are also shown in FIG. 6B(ii).

Section B-B' and Section C-C', shown in FIGS. 6B(iii) and 6B(iv), respectively, are taken through the transition region portion 620 of the device structure 600. A comparison of Section B-B' of FIG. 6B(iii) with Section A-A' of FIG. 6B(ii) shows the narrowing in width of the layer with fill layer portions 613 and transition waveguide layer portion 632. Further comparison of these two figures with Section C-C' of FIG. 6B(iv) shows only the transition waveguide layer 632 in this layer. The dilute waveguide layer 642 is also narrower in Section B-B' of FIG. 6B(iii) relative to the width of the dilute waveguide layer 642 shown in Section A-A' of FIG. 6B(ii).

In the transition region portion 620 of the structure 600, the layer above the dilute waveguide 642 is occupied with a portion of the fill layer 613 and a portion of the transition waveguide 632. The contact layer 609b, in some embodiments, is an epitaxially grown layer that is formed on the transition waveguide 632 and the fill layer, and although not required, the alignment of the widths of the transition waveguide layer 632 and the contact layer 609b are typically maintained with the combined width of the fill layer 613 and the transition waveguide 632 through the formation of the device structure 600. The contact layer 609b is preferably formed epitaxially over transition waveguide 632 and a suitable fill layer 613. The semiconductor layers above the bottom contact layer 609b that include the QW-containing layer 604, the ridge waveguide layer 606, and the contact layer 609a narrow in width as a result of the horizontal tapering of these layers in the transition region portion 620 as shown in Section B-B' in FIG. 6B(iii). The narrowing in width of these layers 609a, 606, and 604, and the widening of the transition waveguide layer 632 is further illustrated in Section C-C' of FIG. 6B(iv). In the embodiment shown in FIG. 6, electrode layer 608a is not shown to extend into the transition region 620. In other embodiments, the electrode layer 608a extends into the transition region 620. In the embodiment in FIGS. 6A and 6B, the transition waveguide 632 is substantially narrower than the width of the portion of the fill layer 613 that resides below the planar laser portion 610. Section C-C', shown in FIG. 6B(iv), illustrates the widening of the transition waveguide layer 632 and contact layer 609b in the transition region portion 620 and the further narrowing in width of the various layers above the contact layer 609b that include the QW-containing layer 604, the ridge waveguide 606, and the top contact layer 609a in the device structure 600 relative to the widths of these layers in Section B-B' shown in FIG. 6B(iii). It is important to note that in some embodiments, the widening of the horizontally tapered transition waveguide 632 and the narrowing of the layers that include the QW-containing layer 604, the ridge waveguide 606, and the top contact layer 609a can be gradual, and can extend over tens to hundreds of microns or more. The underlying dilute waveguide 642 and the transition waveguide 632 are shown in the embodiment in Section C-C' to have reached a constant thickness for the purpose of illustrating the key elements of this and similar embodiments.

In FIG. 6B(v), Section D-D' of FIG. 6B(i) shows the transition waveguide layer 632 and the dilute waveguide layer 642 in the transition waveguide portion 630 of structure 600. At, or near the interface between device portion 630 and device portion 640, the transition waveguide 632 is terminated. It is important to note that the elements shown in FIGS. 6A and 6B are provided to illustrate features and functionality of the device structure 600 for the embodiment shown. Other layers, such as encapsulation layers and composite layers for one or more of the layers described may be included in other embodiments Referring to FIG. 7A, a drawing of an embodiment of the planar laser and waveguide structure 700 with horizontal tapering of the planar laser layers and vertical tapering of the transition waveguide 732 is shown. In the top view in FIG. 7A(i) and the Section A-A' view in FIG. 7A(ii), elements of the planar laser and waveguide structure 700 are shown that include the substrate 760, the dilute waveguide 742, and the transition waveguide 732. In the embodiment shown in FIG. 7A, planar laser portion 710 is formed on dilute waveguide 742. The rectangularly shaped transition waveguide 732 (viewed from top down) extends from the interface between this planar laser portion 710 and the transition region portion 720, through the length of the transition region portion 720 and the transition waveguide portion 730 to the interface between the transition waveguide portion 730 and the dilute waveguide portion 740. The transition waveguide layer 732 in this embodiment, is vertically tapered as shown in the cross-sectional view of Section A-A' in FIG. 7A(ii) in the transition region portion 720. Vertical tapering is the inclusion of a vertical slope in all or a portion of an element, and in the case of the embodiment shown in FIG. 7A, the transition waveguide 732 has a sloped portion as shown in the transition region portion 720. A vertical slope is defined herein as a change in elevation moving in the direction perpendicular to the plane of the substrate surface as shown, for example, in the cross section in Section A-A' of FIG. 7A(ii). The slope, or change in elevation, of transition waveguide layer 732, is shown in FIG. 7A(ii).

In the transition region portion 720, the semiconductor layers that include the bottom contact layer 709b, layer 711, the QW-containing layer 704, the ridge waveguide 706, and the top contact layer 709a, further extend from the planar laser portion 710 into the transition region portion 720 and substantially follow the contour of the underlying, vertically-tapered, transition waveguide 732. These layers 709b, 704, 711, 704, and 709a are formed both on the vertically tapered portion of the rectangularly shaped transition waveguide 732 in the embodiment, and extend over the adjacent areas of the dilute waveguide 742 as shown in FIG. 7B(i).

In embodiment 700, and in similar embodiments in which the planar waveguide portion of the device structure 700 is formed on the dilute waveguide 742, the fabrication process is simplified in some ways relative to embodiments with a fill layer below the planar laser. Elimination of the fill layer 513, 613 simplifies the structure in that the layers in the structure can all be formed using variations of the conventional epitaxial films of InP, for example. The vertically tapered portion of the transition waveguide layer 732, or variations of the structure as described herein, can be formed using gray scale lithography or aspect ratio dependent etching or deposition processing, among other techniques. It is important to note that although the fill layer, as described in device structure 500 and device structure 600, is not present in the device structure 700, other layers not shown in the structure can be added and remain within the scope of the current invention. Layers, such as optional layer 711 that provide lattice matching in epitaxially grown device structures, for example, or layers with favorable optical properties can be added to the structure between the transition waveguide 742 and the QW-containing layer 704.

Figure 7A:
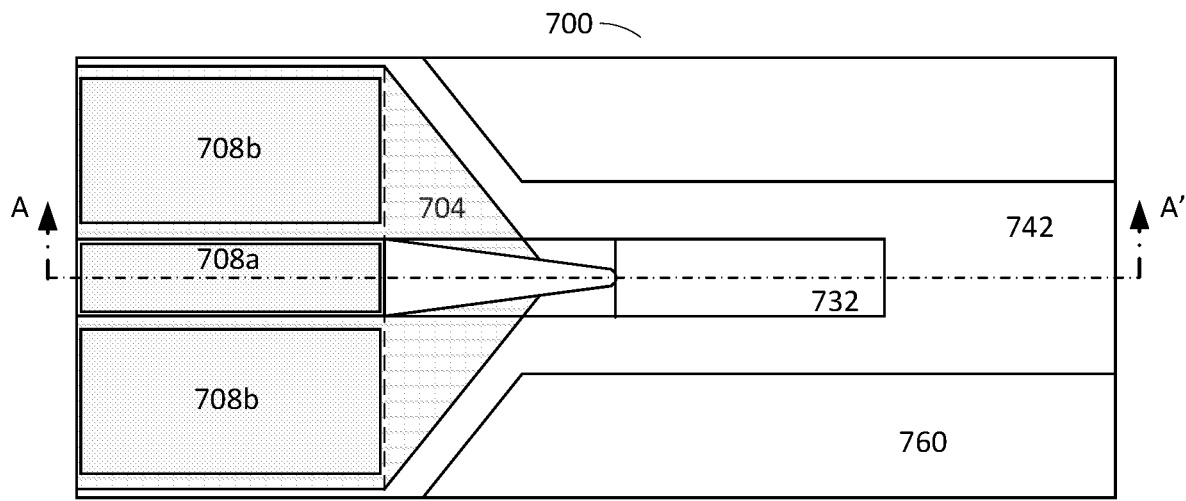
FIG. 7A. Embodiment of a planar laser with combined planar laser and waveguide that includes the modified QW-containing layer and the transition region: (i) Top view, (ii) Section A-A', and (iii) Section B-B'.
Figure 7A:
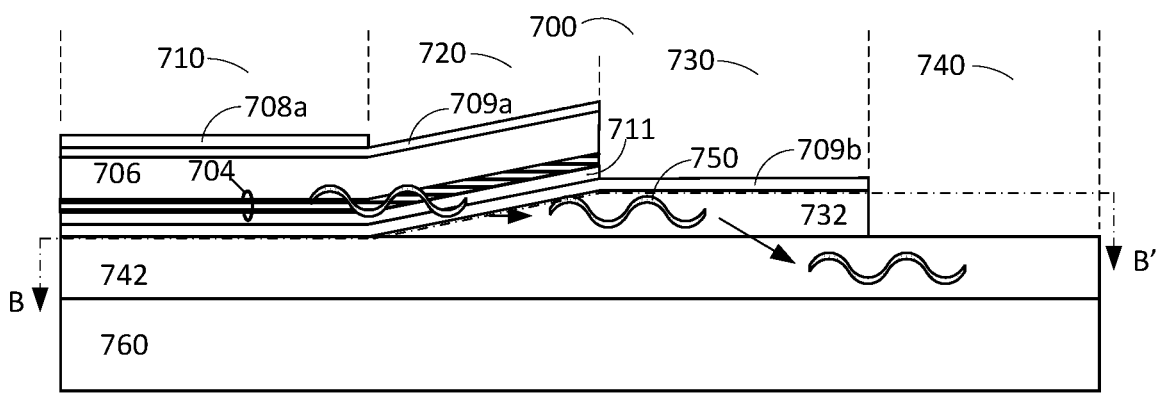
Figure 7A:
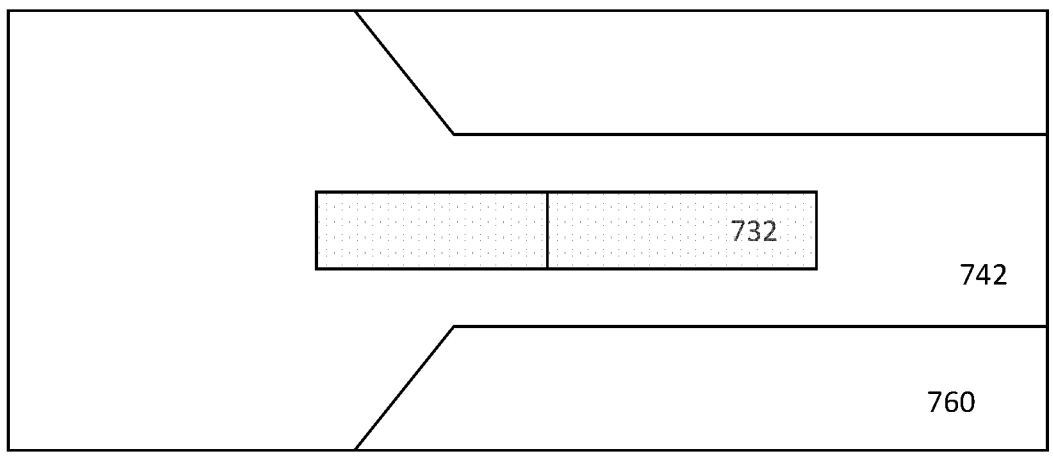
Figure 7B:
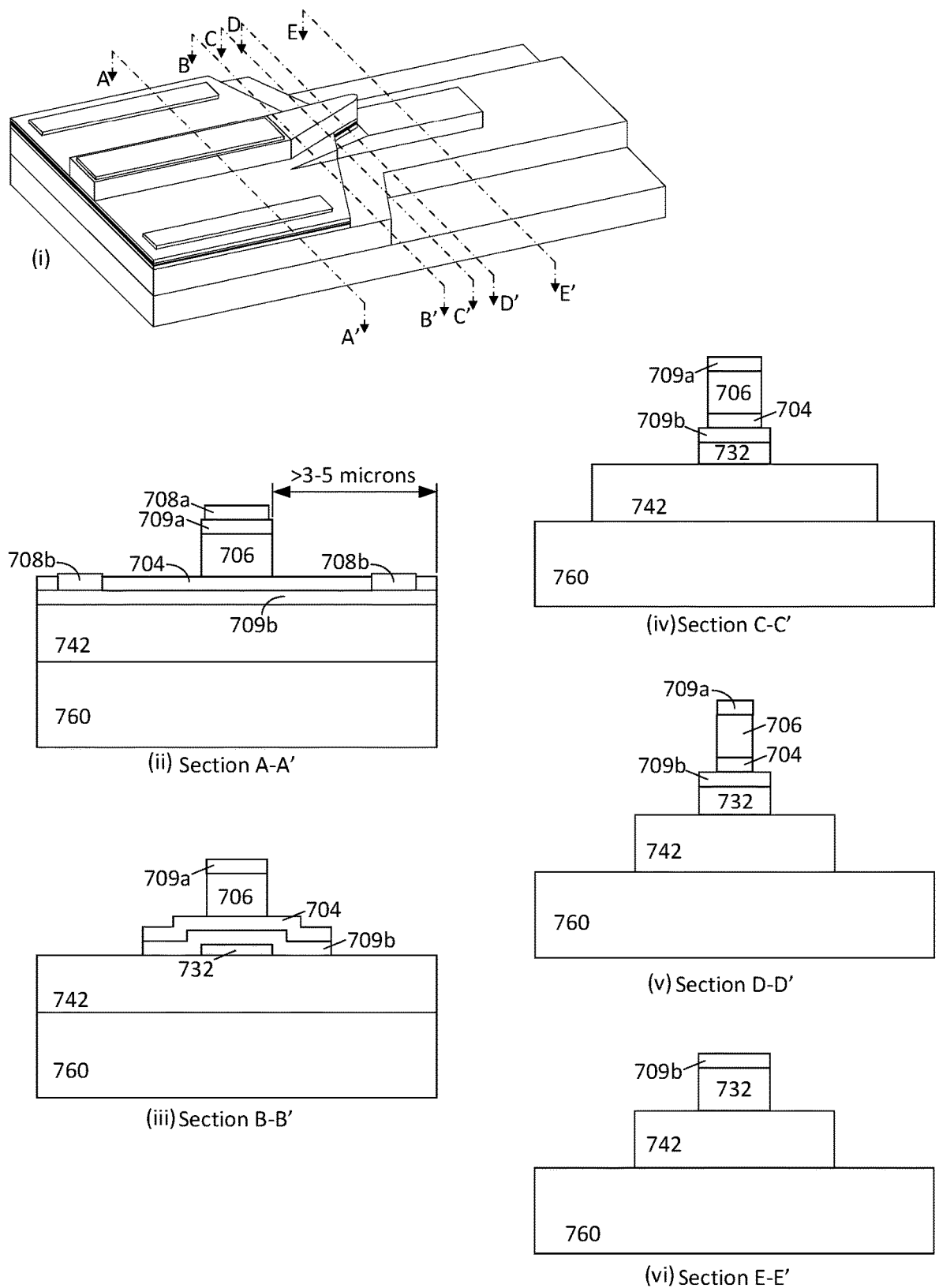
FIG. 7B. Embodiment of a planar laser with combined planar laser and waveguide that includes the modified QW-containing layer and the transition region: (i) Isometric view, (ii) Section A-A', (iii) Section B-B', (iv) Section C-C', (v) Section D-D', and (vi) Section E-E'.

FIG. 7A(i) and FIG. 7A(ii) shows the top electrode layer 708a, the contact layer 709a, the ridge waveguide 706, the QW-containing layer 704, optional layer 711, and bottom contact layer 709b. Optical signal 750, depicted in FIG. 7A(ii), is provided in the figure to illustrate how an optical signal generated in the planar laser portion 710 might traverse the device structure from left to right (as shown) during operation of the laser diode of the planar laser portion 710 of the device 700. Optical signal 750 is present during operation of the device and originates substantially in the planar laser portion 710 with some protrusion of the optical signal generation anticipated into the transition region 720. In some embodiments, removal of the contact layer 709a in the transition region portion 720 can potentially reduce the electrical current flow in the transition region portion 730, and reduce the optical output from the transition region portion 730 during operation of the laser, if required.

Horizontal tapering of the QW-containing layer 704 in the transition region portion 720 promotes movement of the optical signal 750 from the QW-containing layer 704 to the underlying transition waveguide 732 as depicted in FIG. 7A(ii) as the signal moves through the device structure 700. In the embodiment shown in FIG. 7A, the optical signal 750 is generated in the planar laser portion 710 of the device structure 700 and moves to the transition region portion 720. Signal 750 moves into the vertically tapered portion of the transition waveguide 732 driven wholly or in part by the horizontally tapering of the QW-containing layer 704 and an increased index of refraction provided by one or more of the refractive index property of the transition waveguide material or by the increased volume to which the optical signal 750 is exposed as it propagates through the structure as depicted in FIG. 7A(ii). Signal 750 further propagates into the dilute waveguide 742 as shown in FIG. 7A(ii).

Referring to the top-down Section view B-B' of FIG. 7A(ii), as shown in FIG. 7A(iii), the layout of the transition waveguide 732 on the dilute waveguide 742 is provided that illustrates the relative positioning of the transition waveguide layer 732 on the dilute waveguide layer 742, and when compared to FIG. 7A(i), shows the transition waveguide 732 spanning the transition region portion 720 and the transition waveguide portion 730 in this embodiment. Typical widths of the planar waveguides 732, 742 are in the range of 1-20 microns, and typically about 2-3 microns for the transition waveguide 732 and typically about 7-12 microns for the dilute waveguide 742, for commonly used wavelengths in the range of 800 nm to 2 microns. The transition waveguide 732 can extend tens to hundreds of microns beyond the transition region portion 720 in the direction of the optical signal propagation (to the right in the FIGS. 4A-7A and 4B-7B) and the dilute waveguide 742 can extend tens to thousands of microns, in embodiments, for example, in which the structure 700 is used to form a discrete device. In embodiments for which the dilute waveguide 742 is used to connect device 700 to one or more additional devices in a photonic circuit, the dilute waveguide 742 can extend many millimeters or more.

Referring to FIG. 7B(i), the features of the device structure 700 are further illustrated in the isometric perspective drawing shown. The conformal coverage of the QW-containing layer 704 and the underlying contact layer 709b over the vertically tapered transition waveguide 732 is clearly illustrated in FIG. 7B(i). Section drawings from this isometric illustration are provided in FIGS. 7B(ii) to 7B(vi). Section A-A' of FIG. 7B(i), taken through the planar laser portion 710 of device structure 700 is provided in FIG. 7B(ii) and shows the dilute waveguide layer 742 on substrate 760. In the embodiment illustrated in FIGS. 7A and 7B, the planar laser portion 710 is formed on the planar dilute waveguide 742. Bottom semiconductor contact layer 709b and QW-containing layer 704 are shown in the embodiment to extend the full lateral width of the dilute waveguide 742 in portion 720 of the device structure. In other embodiments, the width of the layer 709b and 704 are not aligned with the lateral edges of the dilute waveguide. A notable feature of the device 700, and of these layers, however, is the lateral extension to a distance of 3 microns or more from the edge of the ridge waveguide 706, as indicated in FIG. 7A(ii), such that deleterious effects from the patterning of the QW-containing layer 704 on device performance are reduced, minimized, or eliminated. The ridge waveguide 706 is shown above the QW-containing layer 704 with top contact layer 709a. Electrode contact layers 708a and 708b, typically metal layers or metal alloys, are also shown in FIG. 7B(ii).

Section B-B' and Section C-C' of FIGS. 7B(iii) and 7B(iv), respectively, are taken through the transition region portion 720 of the device structure 700. A comparison of Section B-B' of FIG. 7B(iii) with Section A-A' of FIG. 7B(ii) shows the conformal coverage of the contact layer 709b and the QW-containing layer 704 over the sloped portion of the transition waveguide layer 732. The slope, or vertical tapering, of the transition waveguide layer 732 is perpendicular to the plane of Section B-B' of FIG. 7B(iii). A comparison of Section B-B' of FIG. 7B(iii) with Section A-A' of FIG. 7B(ii) further shows the narrowing in width of the bottom contact layer 709b and the QW-containing layer 704, and the changes in width of these layers are further shown in Section C-C' of FIG. 7B(iv) along with the increasing thickness of the transition waveguide layer 732. The horizontal tapering of the QW-containing layer 704, the ridge waveguide layer 706, and the contact layer 709a are also shown in the succession of drawings in FIGS. 7B(iii), 7B(iv), and 7B(v). Section E-E' of FIG. 7B(v) shows the transition waveguide 732 and contact layer 709b on the dilute waveguide.

A portion of the vertically tapered transition waveguide 732 in the transition region portion 720 of the structure 700 resides above the dilute waveguide 742 as shown in FIG. 7B(v). The contact layer 709b, in some embodiments, is an epitaxially grown layer that is formed over both the dilute waveguide 742 and the transition waveguide 732. As such, the contact layer 709b is typically processed as if it were part of the layer over which it has been formed.

The transition waveguide 732 is shown in the embodiment in Section E-E' of FIG. 7B(vi) to have reached a constant thickness for the purpose of illustrating the key elements of this and similar embodiments. It is important to note, however, that in other embodiments, the vertical tapering of the transition waveguide 732 can be steep or gradual, and can extend over several microns to tens of microns to hundreds of microns or more. Similarly, the width of the transition waveguide 732 and the dilute waveguide 742 can have tapered widths that extend similar distances from the interface between the planar laser portion 710 and the transition region portion 720 in the direction of the optical signal propagation.

In the embodiment shown in FIGS. 7A and 7B, electrode layer 708a is not shown to extend into the transition region 720. In other embodiments, the electrode layer 708a may extend into the transition region 720. It is important to note that the elements shown in FIGS. 7A and 7B are those that demonstrate the structure and functionality of the device structure for the embodiment shown. Additionally, other layers, such as encapsulation layers and composite layers for one or more of the layers described may be included in other embodiments.

Figure 8A:
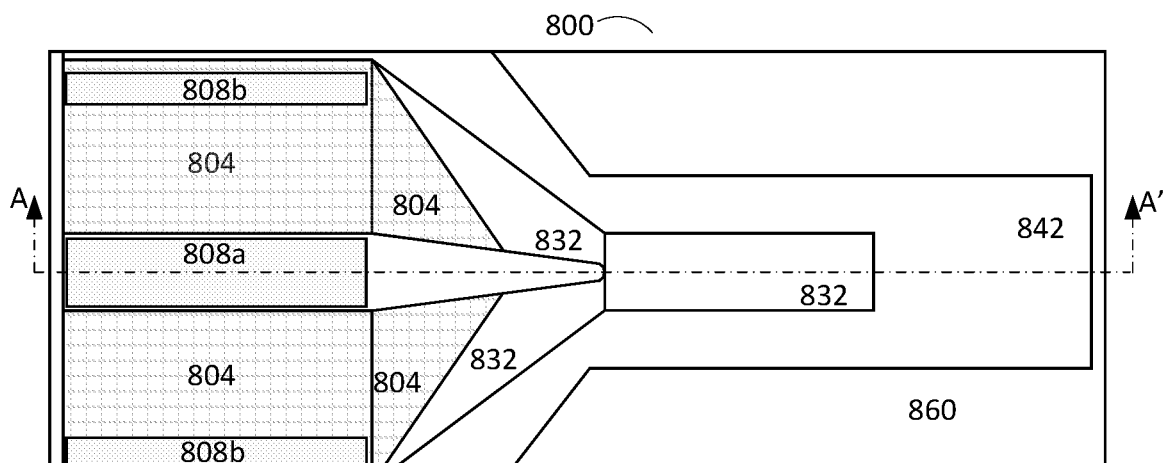
FIG. 8A. Embodiment of a planar laser with combined planar laser and waveguide that includes the modified QW-containing layer and the transition region: (i) Top view, (ii) Section A-A', and (iii) Section B-B'.
Figure 8A:
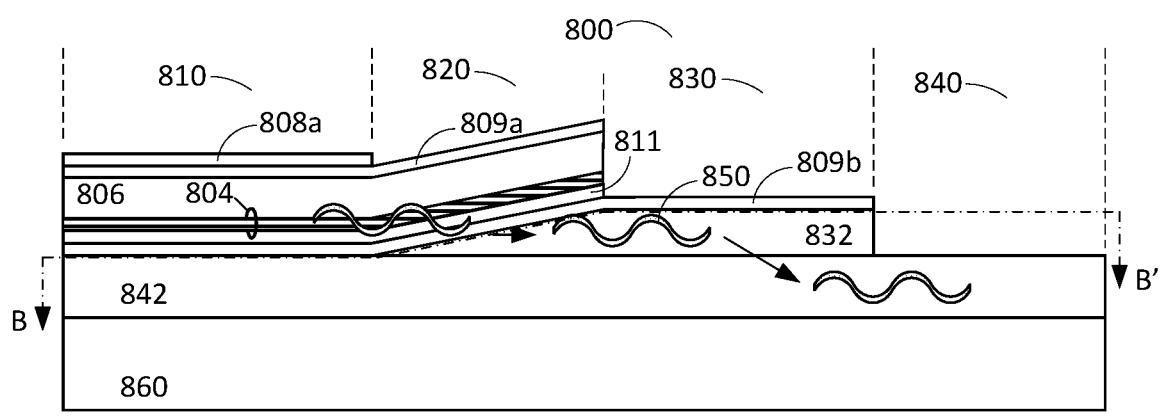
Figure 8A:
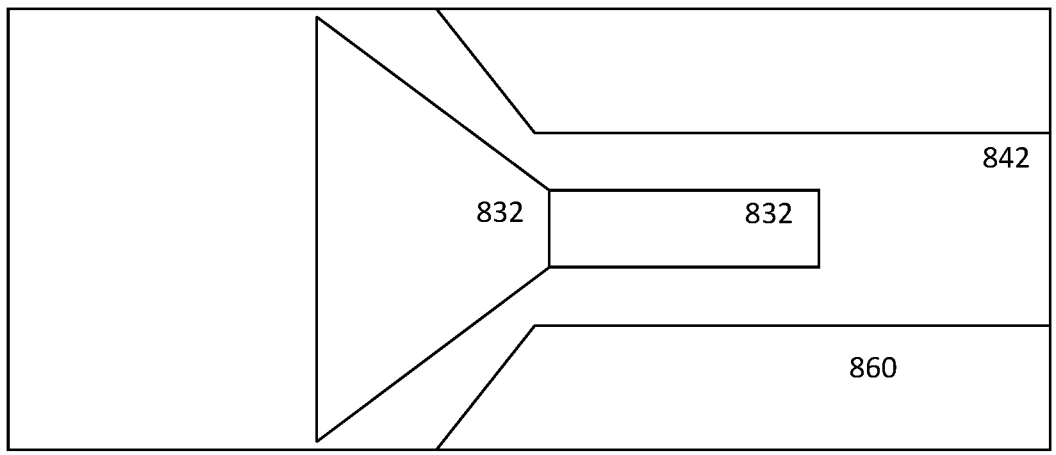

Referring to FIG. 8A, a drawing of an embodiment of the planar laser and waveguide structure 800 with horizontal tapering of the planar laser layers and both horizontal and vertical tapering of the transition waveguide 832 is shown. In the top view in FIG. 8A(i) and the Section A-A' view in FIG. 8A(ii), elements of the planar laser and waveguide structure 800 are shown that include the substrate 860, the dilute waveguide 842, and the transition waveguide 832. In the embodiment shown in FIG. 8A, planar laser portion 810 is formed on the dilute waveguide layer 842. The transition waveguide layer 832 (viewed from top down) extends (horizontally as shown) from the rightmost edge (as shown) of the planar laser portion 810, through the length of the transition region portion 820, and through the length of the transition waveguide portion 830 (moving left to right as shown in FIG. 8A(i).). The cross-sectional view, Section A-A', in FIG. 8A(ii) shows the vertical tapering of the transition waveguide layer 832 in this embodiment, and the extent of the tapered and untapered portions of the transition waveguide layer 832. The vertical tapering in the embodiment shown in FIG. 8A begins at or near the interface between the planar laser portion 810 and the transition region portion 820 and extends to the interface between the transition region portion 820 and the transition waveguide portion 830 as shown in FIG. 8A(ii). Additionally, the vertically tapered portion of the transition waveguide in the embodiment shown in FIG. 8A extends the width of the QW-containing layer 804 of the planar laser portion 810. In the embodiment shown in FIGS. 7A and 7B, the transition waveguide 732 did not extend outward but rather maintained a substantially rectangular shape when viewed from top down as shown in FIG. 7A(iii). By contrast, in the embodiment shown in FIG. 8A(iii), the transition waveguide 832 tapers horizontally outward from the main rectangular body of the transition waveguide 832 to the lateral edges of the QW-containing layer 804. The portion of the transition waveguide 832 in the transition region portion 820 is also vertically tapered as is shown in FIG. 8A(ii).

Vertical tapering is the inclusion of a vertical slope in all or a portion of an element, and in the case of the embodiment shown in FIG. 8A, the transition waveguide 832 has a sloped portion in the transition region portion 820 as shown in the cross-sectional illustration in FIG. 8A(ii). In this transition region portion 820, the semiconductor layers that include the bottom contact layer 809b, layer 811, the QW-containing layer 804, the ridge waveguide 806, and the top contact layer 809a, are extended from the interface between the planar laser portion 810 and the transition region 820, into the transition region portion 820. These layers substantially follow the slope and contour of the underlying, vertically-tapered, transition waveguide 832. In the embodiment shown in FIG. 8A, these layers 809b, 804, 811, 806, and 809a are formed on the portion of the transition waveguide 832 that is both vertically and horizontally tapered as shown in the perspective drawing of the structure 800 in FIG. 8B(i) for the embodiment shown in FIG. 8A.

In other embodiments, the horizontal tapering of the transition waveguide does not extend as far laterally from the ridge waveguide at the interface between the planar laser portion 810 and the transition region portion 820 but rather extends to an intermediate distance between the lateral edge of the QW-containing layer 804 and the projection of the square edge of the transition waveguide as shown in the embodiment in FIGS. 7A and 7B. In the embodiment shown in FIGS. 7A and 7B, the width of the transition waveguide 732 as shown in the drawings is constant. In yet other embodiments, the width of the transition waveguide at the interface between device portion 810 and device portion 820 is less than the width of the transition waveguide in the transition waveguide portion 830 as described herein.

In the embodiment shown in FIG. 8A, and in similar embodiments in which the planar waveguide portion of the device structure 800 is formed on the dilute waveguide 842, the fabrication process can be simplified significantly relative to embodiments with a fill layer below the planar laser. Elimination of the fill layer 513, 613 simplifies the structure in that the layers in the structure can all be formed using variations of the conventional epitaxial films of InP, for example. The vertically tapered portion of the transition waveguide layer 832, or variations of the structure as described herein, can be formed using gray scale lithography or aspect ratio dependent etching or deposition processing, among other techniques. It is important to note that although the fill layer, as described in device structure 500 and device structure 600, is not present in the device structure 800, other layers not shown in the structure can be added and remain within the scope of the current invention. Layers, such as optional layer 811 can provide lattice matching in epitaxially grown device structures, for example, or layers with favorable optical properties can be added to the structure between the transition waveguide 842 and the QW-containing layer 804.

FIG. 8A(i) and FIG. 8A(ii) shows the top electrode layer 808a, the contact layer 809a, the ridge waveguide 806, the QW-containing layer 804, optional layer 811, and bottom heavily doped semiconductor layer 809b. Optical signal 850, depicted in FIG. 8A(ii), is provided in the figure to illustrate how an optical signal generated in the planar laser portion 810 might traverse the device structure from left to right (as shown) during operation of the laser diode of the planar laser portion 810 of the device 800. Optical signal 850 is present during operation of the device and originates substantially in the planar laser portion 810 with some protrusion of the optical signal generation anticipated into the transition region 820. Removal of the contact layer 809a in the transition region portion 820 can potentially reduce the current flow, and the optical output in the transition region portion 830 during operation of the laser, if required.

Horizontal tapering of the QW-containing layer 804 in the transition region portion 820 promotes movement of the optical signal 850 from the QW-containing layer 804 to the underlying transition waveguide 832 as depicted in FIG. 8A(ii) as the signal moves through the device structure 800. In the embodiment shown in FIG. 8A, the optical signal 850 is generated in the planar laser portion 810 of the device structure 800 and moves to the transition region portion 820. Signal 850 moves into the vertically tapered portion of the transition waveguide 832 driven wholly or in part by the horizontally tapering of the QW-containing layer 804 and an increased index of refraction provided by one or more of the refractive index property of the transition waveguide material or by the increased volume to which the optical signal 850 is exposed as it propagates through the structure as depicted in FIG. 8A(ii). The width of the transition layer waveguide 832 at the interface between the QW-containing layer 804 and the transition waveguide 832 is anticipated to affect the coupling of the optical signal and the formation of favorable optical signal modes in embodiments of the device structure 800. Additionally, the length of the vertically tapered portion, or sloped portion, is also expected to affect the coupling of the optical signal and affect the optical signal mode in embodiments of the device structure 800.

Referring to the top-down Section view B-B' of FIG. 8A(ii), as shown in FIG. 8A(iii), the layout of the transition waveguide 832 on the dilute waveguide 842 is provided that illustrates the relative positioning of the transition waveguide layer 832 in this embodiment on the dilute waveguide layer 842, and when compared to FIG. 8A(i), shows the transition waveguide 832 spanning the transition region portion 820 and the transition waveguide portion 830 in this embodiment. Typical widths of the planar waveguides 832, 842 are in the range of 1-20 microns, and typically about 2-3 microns for the transition waveguide 832 and typically about 7-12 microns for the dilute waveguide 842, for commonly used wavelengths in the range of 800 nm to 2 microns. The transition waveguide 832 can extend several microns to tens to hundreds of microns beyond the transition region portion 820 in the direction of the optical signal propagation (to the right in the FIGS. 4A-8A and 4B-8B) and the dilute waveguide 842 can extend tens to thousands of microns and can depend on the application for which the device 800 is used. In applications for which the device structure 800 is used to form a discrete device may have shorter length requirements, for example, than applications in which or the dilute waveguide 842 is used to connect device 800 to one or more other devices in a photonic circuit.

Figure 8B:
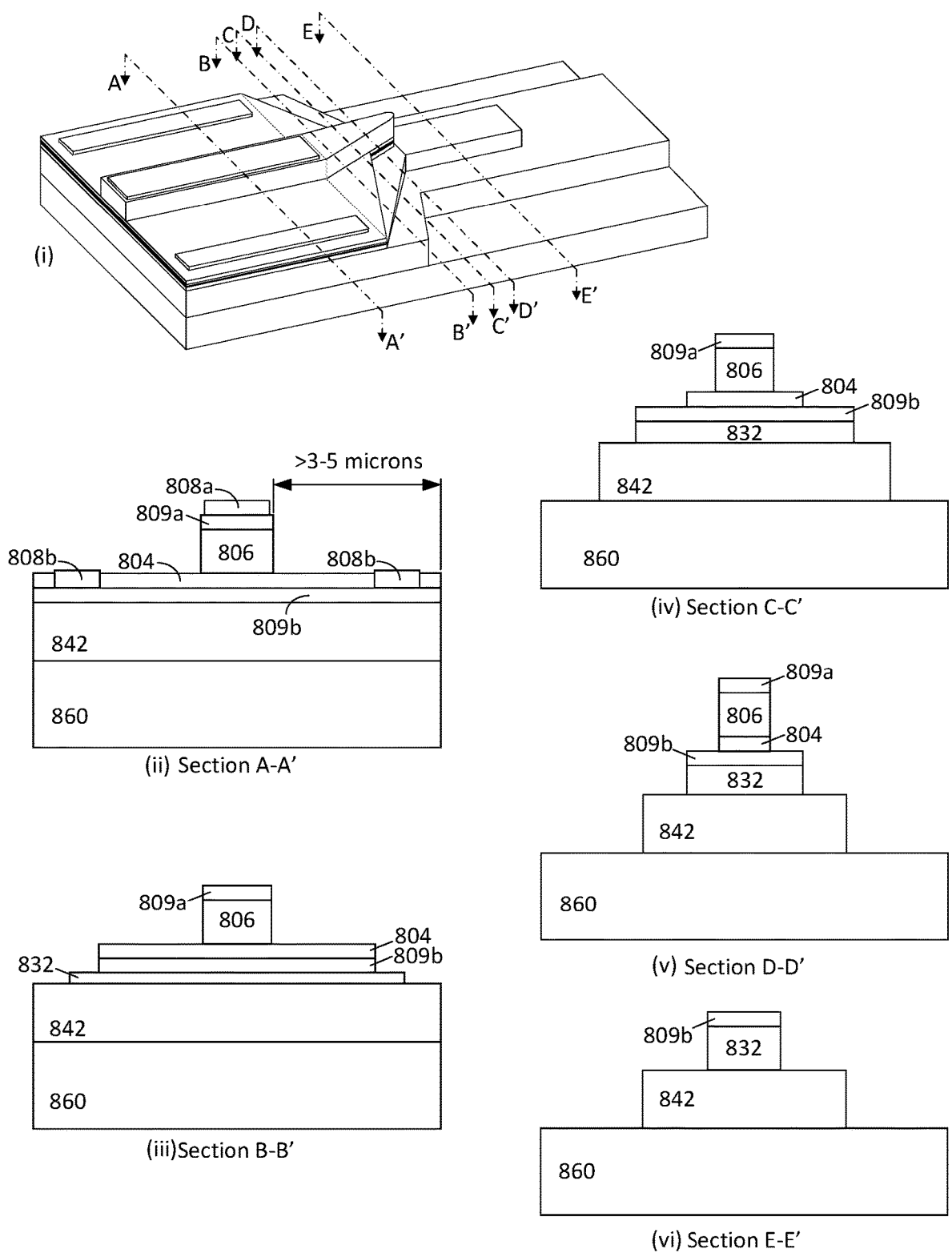
FIG. 8B. Embodiment of a planar laser with combined planar laser and waveguide that includes the modified QW-containing layer and the transition region: (i) Isometric view, (ii) Section A-A', (iii) Section B-B', (iv) Section C-C', (v) Section D-D', and (vi) Section E-E'.

Referring to FIG. 8B(i), the features of the device structure 800 are further illustrated in the isometric perspective drawing shown. Section drawings from this isometric illustration are provided in FIGS. 8B(ii) to 8B(vi). Section A-A' of FIG. 8B(i), taken through the planar laser portion 810 of device structure 800 is provided in FIG. 8B(ii) and shows the planar waveguide structure that includes the dilute waveguide layer 842 on substrate 860. In the embodiment illustrated in FIGS. 8A and 8B, the planar laser portion 810 is formed on the planar dilute waveguide 842. Bottom semiconductor contact layer 809b and QW-containing layer 804 are shown in the embodiment to extend the full lateral width of the dilute waveguide 842 in the Section A-A' cross sectional drawing from portion 810 in of the device structure. In other embodiments, the width of the layer 809b and 804 are not aligned with the lateral edges of the dilute waveguide. In some embodiments, the substrate is extended beyond the layers shown for embodiments of the device structure. A notable feature of the device 800, and of these layers, however, is that the lateral extension to a distance of 3 microns or more from the edge of the ridge waveguide 806, as indicated in FIG. 8A(ii), such that deleterious effects from the patterning of the QW-containing layer 804 on device performance are reduced, minimized, or eliminated. The ridge waveguide 806 is shown above the QW-containing layer 804 with semiconductor top contact layer 809a. Electrode contact layers 808a and 808b, typically metal layers or metal alloys, are also shown in FIG. 8B(ii).

Section B-B' and Section C-C' of FIGS. 8B(iii) and 8B(iv) are taken through the transition region portion 820 of the device structure 800. A comparison of Section B-B' of FIG. 8B(iii) with Section A-A' of FIG. 8B(ii) shows contact layer 809b and QW-containing layer 804 over a portion of the horizontally and vertically tapered portion of the transition waveguide layer 832. The slope, or vertical tapering, of the transition waveguide layer 832 is perpendicular to the plane of Section B-B' of FIG. 8B(iii). A comparison of Section B-B' of FIG. 8B(iii) with Section A-A' of FIG. 8B(ii) shows the narrowing in width of the bottom transition waveguide 832, the contact layer 809b, and the QW-containing layer 804. The changes in width of these layers 832, 809b, 804 are further shown in Section C-C' of FIG. 8B(iv) along with the increasing thickness of the transition waveguide layer 832. The horizontal tapering of the QW-containing layer 804, the ridge waveguide layer 806, and the contact layer 809a are also shown in the succession of drawings in FIGS. 8B(iii), 8B(iv), and 8B(v). Section E-E' of FIG. 8B(v) shows the transition waveguide 832 and contact layer 809b on the dilute waveguide.

The vertically tapered transition waveguide 832 in the transition region portion 820 of the structure 800 resides above the dilute waveguide 842. The contact layer 809b, in embodiments, is an epitaxially grown layer that is formed over both the dilute waveguide 842 and the transition waveguide 832. As such, the contact layer 809b is typically processed as if it were part of the transition waveguide layer 832 or dilute waveguide layer 842, or both, over which it has been formed.

The transition waveguide 832 is shown in the embodiment in Section E-E' of FIG. 8B(vi) to have reached constant thickness for the purpose of illustrating the key elements of this and similar embodiments. It is important to note, however, that in other embodiments, the vertical tapering of the transition waveguide 832 can be steep or gradual, and can extend over several microns to tens of microns to hundreds of microns or more. Similarly, the width of the transition waveguide 832 and the dilute waveguide 842 can have tapered widths that extend similar distances from the interface between the planar laser portion 810 and the transition region portion 820 in the direction of the optical signal propagation.

In the embodiment shown in FIGS. 8A and 8B, electrode layer 808a is not shown to extend into the transition region 820. In other embodiments, the electrode layer 808a on ridge waveguide 806 may extend into the transition region 820. It is important to note that the elements shown in FIGS. 8A and 8B are those that demonstrate the structure and functionality of the device structure for the embodiment shown. Additionally, other layers, such as encapsulation layers and composite layers for one or more of the layers described may be included in other embodiments.

Figure 9A:
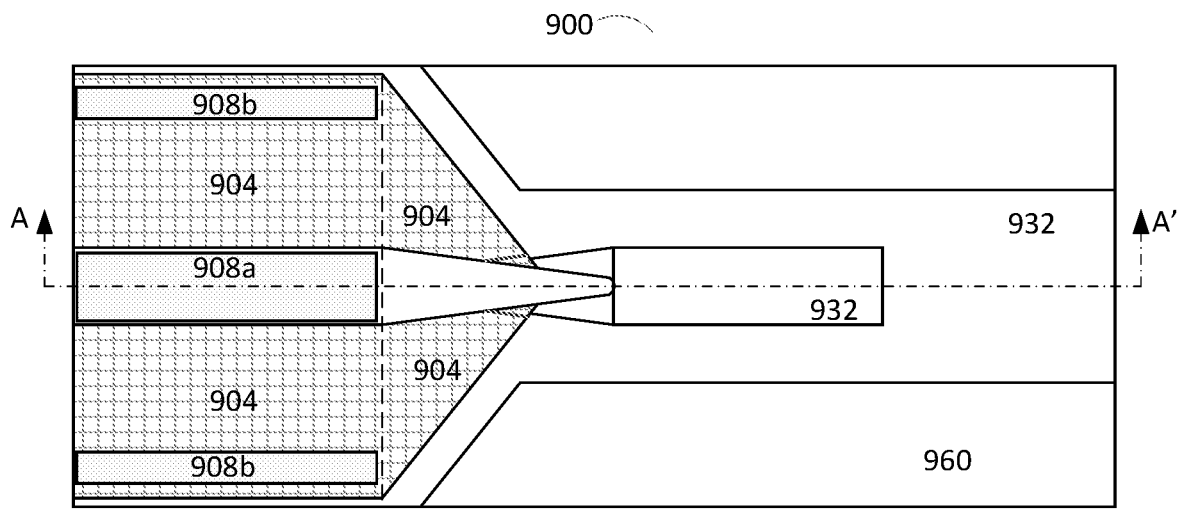
FIG. 9A. Embodiment of a planar laser with combined planar laser and waveguide that includes the modified QW-containing layer and the transition region: (i) Top view, (ii) Section A-A', and (iii) Section B-B'.
Figure 9A:
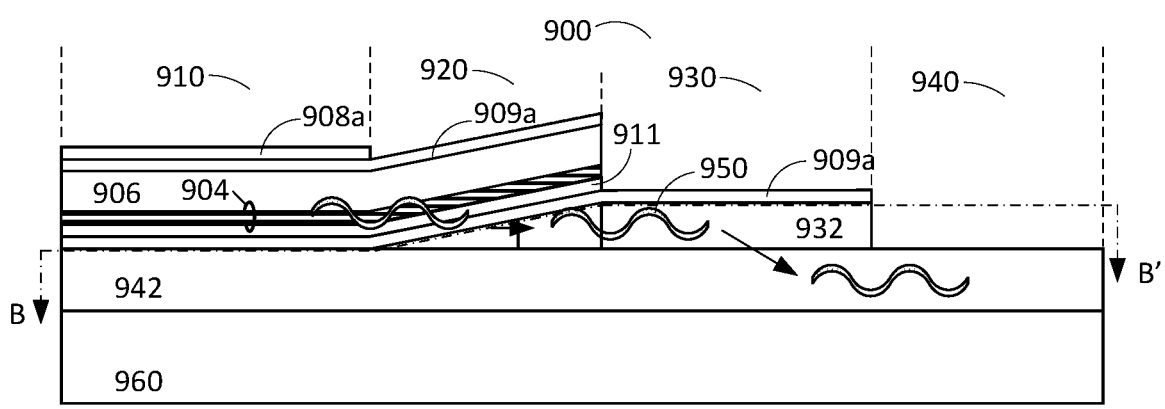
Figure 9A:
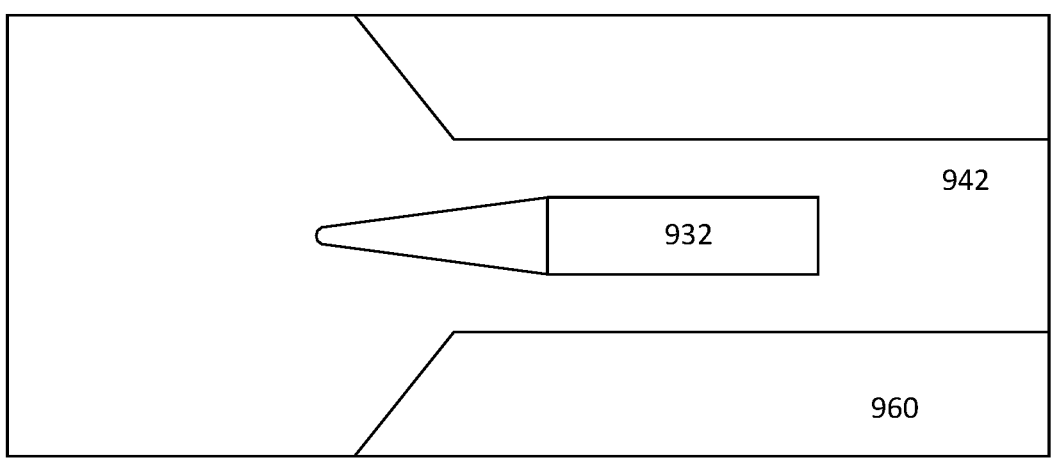

Referring to FIG. 9A, a drawing of an embodiment of the planar laser and waveguide structure 900 with horizontal tapering of the planar laser layers and both horizontal and vertical tapering of the transition waveguide 932 is shown. In the top view in FIG. 9A(i) and the Section A-A' view in FIG. 9A(ii), elements of the planar laser and waveguide structure 900 are shown that include the substrate 960, the dilute waveguide 942, and the tapered transition waveguide 932. In the embodiment shown in FIG. 9A, planar laser portion 910 is formed on the dilute waveguide layer 942. The transition waveguide layer 932 (viewed from top down) extends (horizontally as shown) from the rightmost edge (as shown) of the planar laser portion 910, through the length of the transition region portion 920, and through the length of the transition waveguide portion 930 (moving left to right as shown in FIG. 9A(i).). The cross-sectional view, Section A-A', in FIG. 9A(ii) shows the vertical tapering of the transition waveguide layer 932 in this embodiment and the extent of the tapered and untapered portions of the transition waveguide layer 932. The vertical tapering in the embodiment shown in FIG. 9A begins at or near the interface between the planar laser portion 910 and the transition region portion 920 and extends to the interface between the transition region portion 920 and the transition waveguide portion 930 as shown in FIG. 9A(ii). Additionally, the vertically tapered portion of the transition waveguide 932 in the embodiment shown in FIG. 9A is also horizontally tapered in the same portion of the transition waveguide 932. The horizontal tapering of the transition waveguide 932 is evident from the top down view shown in FIG. 9A(i), as the transition waveguide layer 932 is shown to narrow in width in the direction from the interface between the transition region portion 920 and the transition waveguide portion 930 to the interface between the planar laser portion 910 and the transition region portion 920. In the embodiment shown in FIG. 7, the transition waveguide 732 maintained a substantially rectangular shape when viewed from top down as shown in FIG. 7A(iii). By contrast, in the embodiment shown in FIG. 9A(iii), the transition waveguide 932 tapers horizontally inward from the projection of the main rectangular body of the transition waveguide 932. The portion of the transition waveguide 932 in the transition region portion 920 is also vertically tapered as is shown in FIG. 9A(ii).

Vertical tapering is the inclusion of a vertical slope in all or a portion of an element, and in the case of the embodiment shown in FIG. 9A, the transition waveguide 932 has a sloped portion in the transition region portion 920 as shown in the cross-sectional illustration in FIG. 9A(ii). In this transition region portion 920, the semiconductor layers that include the bottom contact layer 909b, layer 911, the QW-containing layer 904, the ridge waveguide 906, and the top contact layer 909a, are extended from the interface between the planar laser portion 910 and the transition region 920, into the transition region portion 920. These layers substantially follow the slope and contour of the underlying, vertically-tapered, transition waveguide 932. In the embodiment shown in FIG. 9A, these layers 909b, 904, 911, 906, and 909a are formed on the portion of the transition waveguide 932 that is both vertically and horizontally tapered as shown in the perspective drawing of the structure 900 in FIG. 9B(i). QW-containing layer 904 and underlying contact layer 909b further extend with horizontal tapering to the lateral edge, or near the lateral edge, of the device structure 900. In other embodiments, the horizontal tapering of the semiconductor layers 909b, 904 does not extend as far laterally from the ridge waveguide but rather extends to an intermediate distance between the lateral edge of the QW-containing layer 906 and the width of the ridge waveguide. In the embodiment shown in FIGS. 7A and 7B, the width of the transition waveguide 732 as shown in the drawings is constant. In other embodiments, the width of the transition waveguide at the interface between device portion 910 and device portion 920 is greater than the width of the transition waveguide in the transition waveguide portion 930 as described herein.

Figure 9B:
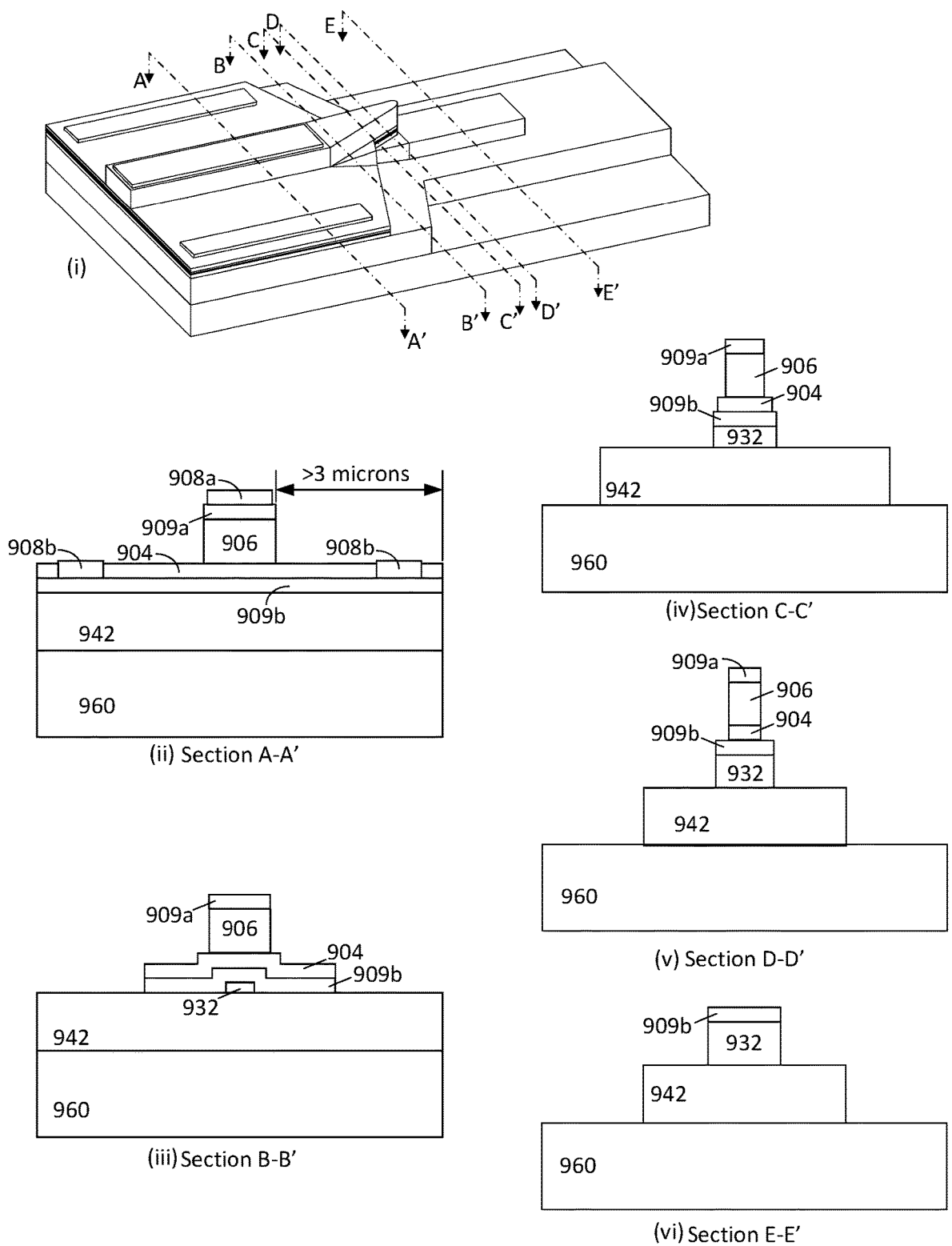
FIG. 9B. Embodiment of a planar laser with combined planar laser and waveguide that includes the modified QW-containing layer and the transition region: (i) Isometric view, (ii) Section A-A', (iii) Section B-B', (iv) Section C-C', (v) Section D-D', and (vi) Section E-E'.

In other embodiments, the width of the horizontally tapered transition waveguide 832 at the interface between the planar laser portion 810 and the transition region portion 820 can be any intermediate width between the width of the QW-containing layer 804 as shown for the planar laser portion 810 to the narrowed width of the transition waveguide shown for the inward horizontal tapering in the embodiment shown in FIGS. 9A and 9B.

In the embodiment shown in FIGS. 9A and 9B, and in similar embodiments in which the planar waveguide portion of the device structure 900 is formed on the dilute waveguide 942, the fabrication process can be simplified significantly relative to embodiments with a fill layer below the planar laser. Elimination of the fill layer 513, 613 simplifies the structure in that the layers in the structure can all be formed using variations of the conventional epitaxial films of InP, for example. The vertically tapered portion of the transition waveguide layer 932, or variations of the structure as described herein, can be formed using gray scale lithography or aspect ratio dependent etching or deposition processing, for example, among other techniques.

FIG. 9A(i) and FIG. 9A(ii) show the top electrode layer 908a, the doped semiconductor contact layer 909a, the ridge waveguide 906, the QW-containing layer 904, optional layer 911, and bottom heavily doped semiconductor layer 909b. Optical signal 950, depicted in FIG. 9A(ii), is provided in the figure to illustrate how an optical signal generated in the planar laser portion 910 might traverse the device structure from left to right (as shown) during operation of the laser diode of the planar laser portion 910 of the device 900. Optical signal 950 is present during operation of the device and originates substantially in the planar laser portion 910 with some protrusion of the optical signal generation anticipated into the transition region 920. In some embodiments, the removal of the contact layer 909a in the transition region portion 920 can potentially reduce the current flow, and the optical output in the transition region portion 930 during operation of the laser, if required.

Horizontal tapering of the QW-containing layer 904 in the transition region portion 920 promotes movement of the optical signal 950 from the QW-containing layer 904 to the underlying transition waveguide 932, and subsequently to the underlying dilute waveguide 942 as depicted in FIG. 9A(ii) as the signal moves through the device structure 900. In the embodiment shown in FIGS. 9A and 9B, the optical signal 950 is generated in the planar laser portion 910 of the device structure 900 and moves to the transition region portion 920. Signal 950 moves into the vertically tapered portion of the transition waveguide 932 driven wholly or in part by the horizontal tapering of the QW-containing layer 904 and an increased index of refraction provided by one or more of the refractive index property of the transition waveguide material or by the increased volume to which the optical signal 950 is exposed as it propagates through the structure as depicted in FIG. 9A(ii). The width of the transition layer waveguide 932 at the interface between the transition waveguide 932 and the contact layer 909b can affect the coupling of the optical signal and the optical signal mode in embodiments of the device structure 900. Additionally, the length of the vertically tapered portion, or sloped portion, is also expected to affect the coupling of the optical signal 950 and also affect the formation of preferred optical signal modes in embodiments of the device structure 900.

Referring to the top-down Section view B-B' of FIG. 9A(ii), as shown in FIG. 9A(iii), the layout of the transition waveguide 932 on the dilute waveguide 942 is provided that illustrates the relative positioning of the transition waveguide layer 932 in this embodiment on the dilute waveguide layer 942, and when compared to FIG. 9A(i), shows the transition waveguide 932 spanning the transition region portion 920 and the transition waveguide portion 930 in this embodiment. Typical widths of the planar waveguides 932, 942 are in the range of 1-20 microns, and typically about 2-3 microns for the transition waveguide 932 and typically about 7-12 microns for the dilute waveguide 942, for commonly used wavelengths in the range of 800 nm to 2 microns. The transition waveguide 932 can extend several microns to tens to hundreds of microns beyond the transition region portion 920 in the direction of the optical signal propagation (to the right in the FIGS. 4A-9A and 4B-9B) and the dilute waveguide 942 can extend tens to thousands of microns and can depend on the application for which the device 900 is used. In applications for which the device structure 900 is used to form a discrete device may have shorter length requirements, for example, than applications in which or the dilute waveguide 942 is used to connect device 900 to one or more other devices in a photonic circuit.

Referring to FIG. 9B(i), the features of the device structure 900 are further illustrated in the isometric perspective drawing shown. The conformal coverage of the QW-containing layer 904 and the underlying contact layer 909b over the tapered transition waveguide 932 is clearly illustrated in FIG. 9B(i). Section drawings from this isometric illustration are provided in FIGS. 9B(ii) to 9B(vi). Section A-A' of FIG. 9B(i), taken through the planar laser portion 910 of device structure 900, is provided in FIG. 9B(ii) and shows the planar waveguide structure that includes the dilute waveguide layer 942 on substrate 960. In the embodiment illustrated in FIGS. 9A and 9B, the planar laser portion 910 is formed on the planar dilute waveguide 942. Bottom semiconductor contact layer 909b and QW-containing layer 904 are shown in the embodiment to extend the full lateral width of the dilute waveguide 942 in the Section A-A' cross sectional drawing from portion 910 of the device structure 900. In other embodiments, the width of the layer 909b and 904 are not aligned with the lateral edges of the dilute waveguide. In some embodiments, the substrate is extended beyond the layers shown for embodiments of the device structure. A notable feature of the device 900, and of these layers, however, is that the lateral extension to a distance of 3 microns or more from the edge of the ridge waveguide 906, as indicated in FIG. 9B(ii), such that deleterious effects from the patterning of the QW-containing layer 904 on device performance are reduced, minimized, or eliminated. The ridge waveguide 906 is shown above the QW-containing layer 904 with top contact layer 909a. Electrode contact layers 908a and 908b, typically metal layers or metal alloys, are also shown in FIG. 9B(ii).

Section B-B' and Section C-C' of FIGS. 9B(iii) and 9B(iv) are taken through the transition region portion 920 of the device structure 900. Section B-B' of FIG. 9B(iii) shows contact layer 909b and QW-containing layer 904 over a narrow, sloped portion of the transition waveguide layer 932. The slope, or vertical tapering, of the transition waveguide layer 932 is perpendicular to the plane of Section B-B' of FIG. 9B(iii). A comparison of Section B-B' of FIG. 9B(iii) with Section A-A' of FIG. 9B(ii) shows the narrowing in width of the QW-containing layer 904 and the bottom contact layer 909b, and the changes in width of these layers are further shown in Section C-C' of FIG. 9B(iv) along with the increasing thickness of the transition waveguide layer 932. The horizontal tapering of the QW-containing layer 904, the ridge waveguide layer 906, and the contact layer 909a are also shown in the succession of drawings in FIGS. 9B(iii), 9B(iv), and 9B(v). Section E-E' of FIG. 9B(v) shows the transition waveguide 932 and contact layer 909b on the dilute waveguide.

The transition waveguide 932 in the transition region portion 920 of the structure 900 resides above the dilute waveguide 942. The doped semiconductor contact layer 909b, in embodiments, is an epitaxially grown layer that is formed over both the dilute waveguide 942 and the transition waveguide 932. As such, in some embodiments, the contact layer 909b is processed as if it were part of the layer over which it has been epitaxially formed.

The transition waveguide 932 is shown in the embodiment in Section E-E' of FIG. 9B(vi) to have reached constant thickness for the purpose of illustrating the key elements of this and similar embodiments. It is important to note, however, that in other embodiments, the vertical tapering of the transition waveguide 932 can be steep or gradual, and can extend over several microns to tens of microns to hundreds of microns, or more. Similarly, the width of the transition waveguide 932 and the dilute waveguide 942 in some embodiments, has tapered widths that extend similar distances from the interface between the planar laser portion 910 and the transition region portion 920 in the direction of the optical signal propagation.

In the embodiment shown in FIGS. 9A and 9B, electrode layer 908a is not shown to extend into the transition region 920. In other embodiments, the electrode layer 908a on ridge waveguide 906 may extend into the transition region 920. It is important to note that the elements shown in FIGS. 9A and 9B are those that demonstrate the structure and functionality of the device structure for the embodiment shown. Additionally, other layers, such as encapsulation layers and composite layers for one or more of the layers described may be included in other embodiments.

Figure 10A:
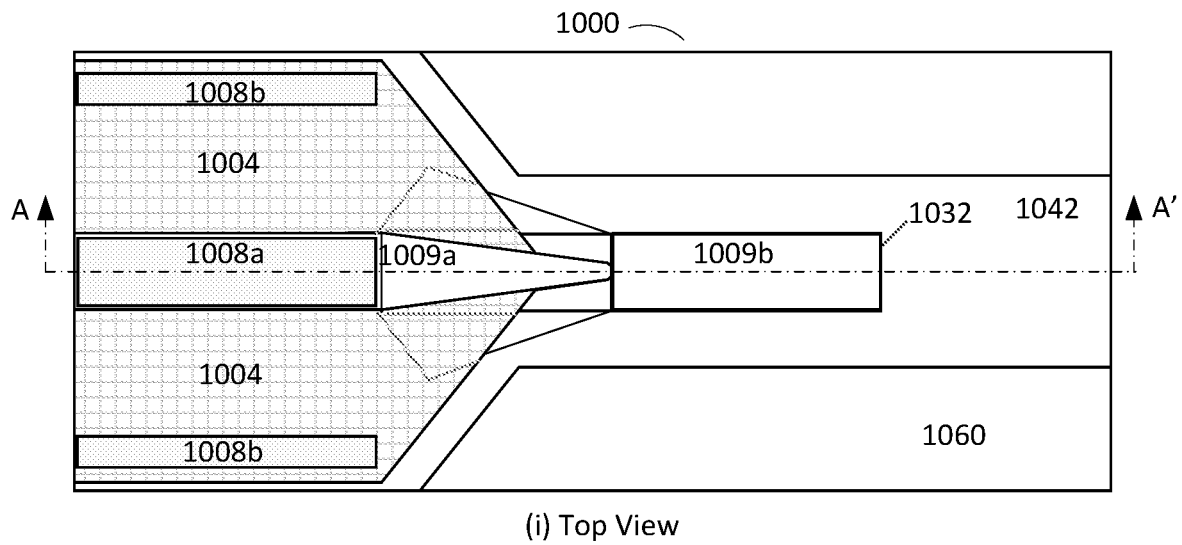
FIG. 10A. Embodiment of a planar laser with combined planar laser and waveguide that includes the modified QW-containing layer and the transition region: (i) Top view, (ii) Section A-A', and (iii) Section B-B'.
Figure 10A:
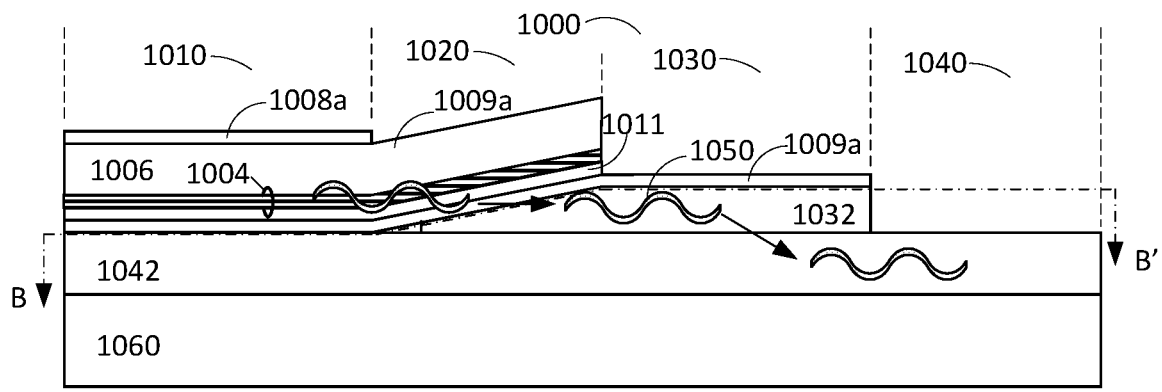
Figure 10A:
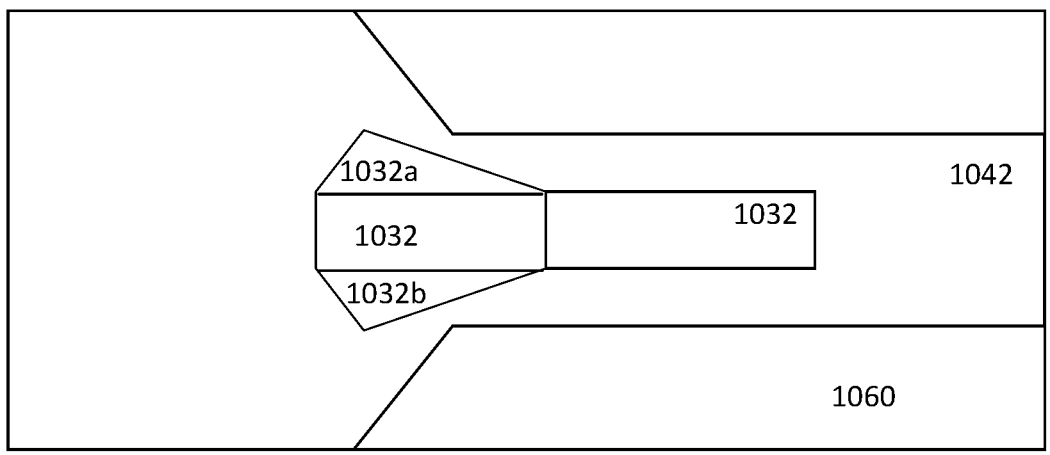

Referring to FIG. 10A, a drawing of an embodiment of the planar laser and waveguide structure 1000 with horizontal tapering of the planar laser layers and both horizontal and vertical tapering of the transition waveguide 1032 is shown. In the embodiment shown in FIG. 10A, the transition waveguide 1032 is vertically tapered in the direction along the path of the optical signal 1050 as in the case for device structure 700, for example, and is also vertically tapered in a direction perpendicular to the optical path as described herein. In the top view in FIG. 10A(i) and the Section A-A' view in FIG. 10A(ii), elements of the planar laser and waveguide structure 1000 are shown that include the substrate 1060, the dilute waveguide 1042, and the tapered transition waveguide 1032. In the embodiment shown in FIG. 10A, planar laser portion 1010 is formed on the dilute waveguide layer 1042. The transition waveguide layer 1032 (viewed from top down) extends (horizontally as shown) from the rightmost edge (as shown) of the planar laser portion 1010, through the length of the transition region portion 1020, and through the length of the transition waveguide portion 1030 (moving left to right as shown in FIG. 10A(i)). The cross-sectional view, Section A-A', in FIG. 10A(ii) shows the vertical tapering of the transition waveguide layer 1032 in this embodiment and the extent of the tapered and untapered portions of the transition waveguide layer 1032 along the centerline of the device 1000. The vertical tapering in the embodiment shown in FIG. 10A begins at or near the interface between the planar laser portion 1010 and the transition region portion 1020 and extends to the interface between the transition region portion 1020 and the transition waveguide portion 1030 as shown in FIG. 10A(ii). Additionally, the vertically tapered portion of the transition waveguide in the embodiment shown in FIG. 10A is also horizontally tapered in the transition region portion 1020 of the transition waveguide 1032. The horizontal tapering of the transition waveguide 1032 is evident from the top down view shown in FIG. 10A(i), and in the top down section drawing in FIG. 10A(iii) as the transition waveguide layer 1032 is shown to widen from the interface between the transition region portion 1020 and the transition waveguide portion 1030, to a maximum width within the transition region portion 1020, and then narrow again in proximity to the interface between the planar laser portion 1010 and the transition region portion 1020. In the embodiment shown in FIGS. 7A and 7B, the transition waveguide 732 did not extend outward but rather maintained a substantially rectangular shape when viewed from top down as shown in FIG. 7A(iii). By contrast, in the embodiment shown in FIG. 10A(iii), the transition waveguide 1032 tapers outward from the projection of the main rectangular body of the transition waveguide 1032.

Vertical tapering is the inclusion of a vertical slope in all or a portion of an element, and in the case of the embodiment shown in FIG. 10A, the transition waveguide 1032 has a sloped portion in the transition region portion 1020 as shown in the cross-sectional illustration in FIG. 10A(ii) and in the top down Section B-B' provided in FIG. 10A(iii). The triangular portions 1032a of the transition waveguide 1032 shown on either side of the rectangular body of the transition waveguide 1032 in top down FIG. 10A(iii), are vertically tapered in the horizontal direction (left-right) of FIG. 10A(iii) and are vertically tapered in the vertical direction (top-bottom) of FIG. 10A(iii). That is, in addition to the vertical tapering of the transition waveguide 1032 in the direction along the optical path as shown in FIG. 10A(ii), the transition waveguide is also tapered to some extent perpendicular to the optical path of signal 1050. The vertical tapering of the transition waveguide is shown more clearly in the perspective drawing in FIG. 10B(i).

Figure 10B:
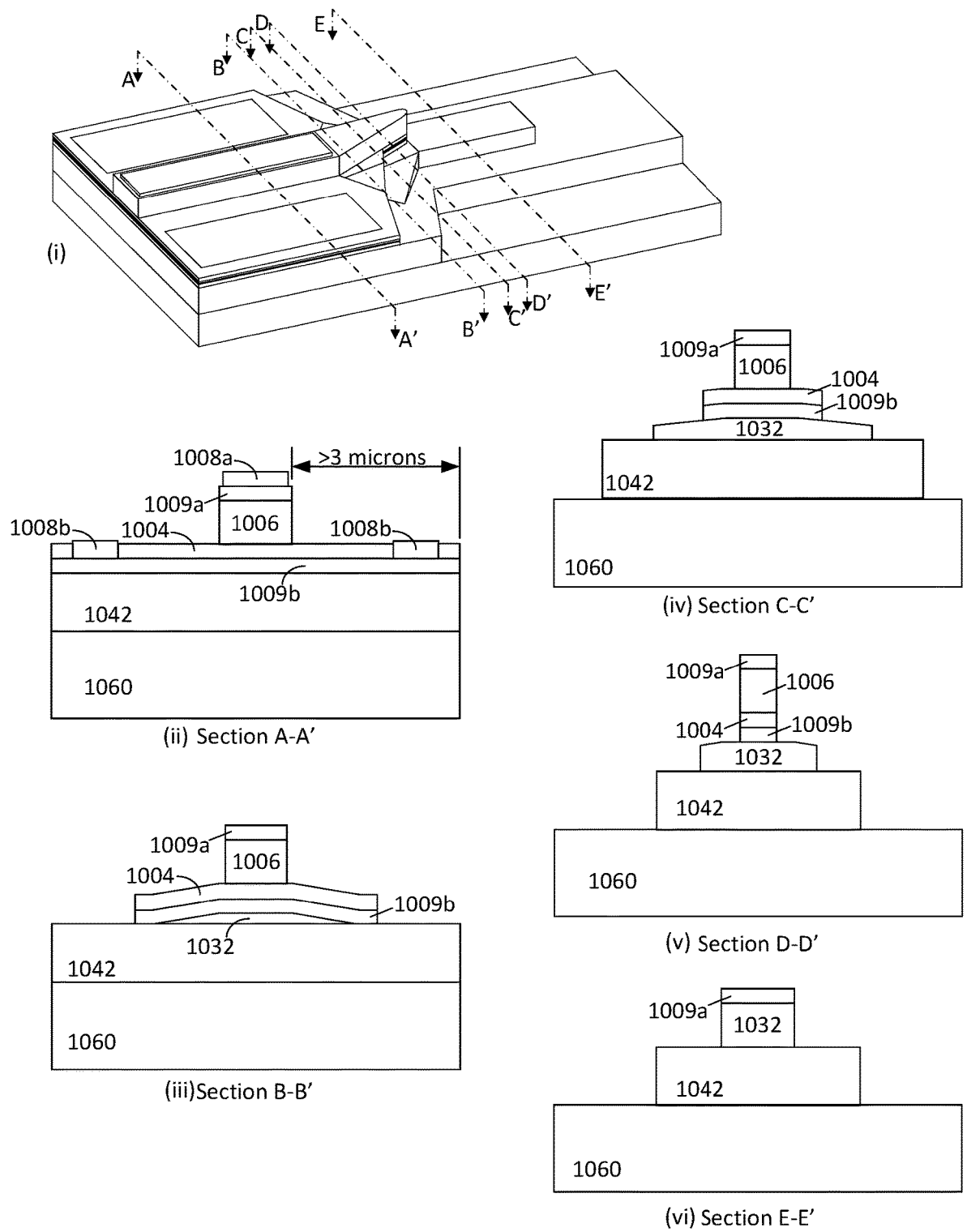
FIG. 10B. Embodiment of a planar laser with combined planar laser and waveguide that includes the modified QW-containing layer and the transition region: (i) Isometric view, (ii) Section A-A', (iii) Section B-B', (iv) Section C-C', (v) Section D-D', and (vi) Section E-E'.

In the transition region portion 1020, the semiconductor layers that include the bottom contact layer 1009b, layer 1011, the QW-containing layer 1004, the ridge waveguide 1006, and the top contact layer 1009a, are extended from the interface between the planar laser portion 1010 and the transition region 1020, into the transition region portion 1020 to, or approximately to, the interface between the transition region portion 1020 and the transition waveguide portion 1030. These layers substantially follow the slope and contour of the underlying, vertically and horizontally tapered, transition waveguide 1032. In the embodiment shown in FIGS. 10A and 10B, layers 1009b, 1004, 1011, 1106, and 1009a are formed on a portion of the transition waveguide 1032 that is vertically tapered and of these, the contact layer 1009b and the QW-containing layer 1004 are further formed on a portion of the transition waveguide 1032 that is horizontally tapered and a portion of the dilute waveguide 1042 as shown in the perspective drawing of the device structure 1000 in FIG. 10B(i). Layers 1009b and 1004 are further extended beyond the tapered transition waveguide 1032 to the lateral edge, or near the lateral edge, of the device structure 1000 as shown in FIG. 10B(i) and in FIG. 10B(ii).

In other embodiments, the horizontal tapering of the semiconductor layers 1009b and 1004 does not extend as far laterally from the ridge waveguide but rather extends to an intermediate distance between the lateral edge of the QW-containing layer and the width of the ridge waveguide.

In the embodiment shown in FIGS. 10A and 10B, and in similar embodiments in which the planar waveguide portion of the device structure 1000 is formed on the dilute waveguide 1042, the fabrication process can be simplified significantly relative to embodiments with a fill layer below the planar laser. Elimination of the fill layer 513, 613 simplifies the structure in that the layers in the structure can all be formed using variations of the conventional epitaxial films of InP, for example. The vertically tapered portion of the transition waveguide layer 1032, or variations of the structure as described herein, can be formed using gray scale lithography or aspect ratio dependent etching or deposition processing, among other techniques.

FIG. 10A(i) and FIG. 10A(ii) shows the top electrode layer 1008a, the doped semiconductor contact layer 1009a, the ridge waveguide 1006, the QW-containing layer 1004, optional layer 1011, and bottom contact layer 1009b. Optical signal 1050, depicted in FIG. 10A(ii), is provided in the figure to illustrate how an optical signal generated in the planar laser portion 1010 might traverse the device structure from left to right (as shown) during operation of the laser diode of the planar laser portion 1010 of the device 1000. Optical signal 1050 is present during operation of the device and originates substantially in the planar laser portion 1010 with some protrusion of the optical signal generation anticipated into the transition region 1020. In some embodiments, the removal of the contact layer 1009a in the transition region portion 1020 can potentially reduce the current flow, and the optical output in the transition region portion 1030 during operation of the laser, if required.

Horizontal tapering of the QW-containing layer 1004 in the transition region portion 1020 promotes movement of the optical signal 1050 from the QW-containing layer 1004, through the bottom contact layer 1009b, to the underlying transition waveguide 1032, as depicted in FIG. 10A(ii) as the signal moves through the device structure 1000. In the embodiment shown in FIGS. 10A and 10B, the optical signal 1050 is generated in the planar laser portion 1010 of the device structure 1000 and moves to the transition region portion 1020. Signal 1050 moves into the vertically tapered portion of the transition waveguide 1032 driven wholly or in part by the horizontal tapering of the QW-containing layer 1004 and an increased index of refraction provided by one or more of the refractive index property of the transition waveguide material or by the increased volume to which the optical signal 1050 is exposed as it propagates through the structure as depicted in FIG. 10A(ii). The width of the transition layer waveguide 1032 at the interface between the transition waveguide 1032 and the contact layer 1009b is anticipated to affect the coupling of the optical signal and the optical signal mode in embodiments of the device structure 1000. Additionally, the length of the vertically tapered portion, or sloped portion, is also expected to affect the coupling of the optical signal 1050 and also affect the optical signal mode in embodiments of the device structure 1000.

Referring to the top-down Section view B-B' of FIG. 10A(ii), as shown in FIG. 10A(iii), the layout of the transition waveguide 1032 on the dilute waveguide 1042 is provided that illustrates the relative positioning of the transition waveguide layer 1032 on the dilute waveguide 1042 in this embodiment, and when compared to FIG. 10A(i), shows the transition waveguide 1032 spanning the transition region portion 1020 and the transition waveguide portion 1030 in this embodiment. Also shown are the triangular sections 1032a,1032b with a vertical taper that follows the direction along the upper-right edge of the upper triangular section 1032a (as drawn), and that follows the bottom-right edge of the bottom triangular section 1032b (as drawn). Typical widths of the planar waveguides 1032, 1042 are in the range of 1-20 microns, and typically about 2-3 microns for the transition waveguide 1032 and typically about 7-12 microns for the dilute waveguide 1042, for commonly used wavelengths in the range of 800 nm to 2 microns. The transition waveguide 1032 can extend several microns to hundreds of microns beyond the transition region portion 1020 in the direction of the optical signal propagation (to the right in the FIGS. 4-10) and the dilute waveguide 1042 can extend tens to thousands of microns in embodiments, for example, in which the structure 1000 is used to form a discrete device, or the dilute waveguide 1042 can extend many millimeters or more in embodiments in which the dilute waveguide 1042 is used to connect device 1000 to one or more other devices in a photonic circuit, for example.

Referring to FIG. 10B(i), the features of the device structure 1000 are further illustrated in the isometric perspective drawing shown. Section drawings from this isometric illustration are provided in FIGS. 10B(ii) to 10B(vi). These drawings further illustrate the layers in the device structure 1000, the multidirectional vertical tapering of the transition waveguide 1032, and other features of the device structure 1000. Section A-A' of FIG. 10B(i), taken through the planar laser portion 1010 of device structure 1000 is provided in FIG. 10B(ii) and shows the planar waveguide structure that includes the dilute waveguide layer 1042 on substrate 1060. In the embodiment illustrated in FIGS. 10A and 10B, the planar laser portion 1010 is formed on the dilute waveguide 1042. QW-containing layer 1004 and bottom contact layer 1009b are shown in the embodiment to extend the full lateral width of the dilute waveguide 1042 in the Section A-A' cross sectional drawing from portion 1010 of the device structure 1000. In other embodiments, the width of the layer 1009b and 1004 are not aligned with the lateral edges of the dilute waveguide 1042. In some embodiments, the substrate is extended beyond the layers shown for embodiments of the device structure 1000. A notable feature of the device 1000, and of these layers, however, is the lateral extension to a distance of 3 microns or more from the edge of the ridge waveguide 1006, as indicated in FIG. 10B(ii), such that deleterious effects from the patterning of the QW-containing layer 1004 on device performance are reduced, minimized, or eliminated. The ridge waveguide 1006 is shown above the QW-containing layer 1004 with semiconductor top contact layer 1009a. Electrode contact layers 1008a and 1008b, typically metal layers or metal alloys, are also shown in FIG. 10B(ii).

Section B-B', Section C-C', and Section D-D' of FIGS. 10B(iii), 10B(iv), and 10B(iii), respectively, are taken through the transition region portion 1020 of the device structure 1000. Section B-B' of FIG. 10B(iii) shows QW-containing layer 1004 and contact layer 1009b over a thin portion of the transition waveguide layer 1032 with clearly sloped edges. The sloped edges illustrate the vertical tapering of the transition waveguide 1032 along the Section line B-B', and is further illustrated along Section lines C-C', and D-D' but is also shown by comparison of Section B-B' of FIG. 10B(iii) with Section A-A' of FIG. 10B(ii) and further with comparison of Section B-B' and Section C-C' with Section D-D'. In these Section drawings, the increasing thickness of the transition waveguide layer 1032 illustrates the thickness change perpendicular to the plane of Sections B-B', C-C', and D-D' of FIGS. 10B(iii), 10B(iv), and 10B(v).

Narrowing in width of the QW-containing layer 1004 and bottom contact layer 1009b, is further shown in Section C-C' of FIG. 10B(iv) along with the increasing thickness of the transition waveguide layer 1032. The horizontal tapering of the QW-containing layer 1004, the ridge waveguide layer 1006, and the contact layer 1009a are also shown in the succession of drawings in FIGS. 10B(iii), 10B(iv), and 10B(v). Section E-E' of FIG. 10B(v) shows the transition waveguide 1032 in the transition waveguide portion 1030 with contact layer 1009b.

The transition waveguide 1032 in the transition region portion 1020 of the structure 1000 resides above the dilute waveguide 1042. The contact layer 1009b, in embodiments, is an epitaxially grown layer that is formed over both the dilute waveguide 1042 and the transition waveguide 1032. As such, in some embodiments, the contact layer 1009b is processed as if it were part of the layer over which it has been epitaxially formed.

The transition waveguide 1032 is shown in the embodiment in Section E-E' of FIG. 10B(vi) to have reached constant thickness for the purpose of illustrating the key elements of this and similar embodiments. It is important to note, however, that in other embodiments, the vertical tapering of the transition waveguide 1032 can be steep or gradual, and can extend over several microns to hundreds of microns, or more. Similarly, the width of the transition waveguide 1032 and the dilute waveguide 1042 can have tapered widths that extend similar distances from the interface between the planar laser portion 1010 and the transition region portion 1020 in the direction of the optical signal propagation.

In the embodiment shown in FIGS. 10A and 10B, electrode layer 1008a is not shown to extend into the transition region 1020. In other embodiments, the electrode layer 1008a on ridge waveguide 1006 may extend into the transition region 1020. It is important to note that the elements shown in FIGS. 10A and 10B are those that demonstrate the structure and functionality of the device structure for the embodiment shown. Additionally, other layers, such as encapsulation layers and composite layers for one or more of the layers described may be included in other embodiments.

Figure 11A:
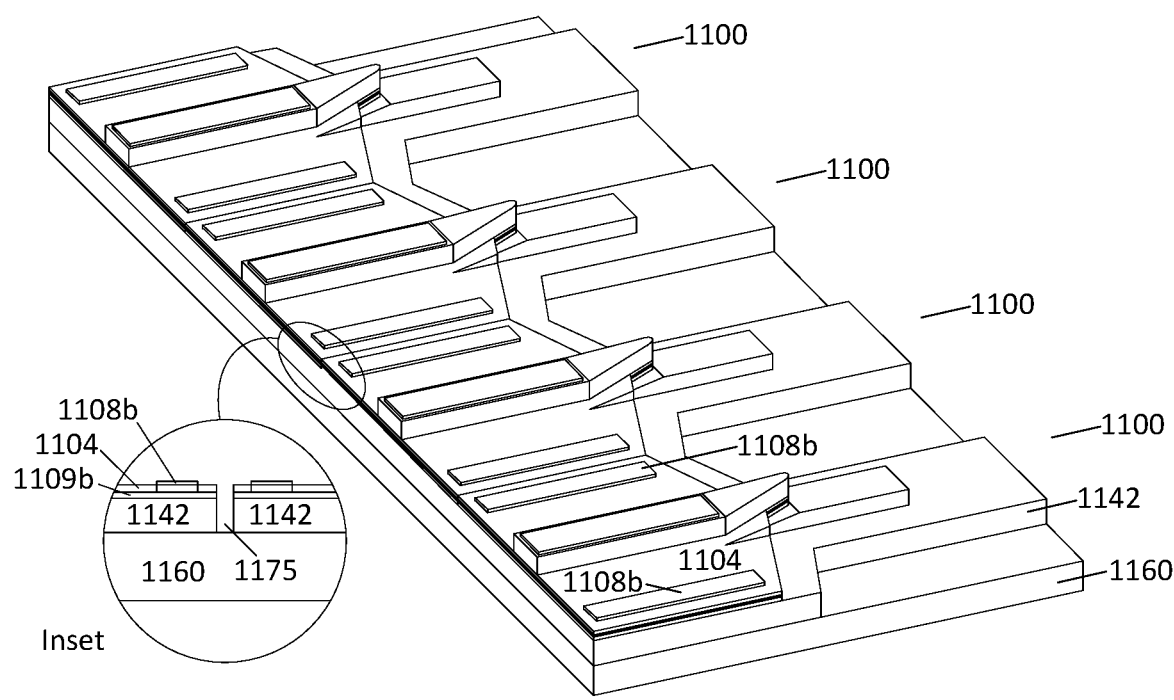
FIG. 11A. Array of device structures fabricated for use as an array of devices, for separation into discrete components, or separation into arrays of discrete components.

Referring to FIG. 11A, a perspective drawing shows a portion of a multiplicity of device structures 1100 formed on a substrate 1160. In FIG. 11A, an example of an embodiment of a configuration is illustrated for which multiple devices are formed concurrently. The formation of multiple devices on a substrate is common practice in the art of semiconductor processing technology for the economies of scale that the method provides for producing large quantities of devices and for producing large quantities of all or part of an integrated circuit or photonic integrated circuit for which the multiple devices form all or a part of the circuit.

The structures and process flow of embodiments of the planar laser are well suited for the formation of a multiplicity of devices. A multiplicity of device structures 1100 is formed in some embodiments, using a wet or dry etch process to isolate the active light-generating QW layers 1104 and the underlying doped layer 1109*b*, for example, between contact layers 1108*b* for one or more of the lasers or groups of lasers in the array as shown in the inset of FIG. 11A. In FIG. 11A, a group of four lasers are shown for which isolation trenches 1175 are formed between the contact pads 1108*b* of adjacent devices as shown. In embodiments, the isolation trench 1175 forms a division in the QW-containing layer 1104 and the bottom contact layer 1109*b*, and isolates these layers from the similar layers in adjacent devices. Other methods may also be utilized to isolate the active light generating layers in adjacent devices. In other embodiments, the QW-containing layer 1104 is a continuous layer across one or more of the devices 1100 in the array of devices.

Figure 11B:
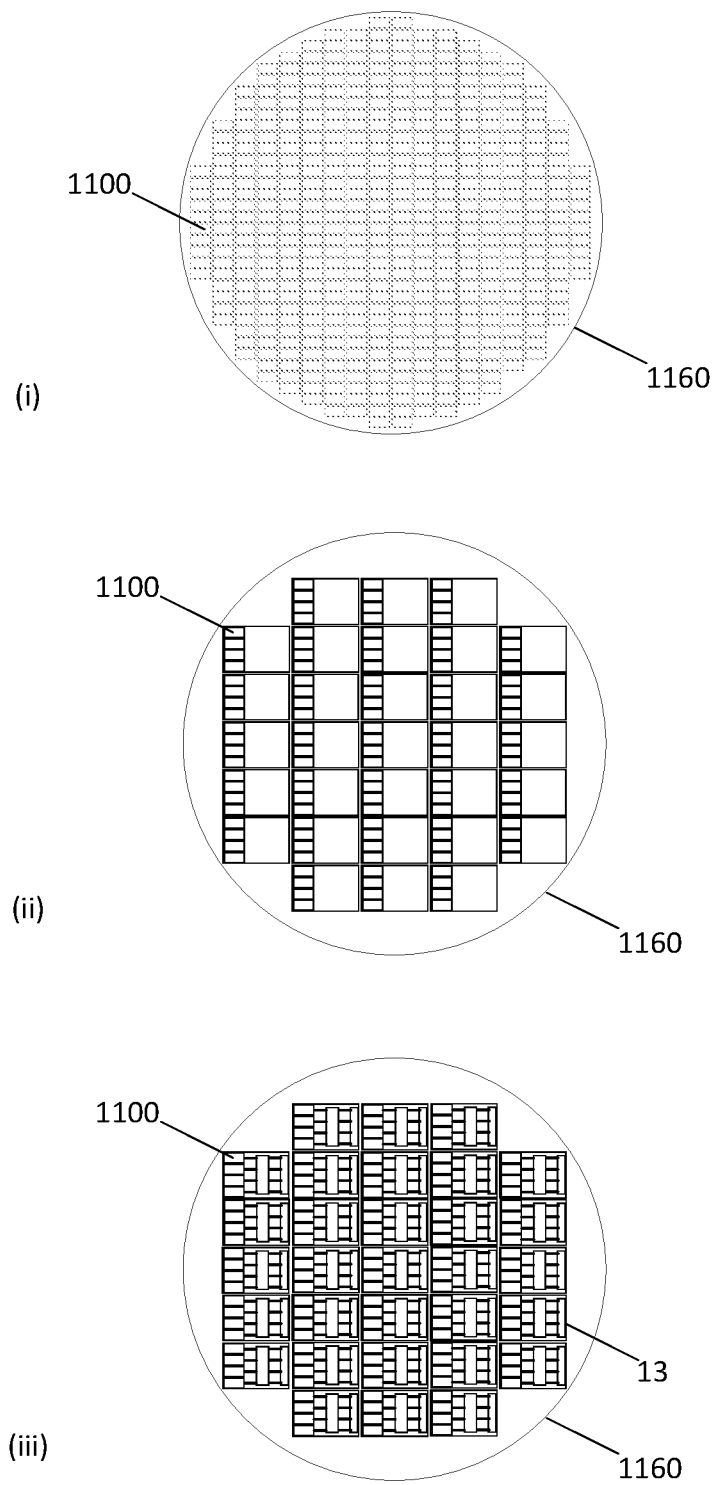
FIG. 11B. Examples of embodiments of multiple device structures: (i) discrete planar laser and waveguide, (ii) multiplicity of planar laser and waveguide structures formed on a portion of a die, and (iii) multiplicity of planar laser and waveguide structures forming all or part of photonic integrated circuits.

Referring to FIG. 11B, examples of embodiments that utilize various patterning and formation schemes are shown. FIG. 11B(i) shows an embodiment in which planar lasers or planar laser structures with the transition and dilute waveguides 1100 are formed on a substrate 1160. The devices 1100 in this embodiment are discrete. In addition to the economies of scale that the formation of multiple devices 1100 on a substrate provides, applications that utilize two or more devices further benefit from the design and method of formation that is provided in embodiments. In FIG. 11B(ii), an embodiment is shown in which a group of lasers are formed on a portion of a substrate. In this example embodiment, the multiplicity of lasers forms a portion of a photonic integrated circuit. And in FIG. 11B(iii), an embodiment is shown in which a multiplicity of lasers forms a portion of a photonic integrated circuit 103 that is formed in a process flow that includes the formation of the device structure described herein.

Examples of applications that utilize one or more devices 1100 include 1) embodiments in which a multiplicity of devices is formed on a substrate on which other devices are wholly or partially formed concurrently with the formation of the devices 1100, 2) in applications in which the multiplicity of devices 1100 is formed, diced, and mounted on other substrates, interposers, or submounts, 3) in applications in which the multiplicity of devices 1100 is formed on a substrate to form a submount onto which other optical or optoelectrical devices are mounted to form all or part of a photonic circuit, or 4) in applications in which the multiplicity of devices 1100 is formed on a substrate and utilized in a combination of one or more of these embodiments. Other devices include, for example, other optical devices and optoelectrical devices such waveguides, arrayed waveguides, echelle gratings, photodiodes, photodetectors, amplifiers, modulators, lasers, and spot size converters, among others.

The dilute waveguide portion of the device structure described herein, renders the embodiments well-suited for the formation of discrete devices that are combined with other optical and other devices for the formation of photonic circuits and for integration with other devices in the formation of photonic integrated circuits. The dilute waveguide enables the planar laser portion of the device structure to form an optical connection to other optical devices.

Figure 12:
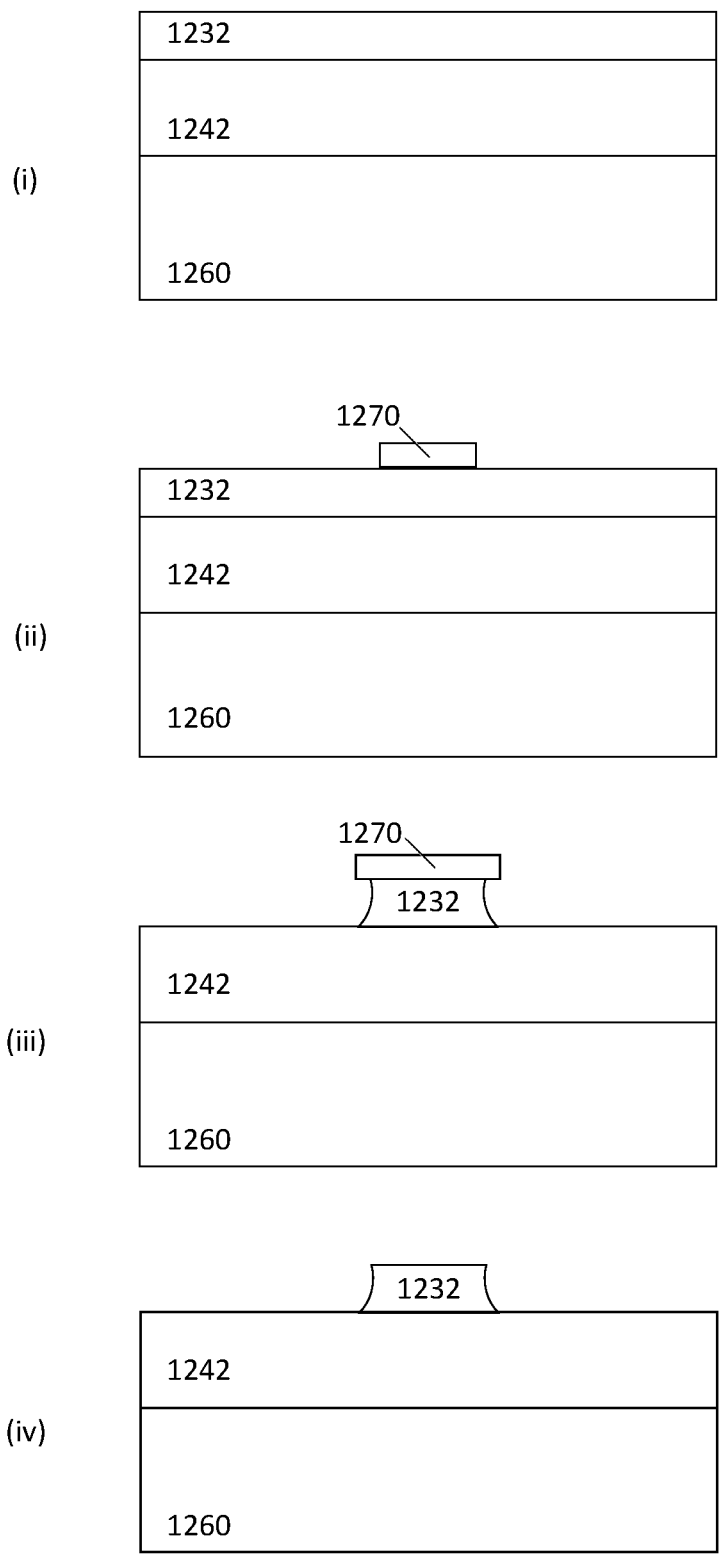
FIG. 12. Exemplary process flow steps (i)-(iv) for fabrication of embodiments of the optical device structure.
Figure 12:
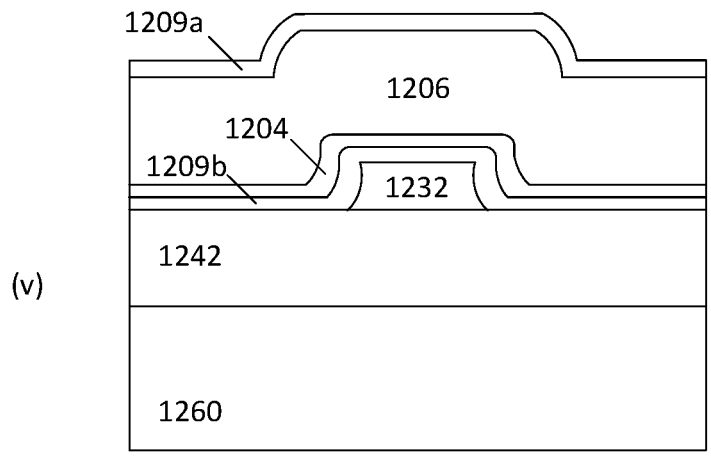
Figure 12:
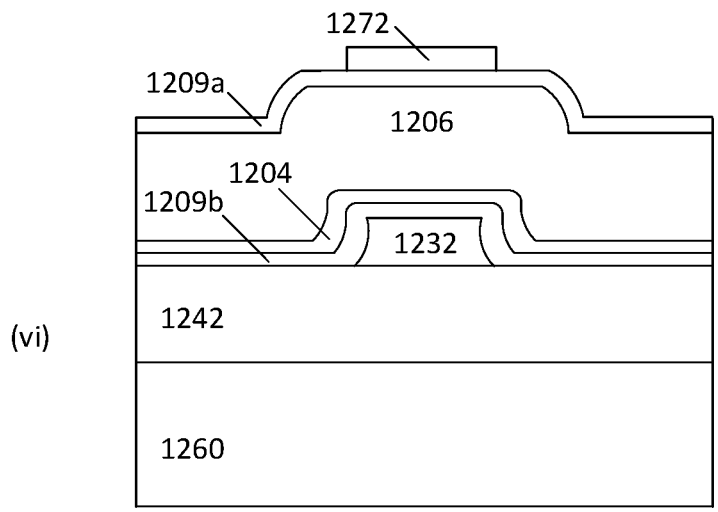
Figure 12:
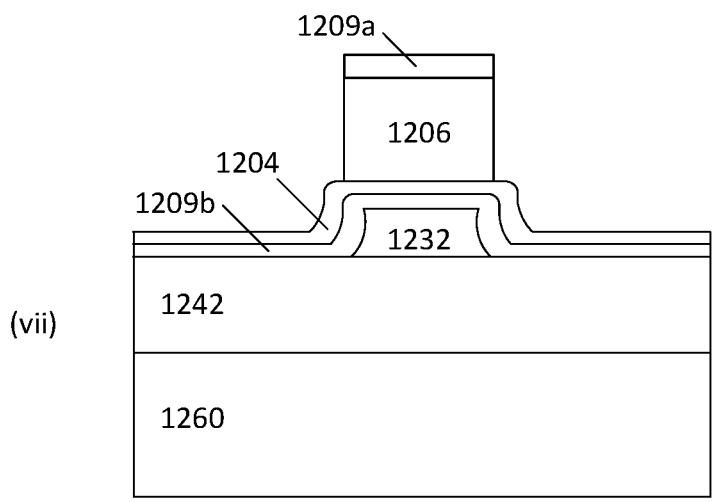
Figure 12:
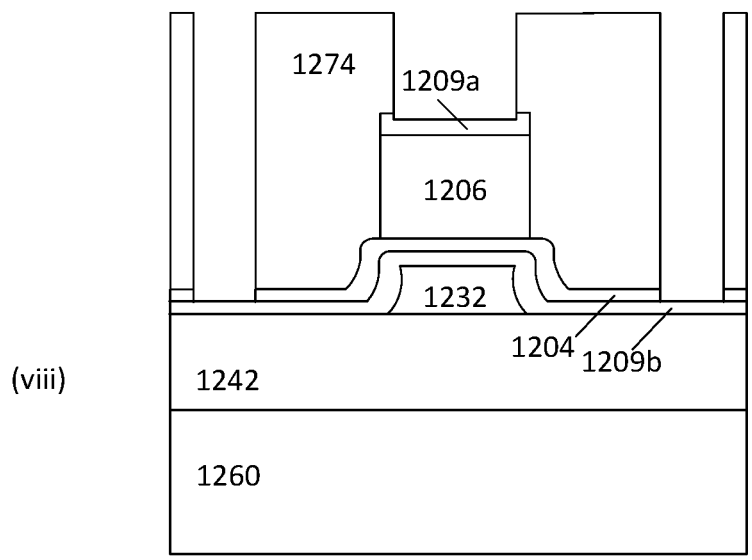
Figure 12:
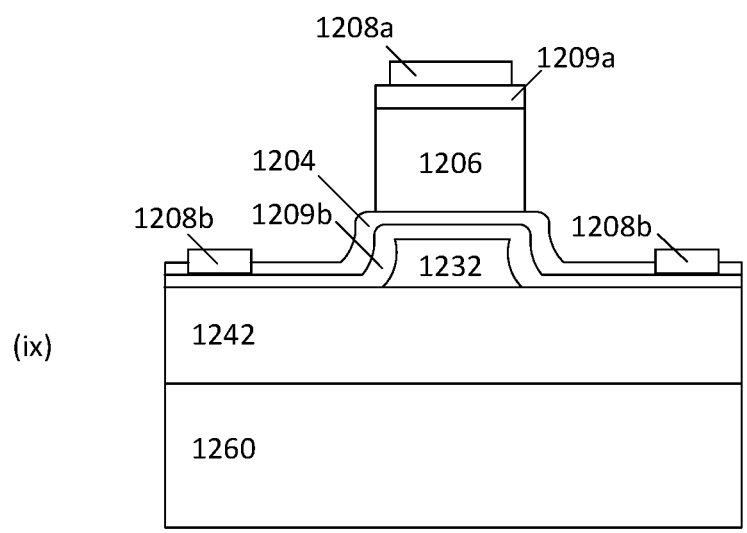

Referring to FIG. 12, an exemplary process flow is provided for forming embodiments of the device structure 300, for example. FIG. 12(*i*) shows substrate 1260 with dilute waveguide layer 1242 and transition waveguide layer 1232. Waveguide layers 1232 and 1242 can be formed, for example, using epitaxial growth techniques such as metalloorganic chemical vapor deposition (MOCVD), metalloorganic vapor phase epitaxy (MOVPE), and molecular beam epitaxy (MBE). Device structures are formed in preferred embodiments using systems of InP-based semiconductor layers, for example. Other embodiments are formed, for example, using systems of GaAs-based semiconductor layers. Systems of semiconductor layers, as described herein, are alloys of a semiconductor that enable variation in the bandgap of a compound semiconductor, such as InP and GaAs, that are required for the fabrication of an optical or optoelectrical device such as a laser, a photodetector, a waveguide, among others, that require a gradient or other change or variation in the bandgap that is beneficial to the performance of the device. In the example in the process flow in FIG. 12, InP and InGaAsP layers are utilized in the description.

In the exemplary graphic description shown in FIG. 12, substrate 1260, for example, is an InP substrate. InGaAsP layers of preferred compositions are used to form the dilute waveguide 1242 and transition waveguide layer 1232. A mask layer is deposited and patterned to form patterned mask layer 1270 as shown in FIG. 12(*ii*). Mask layer 1270 can be a photoresist mask or a hard mask layer. Methods for forming and patterning mask layers are well understood in the art of semiconductor manufacturing. Hard masks can include such layers as silicon dioxide, silicon nitride, carbon, and aluminum nitride, among many other alternatives known and utilized in the art. Following the patterning of the mask layer 1270, transition waveguide layer is etched to form patterned transition waveguide layer 1232 as shown in FIG. 12(*iii*) after etching of the transition waveguide layer 1232, and in FIG. 12(*iv*) after removal of the hard mask layer 1270. In an embodiment, the transition waveguide is wet etched. Following the wet etch of the transition waveguide 1232 and removal of the mask layer 1270, bottom contact layer 1209*b*, QW-containing layer 1204, ridge waveguide layer 1206, and top contact layer 1209*a* are formed on the mesa structure formed by the etched transition waveguide and underlying dilute waveguide layer 1242 to form the structure as shown, for example, in FIG. 12(*v*). Bottom contact layer 1209*b*, QW-containing layer 1204, ridge waveguide layer 1206, and top contact layer 1209*a* are formed for example using epitaxial growth techniques. Epitaxial growth is used to (at least partially) maintain the crystalline structure of the substrate into the layers grown above the transition waveguide 1232 and the dilute waveguide 1242. Bottom contact layer 1209*b* is a doped InP layer. In an embodiment, doped contact layer 1209*b* is an n-doped layer. QW-containing layer 1204 is a multilayered structure that includes multiple quantum well layers and spacer layers. In addition to the quantum wells and the spacer layers, layer 1204 can also include one or more of a top cladding layer, a bottom cladding layer, a top spacer, and a bottom spacer. Other layers might also be included in layer 1204. In InP-based laser diode structures, these layers can be formed from various alloys of InP and InGaAsP. In addition to varying the composition of the materials in the InGaAsP and similar semiconductors, dopants can also be included in the layers to vary the bandgap, the electrical conductivity and the index of refraction of these materials, for example. The composition of the materials in the alloys for forming the QW-containing layers in InP-based laser diodes are well understood in the art.

FIG. 12(*vi*) shows the deposition and patterning of a second hard mask layer 1272 and the etching of the top contact layer 1209*a* and the ridge waveguide 1206. In FIG. 12(*vii*), the structure is shown after patterned etching of the top contact layer 1209*a* and the ridge waveguide 1206, and removal of the second hard mask 1272.

Deposition and patterning of photoresist mask 1274 is shown in FIG. 12(viii). In FIG. 12(viii), the structure is shown after patterning of the resist and an etch process to create openings in the QW-containing layer. Etching of the openings in the QW-containing layer 1206 will also etch the top contact layer 1209*a* requiring a thicker top contact layer 1209*a* than the bottom contact layer 1209*b* such that the top contact layer is not fully removed during the etch step as shown in FIG. 12(viii). In FIG. 12(*ix*), the structure is shown after deposition of a metal electrode layers 1208*a*, 1208*b*, and subsequent removal of the photoresist. Formation of the metal layers 1208*a*, 1208*b* can be accomplished with a physical vapor deposition or electrodeposition step, or both, for example, to deposit the metal layer, followed by a lift off process to remove the photoresist. Other methods for forming the metal contact may also be utilized.

The process flow illustrated in FIG. 12 is provided to show an example of a sequence of steps that can be used in the formation of an embodiment of the device structure 300. This sequence shows an embodiment of a structure that would be formed in the planar laser portion of the device structures described herein. Other process steps and process flows can be also be used. Modifications to the process flow may be required for other embodiments. Additionally, other steps can be included in the process flow such as cleaning and annealing steps, among others.

The foregoing descriptions of embodiments have been presented for purposes of illustration and description and are not intended to be exhaustive or to limit embodiments to the forms disclosed. Modifications to, and variations of, the disclosed embodiments will be readily apparent to those skilled in the art, and the general principles defined herein may be applied to other embodiments without departing from the spirit and scope of the embodiments disclosed herein. Thus, embodiments should not be limited to those specifically described herein but rather are to be accorded the widest scope consistent with the principles and features disclosed herein.

What is claimed is:

1. A laser structure comprising
    a laser assembly,
        wherein the laser assembly comprises a first portion and a second portion,
        wherein the first portion of the laser assembly comprises a first portion of a ridge waveguide disposed on a first portion of an active layer, wherein the first portion of the laser assembly is configured to generate a light beam,
        wherein the second portion of the laser assembly comprises a second portion of the ridge waveguide disposed on a second portion of the active layer,
        wherein the second portion of the ridge waveguide and the second portion of the active layer are tapered in a lateral direction;
    a first waveguide,
        wherein the second portion of the active layer is disposed on the first waveguide,
        wherein the first portion of the active layer is disposed on a fill layer,
        wherein the second portion of the laser assembly is configured to guide the light beam downward to propagate along the first waveguide;
    a second waveguide,
        wherein the first waveguide is disposed on the second waveguide along a length of the second waveguide,
        wherein the first waveguide is configured to guide the light beam from the first waveguide downward to propagate along the second waveguide.

2. A laser structure as in claim 1,
wherein the first waveguide comprises an index of refraction greater than that of the ridge waveguide to promote movements of the light beam downward to the first waveguide.

3. A laser structure as in claim 1,
wherein the second waveguide comprises an index of refraction greater than that of the first waveguide to promote movements of the light beam downward to the second waveguide.

4. A laser structure as in claim 1,
wherein the portion of the first waveguide under the second portion of the active layer is tapered in a lateral direction toward the first portion of the active layer.

5. A laser structure as in claim 1,
wherein the first waveguide is vertically tapered under the second portion of the active layer toward the first portion of the active layer.

6. A laser structure as in claim 1,
wherein the first waveguide is vertically tapered under the second portion of the active layer toward the first portion of the active layer,
wherein the first waveguide spread out in a lateral direction under the second portion of the active layer toward the first portion of the active layer.

7. A laser structure as in claim 1,
wherein the first waveguide is vertically tapered under the second portion of the active layer toward the first portion of the active layer,
wherein the first waveguide is tapered in a lateral direction under the second portion of the active layer toward the first portion of the active layer.

8. A laser structure as in claim 1,
wherein the first waveguide is vertically tapered under the second portion of the active layer in a first direction toward the first portion of the active layer,
wherein the first waveguide is vertically tapered under the second portion of the active layer in a second direction perpendicular to the first direction.

9. A laser structure as in claim 1,
wherein the active layer is at least 3 microns larger than the ridge waveguide in a lateral direction in the first portion of the laser assembly.

10. A laser structure as in claim 1,
wherein a first lateral dimension of the active layer is larger than that of the ridge waveguide in the first portion of the laser assembly, wherein a second lateral dimension of the active layer is the same as that of the ridge waveguide in the second portion of the laser assembly.

11. A laser structure as in claim 1,
wherein the laser assembly further comprises a first contact layer on the ridge waveguide and a second contact layer under the active layer and above the first waveguide.

12. A laser structure comprising
a laser assembly,
  wherein the laser assembly comprises a first portion and a second portion,
  wherein the first portion of the laser assembly comprises a first portion of a ridge waveguide disposed on a first portion of an active layer, wherein the first portion of the laser assembly is configured to generate a light beam,
  wherein the second portion of the laser assembly comprises a second portion of the ridge waveguide disposed on a second portion of the active layer,
  wherein the second portion of the ridge waveguide and the second portion of the active layer are tapered in a lateral direction;
a first waveguide,
  wherein the second portion of the active layer is disposed on the first waveguide,
  wherein the first waveguide is vertically tapered under the second portion of the active layer toward the first portion of the active layer,
  wherein the second portion of the laser assembly is configured to guide the light beam downward to propagate along the first waveguide;
a second waveguide,
  wherein the first waveguide is disposed on the second waveguide along a length of the second waveguide,
  wherein the first waveguide is configured to guide the light beam from the first waveguide downward to propagate along the second waveguide.

13. A laser structure as in claim 12,
wherein the portion of the first waveguide under the second portion of the active layer is tapered in a lateral direction.

14. A laser structure as in claim 12,
wherein the first waveguide spreads out in a lateral direction under the second portion of the active layer toward the first portion of the active layer.

15. A laser structure as in claim 12,
wherein the first waveguide is vertically tapered under the second portion of the active layer in a first direction toward the first portion of the active layer,
wherein the first waveguide is vertically tapered under the second portion of the active layer in a second direction perpendicular to the first direction.

16. A laser structure comprising
a laser assembly,
  wherein the laser assembly comprises a first portion and a second portion,
  wherein the first portion of the laser assembly comprises a first portion of a ridge waveguide disposed on a first portion of an active layer, wherein the first portion of the laser assembly is configured to generate a light beam,
  wherein the second portion of the laser assembly comprises a second portion of the ridge waveguide disposed on a second portion of the active layer,
  wherein the second portion of the ridge waveguide and the second portion of the active layer are tapered in a lateral direction;
a first waveguide,
  wherein the second portion of the active layer is disposed on the first waveguide,
  wherein the first waveguide under the second portion of the active layer is tapered in a lateral direction toward the first portion of the active layer,
  wherein the second portion of the laser assembly is configured to guide the light beam downward to propagate along the first waveguide;
a second waveguide,
  wherein the first waveguide is disposed on the second waveguide along a length of the second waveguide,
  wherein the first waveguide is configured to guide the light beam from the first waveguide downward to propagate along the second waveguide.

17. A laser structure as in claim 16,
wherein the first waveguide comprises an index of refraction greater than that of the ridge waveguide to promote movements of the light beam downward to the first waveguide,
wherein the second waveguide comprises an index of refraction greater than that of the first waveguide to promote movements of the light beam downward to the second waveguide,
wherein the laser assembly further comprises a first contact layer on the ridge waveguide and a second contact layer under the active layer and above the first waveguide.

18. A laser structure as in claim 16,
wherein the first waveguide is vertically tapered under the second portion of the active layer toward the first portion of the active layer.

19. A laser structure as in claim 16,
wherein the first waveguide is vertically tapered under the second portion of the active layer in a first direction toward the first portion of the active layer,
wherein the first waveguide is vertically tapered under the second portion of the active layer in a second direction perpendicular to the first direction.

20. A laser structure as in claim 16,
wherein the active layer is at least 3 microns larger than the ridge waveguide in a lateral direction in the first portion of the laser assembly.

* * * * *